United States Patent
Mitani et al.

(10) Patent No.: US 10,319,853 B2
(45) Date of Patent: Jun. 11, 2019

(54) SEMICONDUCTOR DEVICE

(71) Applicant: ROHM CO., LTD., Kyoto (JP)

(72) Inventors: Shuhei Mitani, Kyoto (JP); Yuki Nakano, Kyoto (JP); Heiji Watanabe, Osaka (JP); Takayoshi Shimura, Osaka (JP); Takuji Hosoi, Osaka (JP); Takashi Kirino, Osaka (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/868,389

(22) Filed: Jan. 11, 2018

(65) Prior Publication Data

US 2018/0138313 A1    May 17, 2018

Related U.S. Application Data

(63) Continuation of application No. 15/273,230, filed on Sep. 22, 2016, now Pat. No. 9,893,180, which is a
(Continued)

(30) Foreign Application Priority Data

Sep. 7, 2009  (JP) .................. 2009-206372
Sep. 7, 2009  (JP) .................. 2009-206373
Sep. 7, 2009  (JP) .................. 2009-206374

(51) Int. Cl.
*H01L 29/78*  (2006.01)
*H01L 21/02*  (2006.01)
(Continued)

(52) U.S. Cl.
CPC ...... *H01L 29/7827* (2013.01); *H01L 21/0223* (2013.01); *H01L 21/02164* (2013.01);
(Continued)

(58) Field of Classification Search
CPC ............ H01L 29/7827; H01L 29/0847; H01L 21/02247; H01L 21/0223; H01L 29/4236;
(Continued)

(56) References Cited

U.S. PATENT DOCUMENTS 6,767,843 B2   7/2004  Lipkin et al.
6,969,887 B2   11/2005 Mizukami et al.
(Continued)

FOREIGN PATENT DOCUMENTS

CN      1577879 A      2/2005
JP      H08-186254 A   7/1996
(Continued)

OTHER PUBLICATIONS

Takashi Kirino et al., "AION/SiO2 Sekiso Gate Zetsuenmaku o Mochiita 4H-SiC MISFET no Tokusei", Dai 56 Kai Extended Abstracts, Japan Society of Applied Physics and Related Societies, Mar. 30, 2009 (Mar. 30, 2009), vol. 56th, No. 1, 442.
(Continued)

*Primary Examiner* — Kyoung Lee
(74) *Attorney, Agent, or Firm* — Gregory M. Howison

(57) ABSTRACT

A semiconductor device includes a semiconductor layer of a first conductivity type. A well region that is a second conductivity type well region is formed on a surface layer portion of the semiconductor layer and has a channel region defined therein. A source region that is a first conductivity type source region is formed on a surface layer portion of the well region. A gate insulating film is formed on the semiconductor layer and has a multilayer structure. A gate electrode is opposed to the channel region of the well region where a channel is formed through the gate insulating film.

13 Claims, 49 Drawing Sheets

Related U.S. Application Data continuation of application No. 14/995,454, filed on Jan. 14, 2016, now Pat. No. 9,496,393, which is a continuation of application No. 14/601,345, filed on Jan. 21, 2015, now Pat. No. 9,257,521, which is a continuation of application No. 14/148,766, filed on Jan. 7, 2014, now Pat. No. 8,969,877, which is a continuation of application No. 13/394,549, filed as application No. PCT/JP2010/065057 on Sep. 2, 2010, now Pat. No. 8,653,533.

(51) Int. Cl.
| | | |
|---|---|---|
| *H01L 21/04* | (2006.01) | |
| *H01L 21/82* | (2006.01) | |
| *H01L 29/16* | (2006.01) | |
| *H01L 29/417* | (2006.01) | |
| *H01L 29/423* | (2006.01) | |
| *H01L 29/51* | (2006.01) | |
| *H01L 29/66* | (2006.01) | |
| *H01L 29/10* | (2006.01) | |
| *H01L 29/08* | (2006.01) | |
| *H01L 29/45* | (2006.01) | |

(52) U.S. Cl.
CPC .. *H01L 21/02178* (2013.01); *H01L 21/02236* (2013.01); *H01L 21/02247* (2013.01); *H01L 21/049* (2013.01); *H01L 21/0445* (2013.01); *H01L 21/8213* (2013.01); *H01L 29/0847* (2013.01); *H01L 29/1087* (2013.01); *H01L 29/1608* (2013.01); *H01L 29/41766* (2013.01); *H01L 29/4236* (2013.01); *H01L 29/42356* (2013.01); *H01L 29/42368* (2013.01); *H01L 29/511* (2013.01); *H01L 29/513* (2013.01); *H01L 29/518* (2013.01); *H01L 29/66068* (2013.01); *H01L 29/78* (2013.01); *H01L 29/7802* (2013.01); *H01L 29/7813* (2013.01); *H01L 21/02252* (2013.01); *H01L 21/02255* (2013.01); *H01L 29/086* (2013.01); *H01L 29/0869* (2013.01); *H01L 29/45* (2013.01)

(58) Field of Classification Search
CPC ............. H01L 29/511; H01L 29/42356; H01L 21/0445; H01L 21/02164; H01L 29/1087; H01L 21/02178; H01L 21/02236; H01L 29/7802; H01L 29/7813; H01L 21/049; H01L 29/66068; H01L 29/518; H01L 29/513; H01L 21/8213; H01L 29/42368; H01L 29/41766; H01L 29/1608; H01L 29/78; H01L 21/02255; H01L 21/02252; H01L 29/45

See application file for complete search history.

(56) References Cited

U.S. PATENT DOCUMENTS

| | | | |
|---|---|---|---|
| 7,368,783 B2 | 5/2008 | Mizukami et al. | |
| 8,653,533 B2 | 2/2014 | Mitani et al. | |
| 8,969,877 B2 | 3/2015 | Mitani et al. | |
| 9,257,521 B2 | 2/2016 | Mitani et al. | |
| 9,496,393 B2 | 11/2016 | Mitani et al. | |
| 2004/0113202 A1 | 6/2004 | Kocon et al. | |
| 2004/0173845 A1 | 9/2004 | Aoki | |
| 2005/0012167 A1 | 1/2005 | Sawase et al. | |
| 2005/0017272 A1* | 1/2005 | Yamashita | H01L 21/049 257/288 |
| 2005/0161732 A1 | 7/2005 | Mizukami et al. | |
| 2006/0011973 A1 | 1/2006 | Mizukami et al. | |
| 2006/0102908 A1 | 5/2006 | Imai et al. | |
| 2007/0037343 A1 | 2/2007 | Colombo et al. | |
| 2007/0202650 A1 | 8/2007 | Thapar | |
| 2007/0228496 A1 | 10/2007 | Rochefort et al. | |
| 2008/0142883 A1 | 6/2008 | Grebs et al. | |
| 2008/0199997 A1 | 8/2008 | Grebs et al. | |
| 2009/0014784 A1 | 1/2009 | Venkatraman | |

FOREIGN PATENT DOCUMENTS

| | | |
|---|---|---|
| JP | 2002-270837 A | 9/2002 |
| JP | 2002-280381 A | 9/2002 |
| JP | 2004-511101 A | 4/2004 |
| JP | 2005-236267 A | 9/2005 |
| JP | 2006-066439 A | 3/2006 |
| JP | 2006-216918 A | 8/2006 |
| JP | 2006-344802 A | 12/2006 |
| JP | 2009-016530 A | 1/2009 |
| WO | WO-0229874 A2 | 4/2002 |
| WO | WO 2009-099182 A1 | 8/2009 |

OTHER PUBLICATIONS

Takuji Hosoi et al., "AlON/SiO2 Sekiso Gate Zetsuenmaku o Mochiita 4H-SiC MIS Device no Koon Tokusei", Dai 69 Kai Extended Abstracts, Japan Society of Applied Physics and Related Societies, Sep. 2, 2008, vol. 69th, No. 1, 357.

Yu Watanabe et al., "Suiso Anneal Shori ni yoru SiO2/SiC Kaimen Kekkan no Shutanka Oyobi Netsu Rekka Katei no Hyoka", Dai 69 Kai Extended Abstracts, Japan Society of Applied Physics and Related Societies, Sep. 2, 2008, vol. 69, No. 1, 356.

Callegari et al.: "Electron mobility temperature dependence of W/HfO$_2$ gate stacks: the role of the interfacial layer", IBM Research Report, RC23700 (W0508-110), Aug. 19, 2005.

"Mobility enhancement of 4H-SiC MOSFET by combination of nitrogen plasma treatment and forming gas annealing", Japan Society of Applied Physics and Related Societies, vol. 56, No. 1, p. 442, Mar. 30, 2009.

Y. Kagei et al., "Improved properties of SiC-MOS interfaces by thermal oxidation of plasma nitrided SiC surfaces", 69th Extended Abstracts, Japan Society of Applied Physics and Related Societies, No. 1, p. 357(2p-CE-14), Sep. 2, 2008.

Keiko Fujihira et al., "Characteristics of 4H-SiC MOS interface annealed in N$_2$O", Solid-State Electronics, vol. 49, Issue 6, pp. 896-901, Jun. 2005.

* cited by examiner

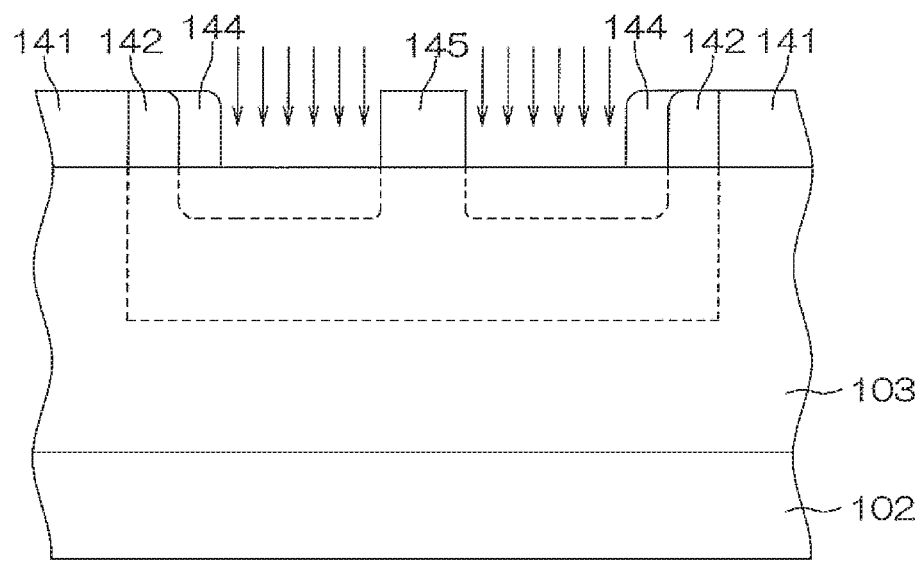
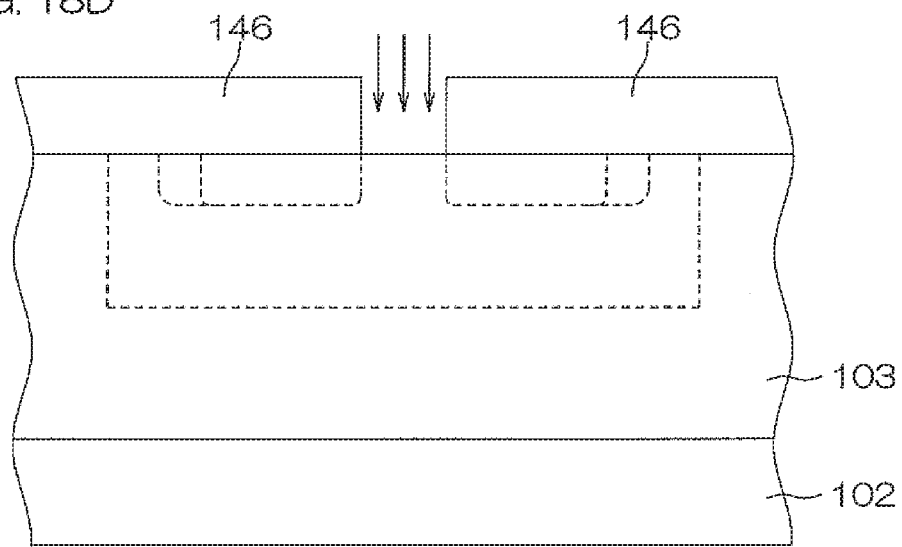

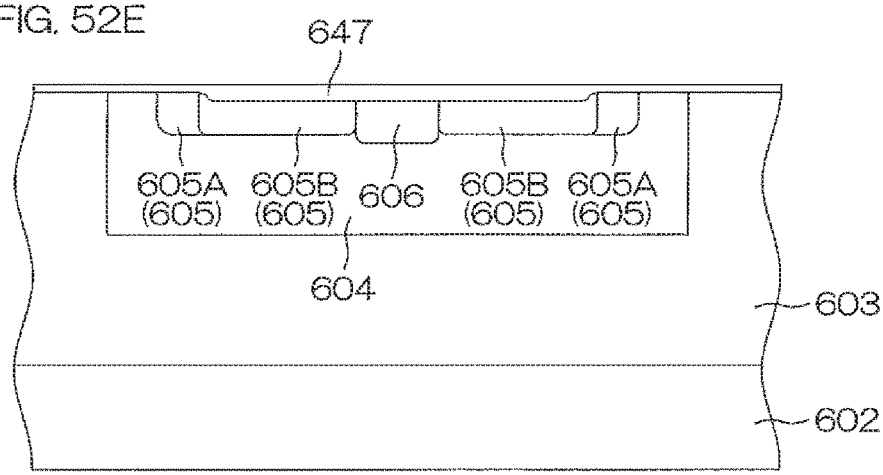
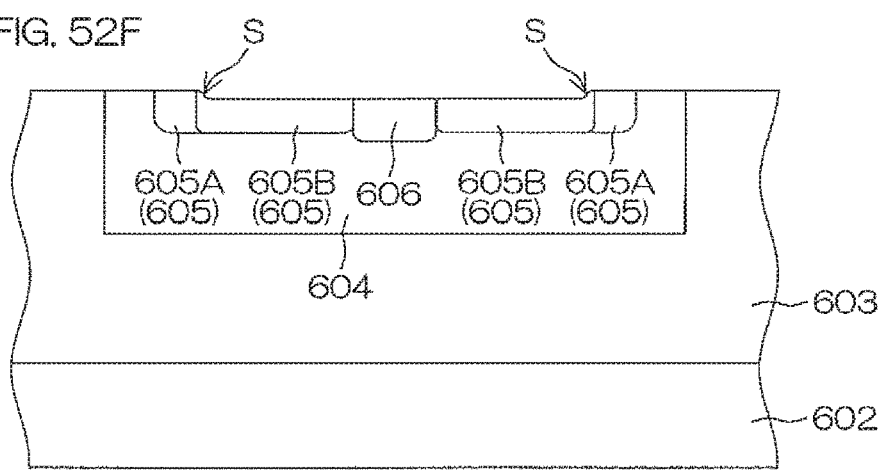
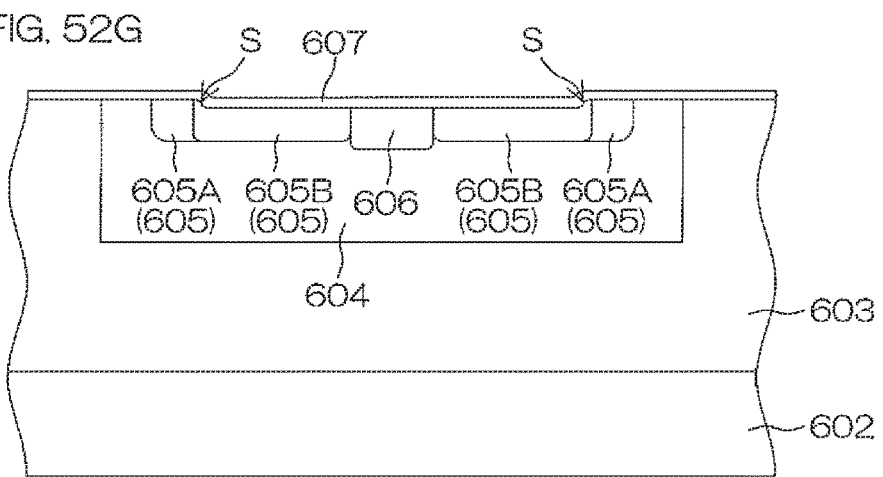

SEMICONDUCTOR DEVICE

This is a Continuation of U.S. application Ser. No. 15/273,230, filed on Sep. 22, 2016, and allowed on Oct. 6, 2017, which was a Continuation of U.S. application Ser. No. 14/995,454, filed on Jan. 14, 2016, and issued as U.S. Pat. No. 9,496,393 on Nov. 15, 2016, which was a Continuation of U.S. application Ser. No. 14/601,345, filed on Jan. 21, 2015, and issued as U.S. Pat. No. 9,257,521 on Feb. 9, 2016, which was a Continuation of U.S. application Ser. No. 14/148,766, filed on Jan. 7, 2014, and issued as U.S. Pat. No. 8,969,877 on Mar. 3, 2015, which was a Continuation of U.S. application Ser. No. 13/394,549, filed on May 17, 2012, and issued as a U.S. Pat. No. 8,653,533 on Feb. 18, 2014, which was a National Stage application of PCT/JP2010/065057, filed on Sep. 2, 2010, the subject matters of which are incorporated herein by reference.

TECHNICAL FIELD

The present invention relates to a semiconductor device and a method of manufacturing the same.

BACKGROUND ART

SiC (silicon carbide) is superior in dielectric breakdown resistance and thermal conductivity etc. to Si (silicon). Therefore, SiC is watched with interest as a semiconductor suitable to a use for an inverter of a hybrid car or the like, for example. More specifically, a MISFET (Metal Insulator Semiconductor Field Effect Transistor) employing SiC is expected as a high withstand voltage device suitable to an inverter of a hybrid car or the like.

A MOSFET (Metal Oxide Semiconductor Field Effect Transistor) as an example of a MISFET employing SiC has an SiC-MOS structure obtained by stacking a gate electrode on an SiC substrate through a gate insulating film made of $SiO_2$ (silicon oxide). A well region is formed on a surface layer portion of the SiC substrate. A source region and a drain region are formed on a surface layer portion of the well region at an interval from each other. The gate insulating film is formed on a region between the source region and the drain region.

PRIOR ART

Patent Document

Patent Document 1: Japanese Unexamined Patent Publication No. 2009-16530

SUMMARY OF THE INVENTION

Problems to be Solved by the Invention

The SiC-MOS structure has such a problem that high-density interface states are formed on the interface ($SiO_2$/SiC interface) between the SiC substrate and the gate insulating film. The number of the interface states (interface defects) increases as the thickness of the gate insulating film made of $SiO_2$ enlarges.

Therefore, the inventors of this application examine employment of a gate insulating film having not a single-layer structure of $SiO_2$, but an AlON/$SiO_2$ multilayer structure obtained by stacking an AlON (aluminum oxynitride) film on a relatively thin $SiO_2$ film.

In a case of comparing a gate insulating film of a single layer of $SiO_2$ having a thickness of 40 nm and a gate insulating film of a multilayer structure of an AlON film having a thickness of 65 nm and an $SiO_2$ film having a thickness of 6 nm with each other, for example, reduction of interface state density is expected in the AlON/$SiO_2$ multilayer gate insulating film, since the thickness of the $SiO_2$ film is small.

FIG. 11 is a graph showing field strength-leakage current characteristics (relations between the strength of electric fields (Oxide Field) formed in the gate insulating films and leakage current density (Gate Current Density)) of the AlON/$SiO_2$ multilayer gate insulating film and the $SiO_2$ single-layer gate insulating film at room temperature. FIG. 12 is a graph showing field strength-leakage current characteristics of the AlON/$SiO_2$ multilayer gate insulating film and the $SiO_2$ single-layer gate insulating film at high temperature.

As shown in FIGS. 11 and 12, it has been confirmed that leakage current is more reduced in the AlON/$SiO_2$ multilayer gate insulating film than in the $SiO_2$ single-layer gate insulating film, not only at room temperature (about 25° C.) but also at high temperature of 200° C. The effect of the reduction is particularly strong in the range where the strength of the electric field formed in the AlON/$SiO_2$ multilayer gate insulating film is greater than 6 MV/cm.

FIG. 13 is a graph showing evaluation results of interface state density of an SiC-MIS structure employing the AlON/$SiO_2$ multilayer gate insulating film and an SiC-MOS structure employing the $SiO_2$ single-layer gate insulating film. In this graph, the axis of abscissas shows energy (Ec-E) from valence band edges of the gate insulating films, and the axis of ordinates shows the interface state density Dit.

As to the respective ones of the SiC-MIS structure employing the AlON/$SiO_2$ multilayer gate insulating film and the SiC-MOS structure employing the $SiO_2$ single-layer gate insulating film, high-frequency CV characteristics (at a measuring frequency of 100 kHz, for example) and low-frequency CV characteristics (quasi-static CV characteristics) were measured, and the differences between high-frequency measured values and low-frequency measured values were calculated as the interface state density Dit by a High-Low method.

While reduction of the interface state density resulting from the reduction of the thickness of the $SiO_2$ film is expected in the SiC-MIS structure employing the AlON/$SiO_2$ multilayer gate insulating film as compared with the SiC-MOS structure employing the $SiO_2$ single-layer gate insulating film, it has been recognized from the results shown in FIG. 13 that the interface state density increases in practice. In a MISFET, increase of interface state density causes reduction of channel mobility.

An object of the present invention is to provide a semiconductor device in which the state of an interface between a silicon carbide substrate and a silicon oxide film is excellent and a method of manufacturing the same.

Solutions to Problems

A method of manufacturing a semiconductor device according to one aspect of the present invention includes the steps of forming a silicon oxide ($SiO_2$) film on a silicon carbide (SiC) substrate, annealing the silicon carbide substrate and the silicon oxide film in gas containing hydrogen, and forming an aluminum oxynitride (AlON) film on the silicon oxide film after the annealing of the silicon carbide substrate and the silicon oxide film.

In the state where the silicon oxide film is simply formed on the silicon carbide substrate, dangling bonds of carbon (C) atoms and silicon (Si) atoms are present on the interface between the silicon carbide substrate and the silicon oxide film. After the formation of the silicon oxide film, the silicon carbide substrate and the silicon oxide film are annealed in the gas containing hydrogen, whereby hydrogen (H) atoms are bonded to the dangling bonds of the carbon atoms and the silicon atoms, and the interface between the silicon carbide substrate and the silicon oxide film is hydrogen-terminated. Consequently, the number of defects (interface state density) on the interface between the silicon carbide substrate and the silicon oxide film decreases, and the state of the interface is improved.

After the annealing of the silicon carbide substrate and the silicon oxide film, the aluminum oxynitride film is formed on the silicon oxide film. The aluminum oxynitride film is present on the silicon oxide film, whereby dehydrogenation from the silicon carbide substrate and the silicon oxide film is prevented. Therefore, the state of the interface between the silicon carbide substrate and the silicon oxide film improved by the hydrogen termination is maintained.

According to the manufacturing method according to one aspect of the present invention, therefore, the state of the interface between the silicon carbide substrate and the silicon oxide film can be improved, and the improved state can be maintained.

Consequently, a semiconductor device in which the state of an interface between a silicon carbide substrate and a silicon oxide film is excellent can be obtained. In other words, a semiconductor device including a silicon carbide substrate, a silicon oxide film formed on the silicon carbide substrate and an aluminum oxynitride film formed on the silicon oxide film, in which the interface between the silicon carbide substrate and the silicon oxide film is hydrogen-terminated, can be manufactured by the manufacturing method according to the present invention.

In a case where the semiconductor device includes a MISFET having the silicon oxide film and the aluminum oxynitride film as a gate insulating film, improvement of channel mobility can be attained due to reduction of interface state density.

The aluminum oxynitride film is a high dielectric constant film (High-k film). In the gate insulating film consisting of the silicon oxide film and the aluminum oxynitride film, therefore, leakage current can be reduced while ensuring equivalent or higher electric characteristics as compared with a gate insulating film consisting of only a silicon oxide film, by enlarging the thickness of the aluminum oxynitride film. Consequently, reliability of the gate insulating film can be improved.

A gate electrode formed on the aluminum oxynitride film is preferably made of a metallic material containing aluminum. Thus, improvement in operating speed of the MISFET and reduction of power consumption can be attained as compared with such a structure that a gate electrode is made of polycrystalline silicon.

After the formation of the aluminum oxynitride film, the aluminum oxynitride film is preferably subjected to annealing (PDA: Post Deposition Annealing). Due to the annealing, crystallinity of the aluminum oxynitride film can be raised, and quality of the aluminum oxynitride film can be improved.

The annealing of the silicon carbide substrate and the silicon oxide film is preferably FGA (Forming Gas Annealing), and suitably performed in forming gas prepared by mixing hydrogen ($H_2$) and nitrogen ($N_2$) with each other under a temperature condition of 450 to 1000° C. The forming gas suitably contains hydrogen in a ratio smaller than the explosion limit, and more specifically, the forming gas suitably contains 3% of hydrogen and 97% of nitrogen. The annealing of the silicon carbide substrate and the silicon oxide film is suitably performed in the forming gas at a temperature of 1000° C. for 30 minutes and thereafter performed at a temperature of 450° C. for 30 minutes. Thus, hydrogen atoms can be excellently introduced into the silicon oxide film, and the number of dangling bonds of carbon atoms and silicon atoms present on the interface between the silicon carbide substrate and the silicon oxide film can be effectively reduced.

Before the annealing of the silicon carbide substrate and the silicon oxide film, nitrogen plasma is preferably applied to the silicon oxide film. Thus, Si—O—C bonds and C—C clusters can be cut and dangling bonds of carbon atoms and silicon atoms can be formed on the interface between the silicon carbide substrate and the silicon oxide film. Then, the annealing of the silicon carbide substrate and the silicon oxide film is performed after the application of the nitrogen plasma, whereby hydrogen atoms can be easily bonded to the dangling bonds of the carbon atoms and the silicon atoms present on interface between the silicon carbide substrate and the silicon oxide film. Consequently, the interface between the silicon carbide substrate and the silicon oxide film can be excellently hydrogen-terminated.

The silicon oxide film is preferably formed by thermal oxidation employing gas containing a nitrogen oxide ($NO_x$). Thus, nitrogen atoms can be introduced into the silicon oxide film, and the dielectric constant of the silicon oxide film can be raised. Consequently, leakage current can be further reduced. Besides, further reduction of interface state density can be attained due to nitrogen termination on the interface between the silicon carbide substrate and the silicon oxide film, and further improvement (betterment) of the channel mobility can be expected.

A semiconductor device according to another aspect of the present invention includes a silicon carbide layer, a silicon oxynitride film formed on the silicon carbide layer, a silicon oxide film formed on the silicon oxynitride film, a high dielectric constant insulating film (High-k insulating film) formed on the silicon oxide film, and a gate electrode formed on the high dielectric constant insulating film.

In other words, the semiconductor device according to the other aspect of the present invention includes a silicon carbide layer, a gate insulating film formed on the silicon carbide layer, and a gate electrode formed on the gate insulating film. The gate insulating film has a structure obtained by stacking a silicon oxynitride film, a silicon oxide film and a high dielectric constant insulating film from the side of the silicon carbide layer.

The silicon oxynitride film is interposed between the silicon carbide layer and the silicon oxide film, whereby reduction of interface state density on the interface between the silicon carbide layer and the gate insulating film can be attained as compared with such a structure that a gate insulating film consists of only a silicon oxide film. Further, improvement of channel mobility can be attained due to the reduction of the interface state density.

In addition, reduction of leakage current resulting from increase in thickness of the gate insulating film can be attained while suppressing increase of interface state density on the interface between the silicon carbide layer and the gate insulating film by reducing the total thickness of the silicon oxynitride film and the silicon oxide film and enlarging the thickness of the high dielectric constant insulating film.

Therefore, both of the improvement of the channel mobility resulting from the reduction of the interface state density and improvement of reliability of the gate insulating film resulting from the reduction of the leakage current can be attained.

In a case where the total thickness of the silicon oxynitride film and the silicon oxide film is not less than 1 nm and not more than 10 nm, the interface between the silicon carbide layer and the gate insulating film can be brought into a particularly excellent state.

The high dielectric constant insulating film may be an aluminum oxynitride film.

The gate electrode is preferably made of a metallic material containing aluminum. Thus, improvement in operating speed of a MISFET and reduction of power consumption can be attained as compared with such a structure that a gate electrode is made of polycrystalline silicon.

A semiconductor device according to still another aspect of the present invention includes a semiconductor layer made of first conductivity type SiC, a second conductivity type well region formed on a surface layer portion of the semiconductor layer, a first conductivity type source region formed on a surface layer portion of the well region, a gate insulating film formed on the semiconductor layer, and a gate electrode formed on the gate insulating film and opposed to a channel region of the well region where a channel is formed through the gate insulating film. In the source region, the impurity concentration in a first region of a prescribed width adjacent to the channel region is lower than the impurity concentration in a second region other than the first region.

Thus, the rate (rate of oxidation) of growth of an oxide film on the surface of the first region can be suppressed low by lowering the impurity concentration in the first region of the source region adjacent to the channel region. Therefore, formation of a large step between the surface of the first region and the surface of the channel region (well region) can be prevented after removal of the oxide film. Consequently, a path (movement path) of carriers moving from the source region to the channel region can be approximated to a straight line, whereby reduction of channel resistance can be attained.

The impurity concentration in the second region of the source region other than the first region is higher than the impurity concentration in the first region, whereby a step where the surface of the second region is lower by one stage than the surface of the first region is formed between the surface of the first region and the surface of the second region. Even if the step is formed between the surface of the first region and the surface of the second region, the step does not influence the flow of the carriers in the channel region. Therefore, the channel resistance can be reduced without reducing the carrier concentration in the source region by relatively lowering the impurity concentration in the first region and relatively raising the impurity concentration in the second region.

In a case where the source region and the channel region are adjacently formed in a direction along the upper surface of the semiconductor layer, the respective upper surfaces of the source region and the channel region become the surfaces thereof, and the gate insulating film is formed on the upper surface of the semiconductor layer. Then, the gate electrode is provided on the gate insulating film, to be opposed to the upper surface of the channel region. In other words, the semiconductor device has a planar gate MIS (Metal Insulator Semiconductor) structure.

In a case where the source region and the channel region are adjacently formed in a direction orthogonal to the upper surface of the semiconductor layer, a trench dug down from the upper surface of the source region is formed in the semiconductor layer, and the gate insulating film is formed on the inner surface of the trench. The trench passes through the source region and the well region. Then, the gate electrode is provided inside the gate insulating film, and embedded in the trench. In other words, the semiconductor device has a trench gate MIS structure.

The foregoing and other objects, features and effects of the present invention will become more apparent from the following detailed description of the embodiments with reference to the attached drawings.

BRIEF DESCRIPTION OF THE DRAWINGS

FIG. 18C is a schematic sectional view showing a step subsequent to FIG. 18B.

FIG. 18D is a schematic sectional view showing a step subsequent to FIG. 18C.

FIG. 52E is a schematic sectional view showing a step subsequent to FIG. 52D.

FIG. 52F is a schematic sectional view showing a step subsequent to FIG. 52E.

FIG. 52G is a schematic sectional view showing a step subsequent to FIG. 52F.

MODES FOR CARRYING OUT THE INVENTION

<First Embodiment>

Figure 1:
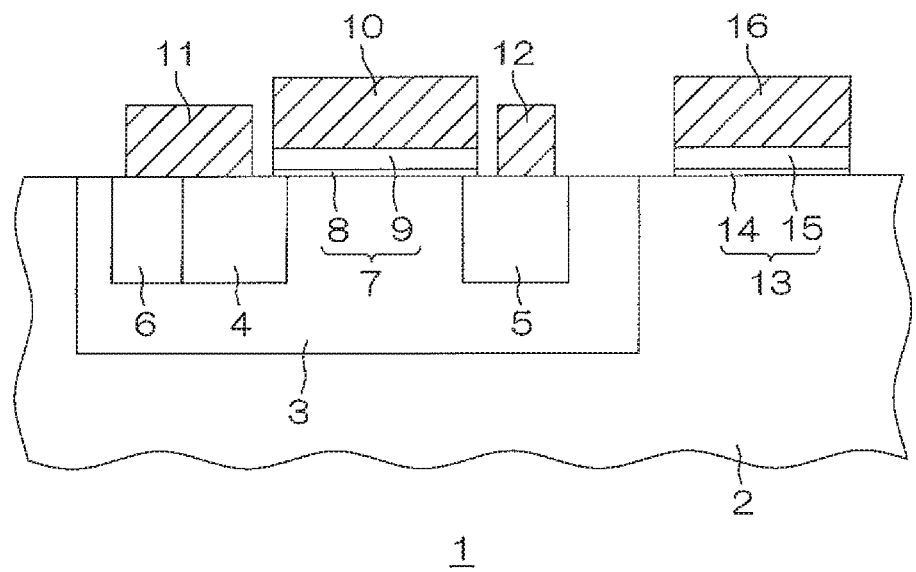
FIG. 1 is a schematic sectional view of a semiconductor device according to a first embodiment of the present invention.

FIG. 1 is a schematic sectional view of a semiconductor device according to a first embodiment of the present invention.

A semiconductor device 1 includes an SiC substrate 2 made of SiC (silicon carbide) doped with an N-type impurity.

A P-type well region 3 is formed on a surface layer portion of the SiC substrate 2.

An $N^+$-type source region 4 doped with an N-type impurity in a higher concentration than in the SiC substrate 2 and a drain region 5 are formed on a surface layer portion of the well region 3. The source region 4 and the drain region 5 are formed at intervals from a peripheral edge portion of the well region 3 respectively, and at an interval from each other.

A $P^+$-type contact region 6 doped with a P-type impurity in a higher concentration than in the well region 3 is formed on the surface layer portion of the well region 3. The contact region 6 is formed adjacently to a side of the source region 4 opposite to the drain region 5.

A gate insulating film 7 is formed on a region (channel region) between the source region 4 and the drain region 5. More specifically, the gate insulating film 7 is opposed to the region between the source region 4 and the drain region 5, and extends over a peripheral edge portion of the source region 4 and a peripheral edge portion of the drain region 5. The gate insulating film 7 has an AlON/$SiO_2$ multilayer structure including a relatively thin $SiO_2$ film 8 made of $SiO_2$ (silicon oxide) containing N (nitrogen) and an AlON film 9 made of AlON (aluminum oxynitride) and formed on the $SiO_2$ film 8. The thickness of the $SiO_2$ film 8 is 1 to 20 nm. The thickness of the AlON film 9 is 30 to 100 μm.

A gate electrode 10 having the same shape as the gate insulating film 7 in plan view is formed on the gate insulating film 7. The gate electrode 10 is made of a metallic material containing Al (aluminum).

A source electrode 11 is formed on the source region 4 and the contact region 6. The source electrode 11 is in contact with the surfaces of the source region 4 and the contact region 6 while extending over the same. The source electrode 11 is made of a metallic material containing Al.

A drain electrode 12 is formed on the drain region 5. The drain electrode 12 is in contact with the surface of the drain region 5. The drain electrode 12 is made of a metallic material containing Al.

Thus, the semiconductor device 1 includes an N-channel MISFET (Negative-channel Metal Insulator Semiconductor Field Effect Transistor). Voltage of not less than a threshold is applied to the gate electrode 10 in a state where the source electrode 11 is grounded and positive voltage is applied to the drain electrode 12, whereby a channel is formed in the channel region of the well region 3 in the vicinity of the interface between the same and the gate insulating film, and current flows from the drain electrode 12 toward the source electrode 11.

In the semiconductor device 1, a capacitance film 13 is selectively formed on a region of the SiC substrate 2 other than the well region 3. The capacitance film 13 has an AlON/$SiO_2$ multilayer structure including an $SiO_2$ film 14 made of $SiO_2$ containing N and an AlON film 15 made of AlON and formed on the $SiO_2$ film 14. The thicknesses of the $SiO_2$ film 14 and the AlON film 15 are identical to the thicknesses of the $SiO_2$ film 8 and the AlON film 9 respectively.

A capacitor electrode 16 having the same shape as the capacitance film 13 in plan view is formed on the capacitance film 13. The capacitor electrode 16 is made of the same material as the gate electrode 10, and has the same thickness as the gate electrode 10.

Thus, the semiconductor device 1 includes a MIS capacitor.

Figure 2:
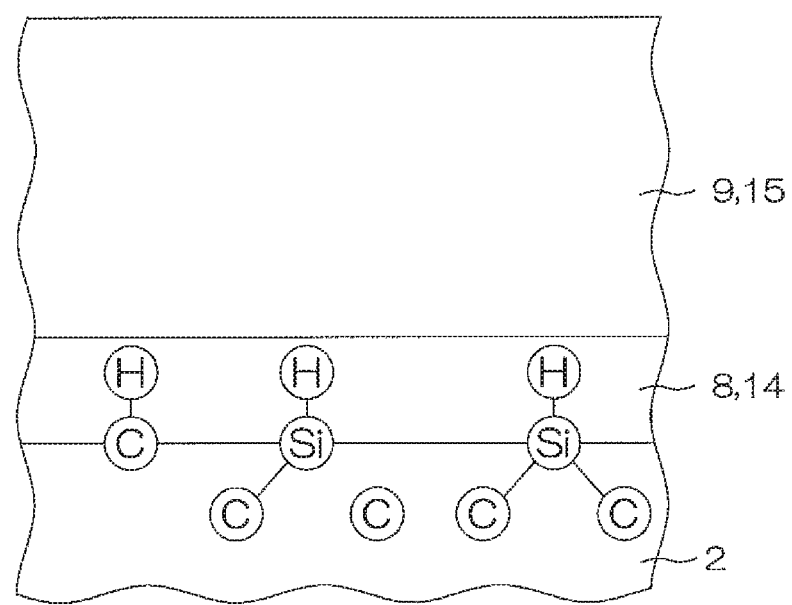
FIG. 2 is a sectional view illustratively showing the structure of an interface between an SiC substrate and an $SiO_2$ film.

FIG. 2 is a sectional view illustratively showing the structure of the interface between the SiC substrate and the $SiO_2$ film.

Dangling bonds of C (carbon) atoms and Si (silicon) atoms present on the interface between the SiC substrate 2 and the $SiO_2$ film 8 or 14 are small in number or generally nonexistent, and H (hydrogen) atoms are bonded to the C atoms and the Si atoms present on the interface between the SiC substrate 2 and the $SiO_2$ film 8 or 14. In other words, the interface between the SiC substrate 2 and the $SiO_2$ film 8 or 14 is hydrogen-terminated.

Figure 3:
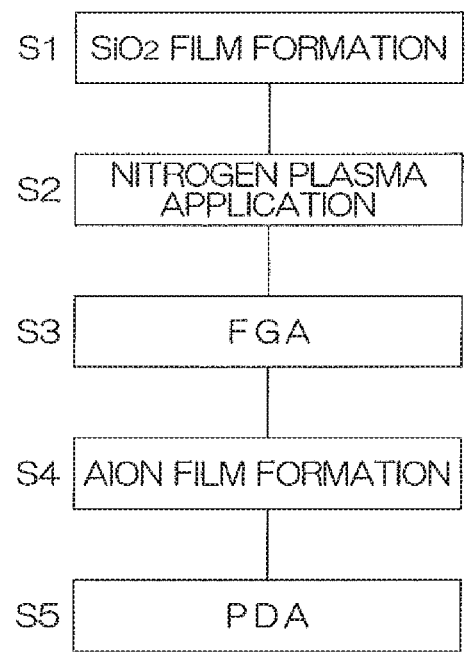
FIG. 3 is a manufacturing step diagram for the semiconductor device shown in FIG. 1.

FIG. 3 is a manufacturing step diagram for the semiconductor device.

In order to manufacture the semiconductor device 1, an $SiO_2$ film formation step (S1), a nitrogen plasma application step (S2), an FGA (Forming Gas Annealing) step (S3), an AlON film formation step (S4) and a PDA (Post Deposition Annealing) step (S5) are carried out in this order.

In the $SiO_2$ film formation step (S1), an $SiO_2$ film made of $SiO_2$ containing N is formed on the SiC substrate 2 by thermal oxidation employing gas containing $N_2O$ (nitrogen oxide).

In the nitrogen plasma application step (S2), nitrogen plasma is applied to the $SiO_2$ film. The nitrogen plasma is continuously applied over 30 minutes in a state where the SiC substrate 2 is heated to 500° C., for example. Atmospheric pressure and RF output at this time are 7.5 Torr and 50 W respectively, for example. The nitrogen plasma is applied to the SiO$_2$ film, whereby Si—O—C bonds and C—C clusters are cut and dangling bonds of C atoms and Si atoms are formed on the interface between the SiC substrate 2 and the SiO$_2$ film.

In the FGA step (S3), the SiC substrate 2 and the SiO$_2$ film are annealed in forming gas containing 3% of H$_2$ (hydrogen gas) and 97% of N$_2$ (nitrogen gas). For example, annealing at a temperature of 1000° C. is performed for 30 minutes, and annealing at a temperature of 450° C. is thereafter performed for 30 minutes. Thus, H atoms are excellently introduced into the SiO$_2$ film, and the number of the dangling bonds of the C atoms and the Si atoms present on the interface between the SiC substrate 2 and the SiO$_2$ film decreases.

In the AlON film formation step (S4), an AlON film is formed on the SiO$_2$ film by reactive sputtering employing mixed gas of N$_2$ and O$_2$ (oxygen gas) and an Al target.

In the PDA step (S5), the AlON film is annealed in N$_2$. The annealing is performed at a temperature of 900° C. for 30 minutes, for example. Thus, crystallinity of the AlON film rises, and quality of the AlON film improves.

Thereafter the gate electrode 10 and the capacitor electrode 16 are formed on the AlON film. The gate electrode 10 and the capacitor electrode 16 are formed by selectively vapor-depositing the material (Al) for the gate electrode on the surface of the AlON film with a mask, for example. Then, exposed portions (portions not opposed to the gate electrode 10 and the capacitor electrode 16) of the AlON film and the SiO$_2$ film are removed by photolithography and etching, and the AlON film and the SiO$_2$ film are worked into the AlON films 9 and 15 and the SiO$_2$ films 8 and 14 respectively. When the source electrode 11 and the drain electrode 12 are thereafter formed, the semiconductor device 1 shown in FIG. 1 is obtained.

In the state where the SiO$_2$ film is simply formed on the SiC substrate 2, dangling bonds of C atoms and Si atoms are present on the interface between the SiC substrate 2 and the SiO$_2$ film. After the formation of the SiO$_2$ film, therefore, the SiC substrate 2 and the SiO$_2$ film are annealed in the forming gas containing H$_2$. Thus, H atoms are bonded to the dangling bonds of the C atoms and the Si atoms, and the interface between the SiC substrate 2 and the SiO$_2$ film is hydrogen-terminated. Consequently, the number of defects (interface state density) on the interface between the SiC substrate 2 and the SiO$_2$ film decreases, and the state of the interface is improved.

After the annealing of the SiC substrate 2 and the SiO$_2$ film, the AlON film is formed on the SiO$_2$ film. The AlON film is present on the SiO$_2$ film, whereby dehydrogenation from the SiC substrate 2 and the SiO$_2$ film is prevented. Therefore, the state of the interface between the SiC substrate 2 and the SiO$_2$ film improved by the hydrogen termination is maintained.

Thus, the state of the interface between the SiC substrate 2 and the SiO$_2$ film can be improved, and the improved state can be maintained.

In the semiconductor device 1 manufactured by the manufacturing method shown in FIG. 3, therefore, the interfaces between the SiC substrate 2 and the SiO$_2$ films 8 and 14 are hydrogen-terminated. Therefore, the semiconductor device 1 has lower interface state density and can exhibit higher channel mobility as compared with a structure having large numbers of dangling bonds on interfaces between an SiC substrate and SiO$_2$ films.

In the gate insulating film 7 consisting of the SiO$_2$ film 8 and the AlON film 9, leakage current can be reduced while ensuring equivalent or higher electric characteristics as compared with a gate insulating film consisting of only an SiO$_2$ film, by enlarging the thickness of the AlON film 9. In the semiconductor device 1, therefore, reliability of the gate insulating film 7 is high as compared with the structure employing the gate insulating film consisting of only an SiO$_2$ film.

The gate electrode 10 formed on the AlON film 9 is made of the metallic material containing Al. Thus, improvement in operating speed of the MISFET and reduction of power consumption can be attained as compared with such a structure that the gate electrode 10 is made of polycrystalline silicon.

In the manufacturing steps for the semiconductor device 1, the AlON film is annealed after the formation of the AlON film. Thus, the crystallinity of the AlON film can be raised, and the quality of the AlON film can be improved.

Further, the nitrogen plasma is applied to the SiO$_2$ film before the annealing of the SiC substrate 2 and the SiO$_2$ film. Thus, Si—O—C bonds and C—C clusters can be cut and dangling bonds of carbon atoms and silicon atoms can be formed on the interface between the SiC substrate 2 and the SiO$_2$ film. Then, the annealing of the SiC substrate 2 and the SiO$_2$ film is performed after the application of the nitrogen plasma, whereby H atoms can be easily bonded to the dangling bonds of the C atoms and the Si atoms present on the interface between the SiC substrate 2 and the SiO$_2$ film. Consequently, the interface between the SiC substrate 2 and the SiO$_2$ film can be excellently hydrogen-terminated.

The SiO$_2$ film is formed by the thermal oxidation employing the gas containing the nitrogen oxide (N$_2$O). Thus, N atoms can be introduced into the SiO$_2$ film, and the dielectric constant of the SiO$_2$ film can be raised. Consequently, the leakage current can be further reduced.

(Characteristic Evaluation)

A sample 1 (AlON/SiO$_2$) having a MISFET of the structure shown in FIG. 1 was prepared by the manufacturing method shown in FIG. 3. In the sample 1, the thickness of an SiO$_2$ film 8 is 10 nm, and the thickness of an AlON film 9 is 65 nm.

Further, a sample 2 (SiO$_2$) having a MOSFET of a structure obtained by stacking a gate electrode on an SiC substrate through a gate insulating film consisting of a single layer of SiO$_2$ was prepared. In the sample 2, the thickness of the gate insulating film is 40 nm.

1. Drain Current

Figure 4:
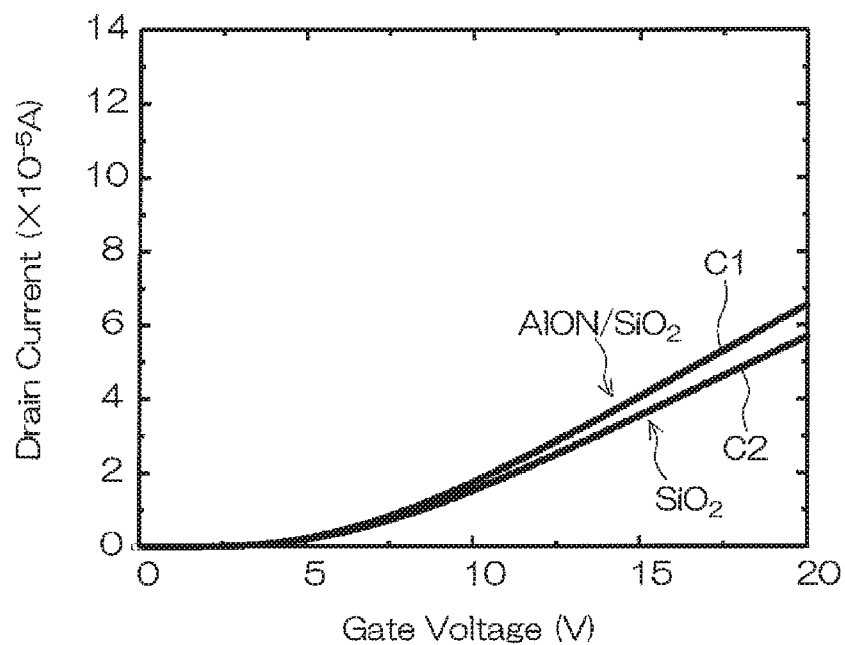
FIG. 4 is a graph showing the relations between gate voltage (Gate Voltage) and drain current (Drain Current).

FIG. 4 is a graph showing the relations between gate voltage (Gate Voltage) and drain current (Drain Current) in the samples 1 and 2.

As to the respective ones of the samples 1 and 2, magnitudes of the drain current at times of varying the gate voltage were examined.

FIG. 4 shows the relation between the gate voltage and the drain current in the sample 1 with a curve C1, and shows the relation between the gate voltage and the drain current in the sample 2 with a curve C2.

2. Field Effect Mobility

Figure 5:
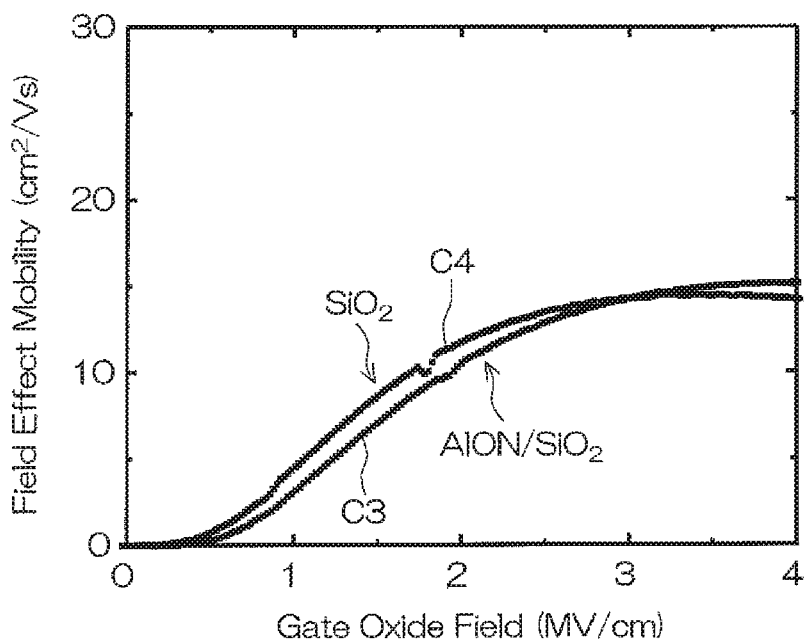
FIG. 5 is a graph showing the relations between the strength of electric fields (Gate Oxide Field) formed in gate insulating films in samples 1 and 2 and field effect mobility (Field Effect Mobility).

FIG. 5 is a graph showing the relations between the strength of electric fields (Gate Oxide Field) formed in gate insulating films and field effect mobility (Field Effect Mobility).

As to the respective ones of the samples 1 and 2, the magnitudes of the field effect mobility at times of varying the electric fields formed in the gate insulating films were examined.

FIG. 5 shows the relation between the strength of the electric field formed in a gate insulating film 7 and the field effect mobility in the sample 1 with a curve C3, and shows the relation between the strength of the electric field formed in the gate insulating film and the field effect mobility in the sample 2 with a curve C4.

From the curves C1 to C4 shown in FIGS. 4 and 5, it is understood that transistor operating characteristics of the samples 1 and 2 are generally identical to each other. Also in the MISFET employing the gate insulating film 7 consisting of the $SiO_2$ film 8 and the AlON film 9, the field effect mobility is generally identical to that of the MOSFET employing the gate insulating film consisting of the single layer of $SiO_2$, and hence no increase is conceivably caused in interface state density by stacking the AlON film 9 on the $SiO_2$ film 8.

Figure 13:
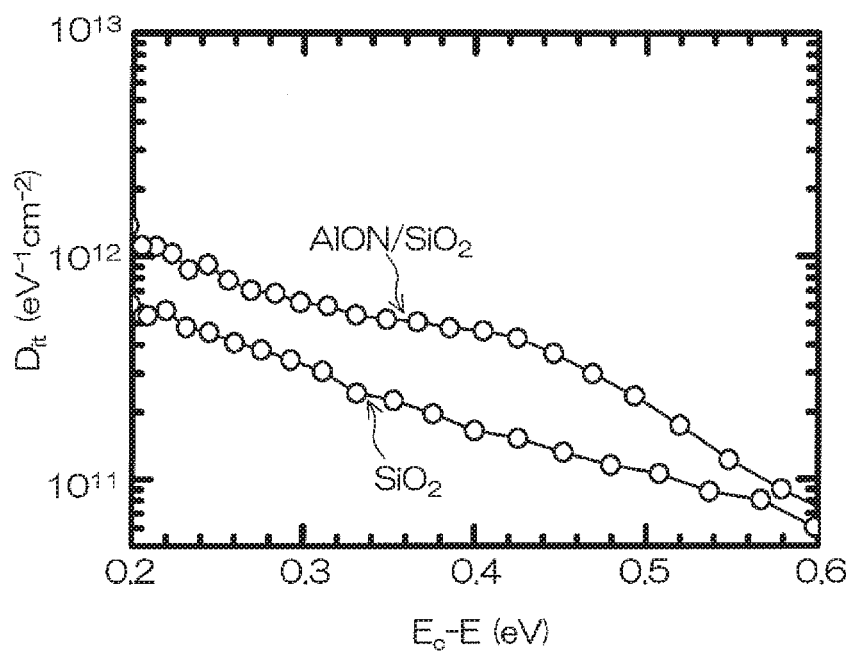
FIG. 13 is a graph showing evaluation results of interface state density of an SiC-MIS structure employing the AlON/$SiO_2$ multilayer gate insulating film and an SiC-MOS structure employing the $SiO_2$ single-layer gate insulating film.

In the evaluation (see FIG. 13) of the interface state density previously executed by the inventors of this application, therefore, the interface state density of the SiC-MIS structure employing the AlON/$SiO_2$ multilayer gate insulating film more increased than the interface state density of the SiC-MOS structure employing the $SiO_2$ single-layer gate insulating film, is conceivable as a result of reflecting defects (defects on the AlON/$SiO_2$ interface, for example) not influencing the transistor operating characteristics. More specifically, this evaluation is evaluation performed by calculating each interface state density of the SiC-MIS structure employing the AlON/$SiO_2$ multilayer gate insulating film and the SiC-MOS structure employing the $SiO_2$ single-layer gate insulating film by a High-Low method and comparing the same.

3. Temperature Characteristics

Figure 6:
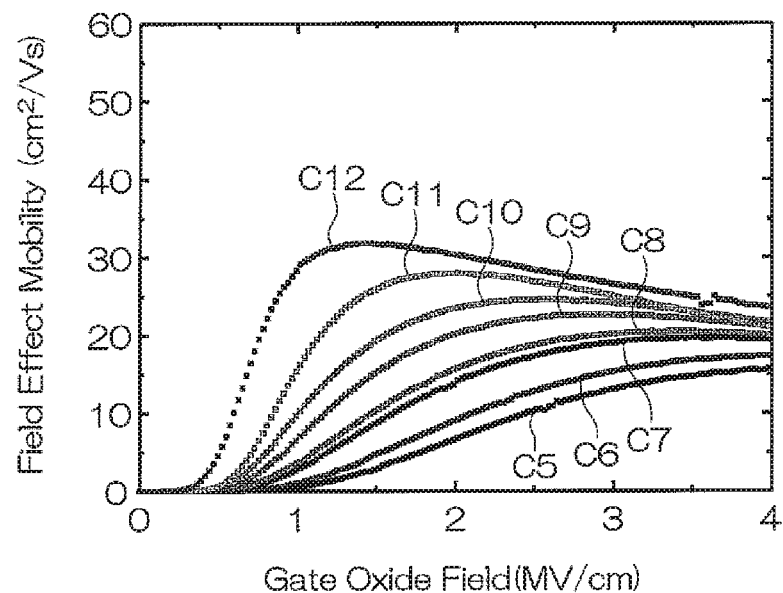
FIG. 6 is a graph showing temperature dependency of the field effect mobility of the sample 1.
Figure 7:
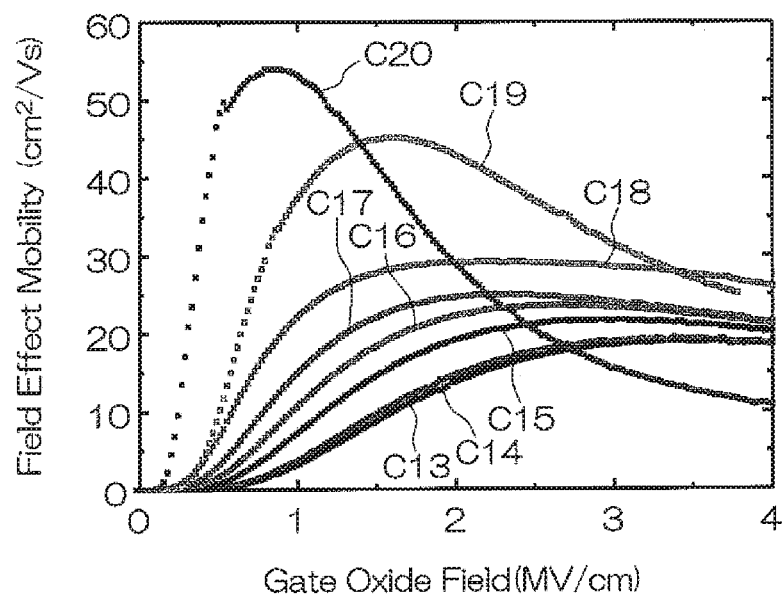
FIG. 7 is a graph showing temperature dependency of the field effect mobility of the sample 2.
Figure 8:
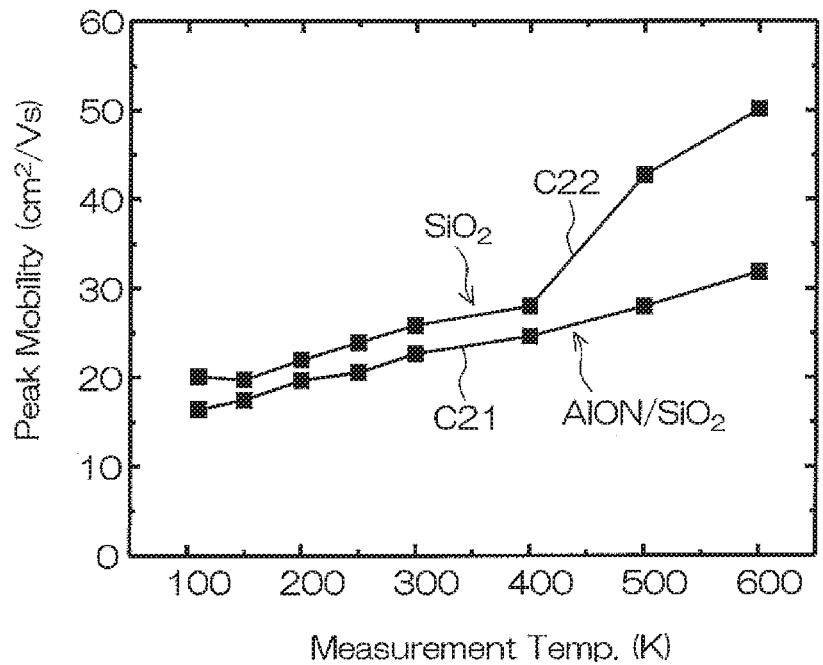
FIG. 8 is a graph showing the relation between each temperature and a maximum value of the field effect mobility at each temperature at the time of examining the temperature dependency shown in FIGS. 6 and 7.

FIG. 6 is a graph showing temperature dependency of the field effect mobility of the sample 1. FIG. 7 is a graph showing temperature dependency of the field effect mobility of the sample 2. FIG. 8 is a graph showing the relation between each temperature and a maximum value of the field effect mobility at each temperature at the time of examining the temperature dependency shown in FIGS. 6 and 7. In the graphs shown in FIGS. 6 and 7, the axes of abscissas show the strength of the electric fields formed in the gate insulating films, and the axes of ordinates show the field effect mobility.

As to the respective ones of the samples 1 and 2, temperatures of SiC substrates were set to 110 K, 150 K, 200 K, 250 K, 300 K, 400 K, 500 K and 600 K, and the relations between the strength of the electric fields formed in the gate insulating films and the field effect mobility at each temperature were examined. FIG. 6 shows the relations at the times when the temperatures of the SiC substrate were 110 K, 150 K, 200 k, 250 K, 300 K, 400 K, 500 K and 600 K with curves C5, C6, C7, C8, C9, C10, C11 and C12 respectively. FIG. 7 shows the relations at the times when the temperatures of the SiC substrate were 110 K, 150 K, 200 k, 250 K, 300 K, 400 K, 500 K and 600 K with curves C13, C14, C15, C16, C17, C18, C19 and C20 respectively. FIG. 8 shows the relation between the strength of the electric field formed in the gate insulating film 7 and the field effect mobility at each temperature in the sample 1 with a curve C21, and shows the relation between the strength of the electric field formed in the gate insulating film and the field effect mobility at each temperature in the sample 2 with a curve C22.

Comparing the curves C21 and C22 shown in FIG. 8 with each other, it is understood that the temperature dependency of the field effect mobility of the sample 1 is smaller than the temperature dependency of the field effect mobility of the sample 2, although the maximum value of the field effect mobility of the sample 1 at each temperature is slightly lower than the maximum value of the field effect mobility of the sample 2 at each temperature.

Comparing the curve C12 shown in FIG. 6 and the curve C20 shown in FIG. 7 with each other, it is understood that the field effect mobility of the sample 1 is greater than the field effect mobility of the sample 2 under the condition that high electric fields (electric fields of not less than 2 MV/cm) are formed in the gate insulating films at high temperature. Therefore, the sample 1, i.e., the semiconductor device 1 having the MISFET of the structure shown in FIG. 1 is suitable as a power device operating under the condition that an electric field of 3 to 4 MV/cm is formed in the gate insulating film 7.

Further, a sample 3 having a MISFET of the structure shown in FIG. 1 was prepared by a method omitting the nitrogen plasma application step (S2) and the FGA step (S3) from the manufacturing steps shown in FIG. 3. In the sample 3, the thickness of an $SiO_2$ film 8 is 10 nm, and the thickness of an AlON film 9 is 65 nm.

4. Drain Current

Figure 9:
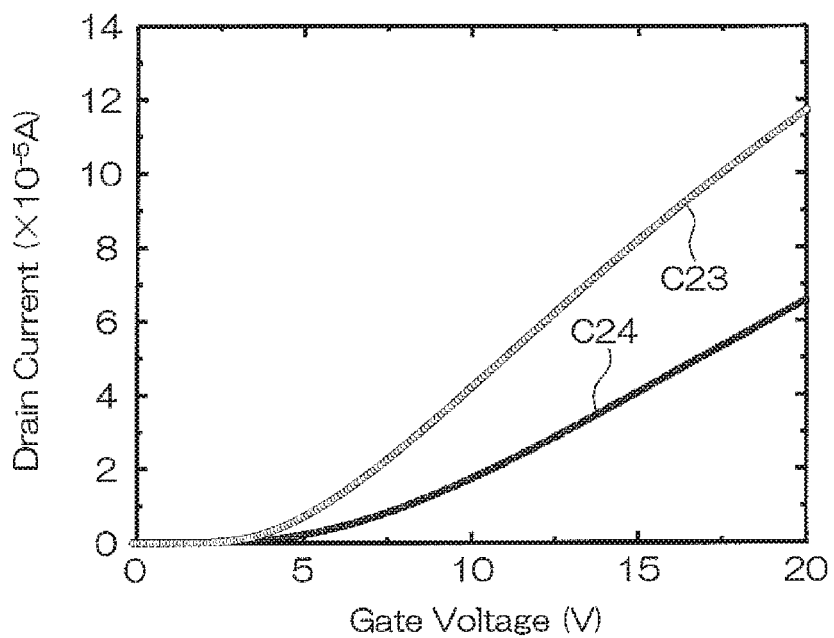
FIG. 9 is a graph showing the relations between gate voltage (Gate Voltage) and drain current (Drain Current) in samples 1 and 3.

FIG. 9 is a graph showing the relations between gate voltage (Gate Voltage) and drain current (Drain Current) in the samples 1 and 3.

As to the respective ones of the samples 1 and 3, the magnitudes of the drain current at times of varying the gate voltage were examined.

FIG. 9 shows the relation between the gate voltage and the drain current in the sample 1 with a curve C23, and shows the relation between the gate voltage and the drain current in the sample 3 with a curve C24.

Comparing the curves C23 and C24 shown in FIG. 9 with each other, it is understood that the drain current obtained in the sample 1 is greater than the drain current obtained in the sample 3. Therefore, the nitrogen plasma application step (S2) and the FGA step (S3) are conceivably effective for increase of the drain current.

5. Field Effect Mobility

Figure 10:
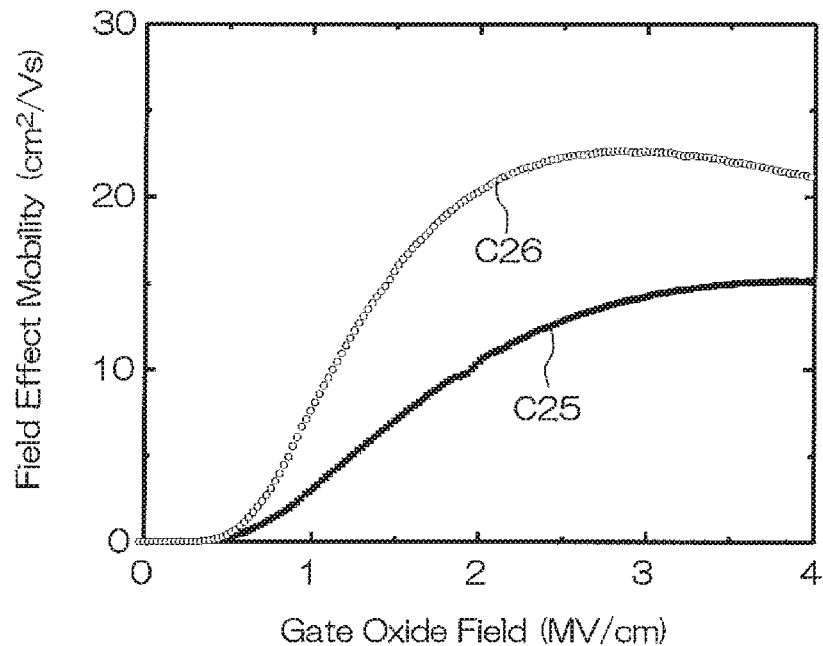
FIG. 10 is a graph showing the relations between the strength of electric fields (Gate Oxide Field) formed in gate insulating films and field effect mobility (Field Effect Mobility).
Figure 11:
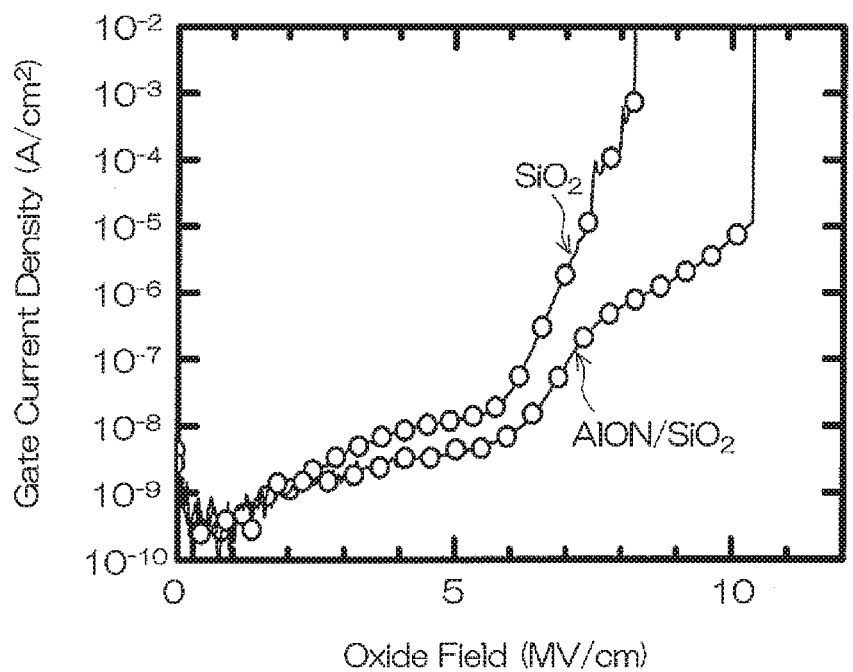
FIG. 11 is a graph showing field strength-leakage current characteristics (relations between the strength of electric fields (Oxide Field) formed in gate insulating films and leakage current density (Gate Current Density)) of an AlON/$SiO_2$ multilayer gate insulating film and an $SiO_2$ single-layer gate insulating film at room temperature.
Figure 12:
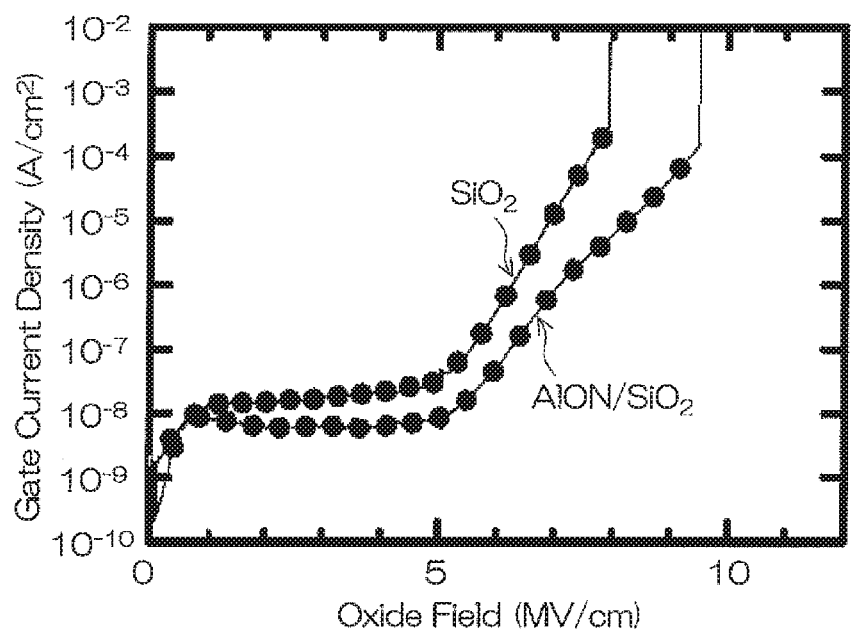
FIG. 12 is a graph showing field strength-leakage current characteristics (relations between the strength of electric fields (Oxide Field) formed in the gate insulating films and leakage current density (Gate Current Density)) of the AlON/$SiO_2$ multilayer gate insulating film and the $SiO_2$ single-layer gate insulating film at high temperature.

FIG. 10 is a graph showing the relations between the strength of electric fields (Gate Oxide Field) formed in gate insulating films and field effect mobility (Field Effect Mobility).

As to the respective ones of the samples 1 and 3, the magnitudes of the field effect mobility at times of varying the electric fields formed in the gate insulating films were examined.

FIG. 10 shows the relation between the strength of the electric field formed in the gate insulating film 7 and the field effect mobility in the sample 1 with a curve C26, and shows the relation between the strength of the electric field formed in a gate insulating film 7 and the field effect mobility in the sample 3 with a curve C25.

Comparing the curves C25 and C26 shown in FIG. 10 with each other, it is understood that the field effect mobility of the sample 1 is greater than the field effect mobility of the sample 3. Therefore, the nitrogen plasma application step (S2) and the FGA step (S3) are conceivably effective as methods of improving the states of the interfaces between the SiC substrate 2 and the $SiO_2$ films 8 and 14.

While a structure including a lateral MISFET has been illustrated in the aforementioned embodiment, the present invention can also be applied to a structure including a vertical MISFET.

<Second Embodiment>

Figure 30:
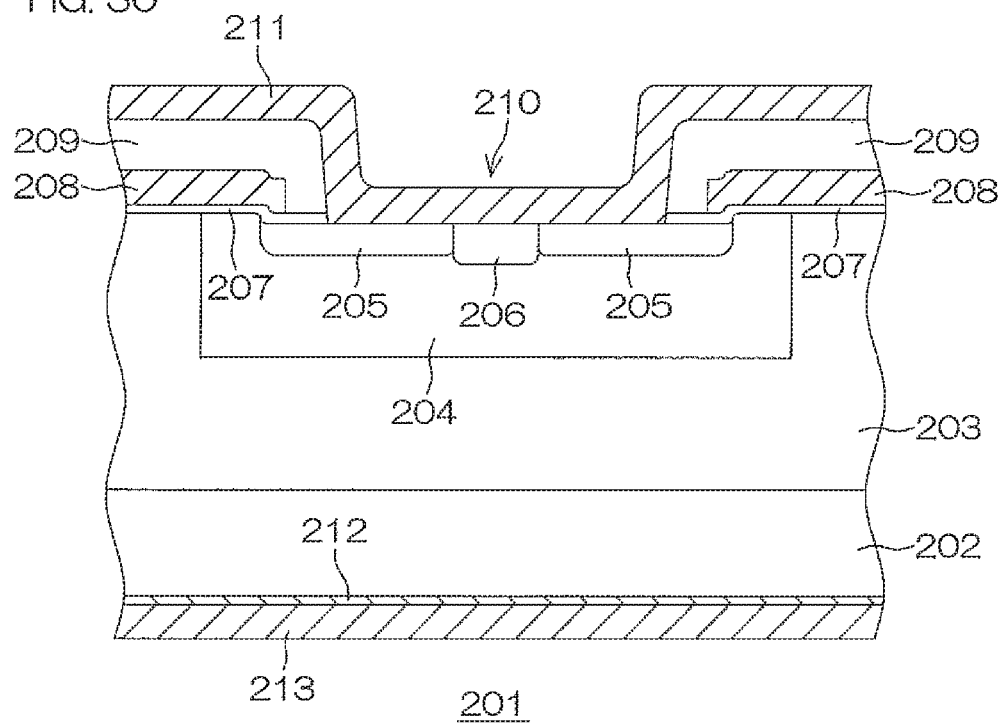
FIG. 30 is a schematic sectional view of a semiconductor device according to reference example employing SiC.

FIG. 30 is a schematic sectional view of a semiconductor device according to reference example studied by the inventor in the process of completing a second embodiment of the present invention.

A semiconductor device 201 includes an N-type SiC substrate 202. An N-type SiC layer 203 is formed on the N-type SiC substrate 202 by epitaxy.

A P-type well region 204 is selectively formed on a surface layer portion of the N-type SiC layer 203. An N$^+$-type source region 205 is formed on a surface layer portion of the well region 204 at an interval from a peripheral edge of the well region 204.

A P$^+$-type contact region 206 doped with a P-type impurity in a higher concentration than in the well region 204 is formed inside each source region 205. Each contact region 206 is formed to pass through the source region 205 in the depth direction.

A gate oxide film 207 made of silicon oxide (SiO$_2$) is formed on the N-type SiC substrate 202.

A gate electrode 208 made of N-type polycrystalline silicon (N-type Poly-Si) is formed on the gate oxide film 207. The gate electrode 208 is opposed to a region (channel region) between the peripheral edge of the well region 204 and a peripheral edge of the source region 205.

An interlayer dielectric film 209 made of silicon oxide is stacked on the N-type SiC layer 203.

In the interlayer dielectric film 209, a contact hole 210 is formed on a position opposed to each contact region 206. Each contact hole 210 passes through the gate oxide film 207. The whole area of the contact region 206 and a portion of the source region 205 around the contact region 206 face the inner portion of each contact hole 210.

A source metal 211 made of a metallic material containing aluminum (Al) as a main component is formed on the interlayer dielectric film 209. The source metal 211 enters each contact hole 210 formed in the interlayer dielectric film 209, and is connected to the source region 205 and the contact region 206.

On the back surface of the N-type SiC substrate 202, an ohmic metal 212 made of nickel (Ni) or the like and a drain metal 213 made of a metallic material containing aluminum as a main component are formed in this order from the side of the N-type SiC substrate 202.

The potential (gate voltage) of the gate electrode 208 is controlled in a state where the source metal 211 is grounded and proper positive voltage is applied to the drain metal 213, whereby a channel is formed in the well region 204 in the vicinity of the interface between the same and the gate oxide film 207, and current flows between the source metal 211 and the drain metal 213.

In manufacturing steps for the semiconductor device 201, annealing for activating an N-type impurity is performed after implantation of the N-type impurity into the well region 204 for forming the source region 205. After the annealing, an oxide film formed in the annealing is removed from the upper surface of the N-type SiC layer 203 including the upper surfaces of the well region 204 and the source region 205. Before the formation of the gate oxide film 207, a treatment of forming a sacrificial oxide film on the upper surface of the N-type SiC layer 203 by thermal oxidation and removing the sacrificial oxide film may be performed in order to improve the state of the upper surface of the N-type SiC layer 203.

Figure 31:
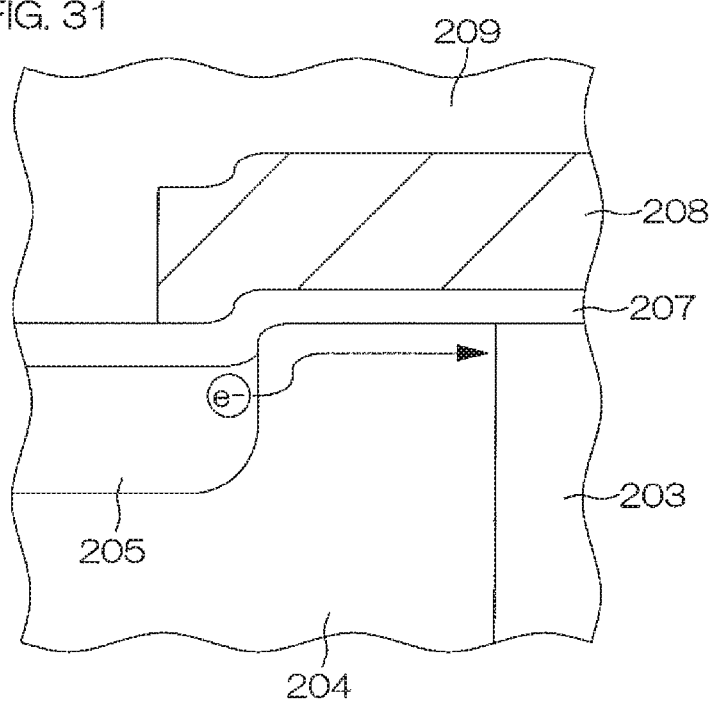
FIG. 31 is a schematic enlarged sectional view in the vicinity of a source region and a channel region shown in FIG. 30.

The source region 205 contains the impurity in a higher concentration as compared with the N-type SiC layer 203 and the well region 204. In the annealing or the thermal oxidation, therefore, growth of the oxide film progresses on the upper surface of the source region 205 at a higher rate than on the upper surfaces of the N-type SiC layer 203 and the well region 204. Consequently, a step where the upper surface of the source region 205 is lower by one stage than the upper surface of the well region 204 is formed after the oxide film is removed, as FIG. 31 shows the vicinity of a peripheral edge portion of the source region 205 in an enlarged manner.

When such a step is formed, electrons (e$^-$) flowing from the source region 205 toward the drain metal 213 through the channel region move from the source region 205 to the well region 204, rise in the well region 204 toward the upper surface thereof, and thereafter move along the upper surface of the well region 204. In other words, the flow of the electrons in the channel region becomes not a straight line, but a path directed toward the upper surface of the well region 204 and thereafter bent to be along the upper surface of the well region 204. Therefore, channel resistance enlarges due to the path in which the electrons flow toward the upper surface of the well region 204.

Therefore, the second embodiment provides a semiconductor device capable of approximating a movement path of carriers in a channel region to a straight line thereby reducing channel resistance.

Figure 14:
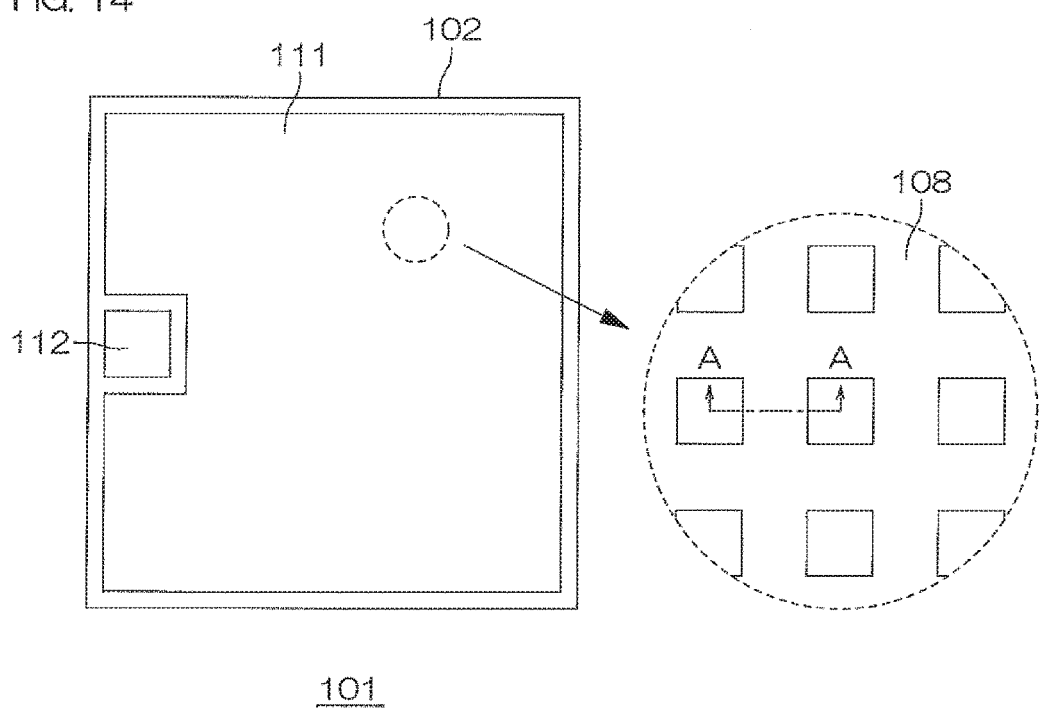
FIG. 14 is a schematic plan view of a semiconductor device according to a second embodiment of the present invention.
Figure 15:
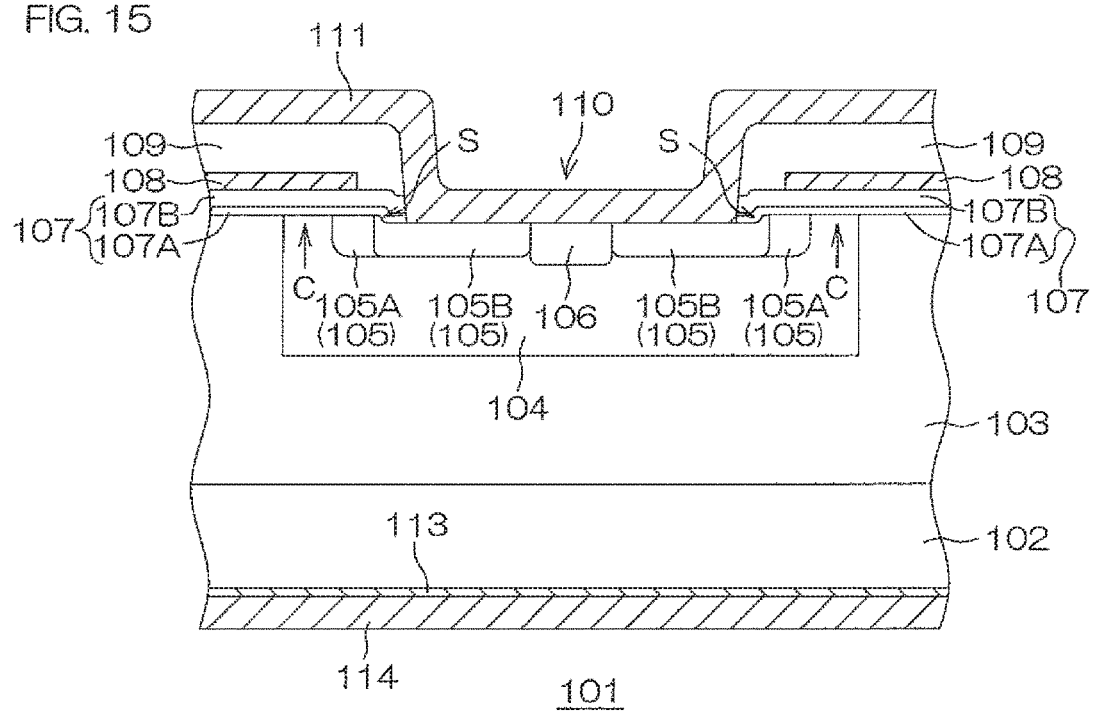
FIG. 15 is a schematic sectional view of the semiconductor device taken along a cutting plane line A-A shown in FIG. 14.
Figure 16:
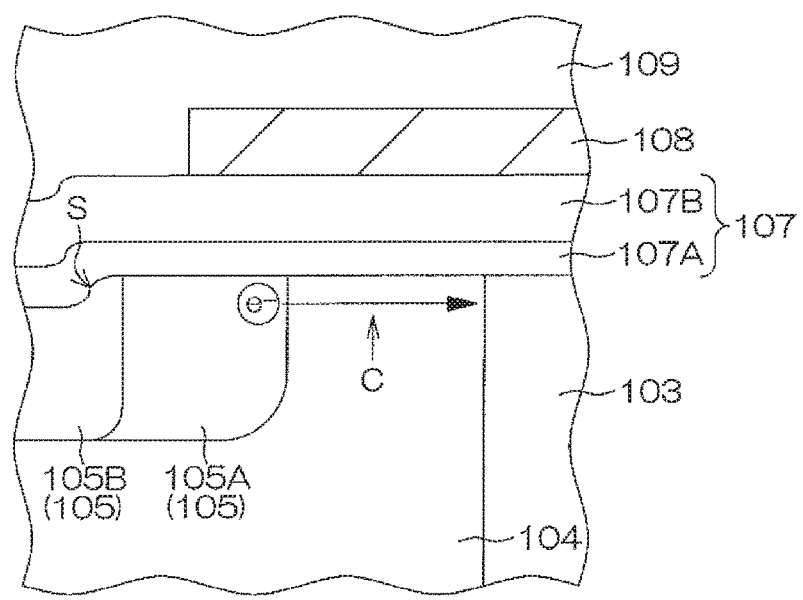
FIG. 16 is a schematic enlarged sectional view in the vicinity of a source region and a channel region shown in FIG. 15.

FIG. 14 is a schematic plan view of a semiconductor device according to the second embodiment of the present invention. FIG. 15 is a schematic sectional view of the semiconductor device taken along a cutting plane line A-A shown in FIG. 14. Referring to FIG. 15, only portions consisting of conductors are hatched, while hatching on the remaining portions is omitted. FIG. 16 is a schematic enlarged sectional view in the vicinity of a first region of a source region and a channel region shown in FIG. 15.

A semiconductor device 101 has a quadrangular (generally square) outer shape in plan view, as shown in FIG. 14.

The semiconductor device 101 includes a semiconductor substrate 102, as shown in FIG. 15. The semiconductor substrate 102 is made of SiC (N-type SiC) doped with an N-type impurity. A semiconductor layer 103 is formed on the semiconductor substrate 102 by epitaxy. In other words, the semiconductor layer 103 is an epitaxial layer made of N-type SiC.

A plurality of P-type well regions 104 are formed on a surface layer portion of the semiconductor layer 103. The plurality of well regions 104 are quadrangular (generally square) in plan view, and arrayed in the form of a matrix. The depth of the well regions 104 is 0.5 to 2 µm, for example. The well regions 104 have such an impurity concentration profile that the P-type impurity concentration in portions whose depth from the upper surfaces thereof is not more than 0.5 µm is $1\times10^{16}$ to $1\times10^{19}$ cm$^{-3}$, for example.

On a surface layer portion of each well region 104, an N-type source region 105 is formed at an interval from a peripheral edge of the well region 104. The depth of the source region 105 is 0.2 to 1 µm, for example.

In the source region 105, the N-type impurity concentration in a first region 105A of a prescribed width (0.2 µm, for example) from a peripheral edge thereof in plan view is lower by one to three digits than the N-type impurity concentration in a remaining second region (region inside the first region 105A) 105B. In other words, the source region 105 has the N+-type second region 105B whose N-type impurity concentration is relatively high and the N−-type first region 105A, in the form of an annulus surrounding the second region 105B, whose N-type impurity concentration is relatively low. The first region 105A has such an impurity concentration profile that the N-type impurity concentration in a portion whose depth from the upper surface thereof is not more than 0.2 μm is $5\times10^{17}$ to $5\times10^{19}$ cm$^{-3}$, for example. The second region 105B has such an impurity concentration profile that the N-type impurity concentration in a portion whose depth from the upper surface thereof is not more than 0.2 μm is $5\times10^{19}$ to $5\times10^{20}$ cm$^{-3}$, for example.

A step S where the upper surface of the second region 105B is lower by one stage than the upper surface of the first region 105A is formed between the upper surface of the first region 105A and the upper surface of the second region 105B (see FIG. 16). The magnitude of the step S is 0.2 μm, for example. No large step is formed between the upper surface of the first region 105A and the upper surface of the well region 104 (channel region C), but the upper surfaces are generally flush with each other.

A P+-type contact region 106 doped with a P-type impurity in a higher concentration than in the well region 104 is formed at the center of the second region 105B of each source region 105. Each contact region 106 is formed to pass through the second region 105B in the depth direction, and the deepest portion reaches the well region 104 present under the source region 105.

A gate insulating film 107 is formed on the semiconductor layer 103. The gate insulating film 107 has an AlON/SiO$_2$ multilayer structure including a relatively thin SiO$_2$ film 107A made of SiO$_2$ (silicon oxide) containing N (nitrogen) and an AlON film 107B made of AlON (aluminum oxynitride) and formed on the SiO$_2$ film 107A. The thickness of the SiO$_2$ film 107A is 1 to 20 nm. The thickness of the AlON film 107B is 30 to 100 μm.

Figure 17:
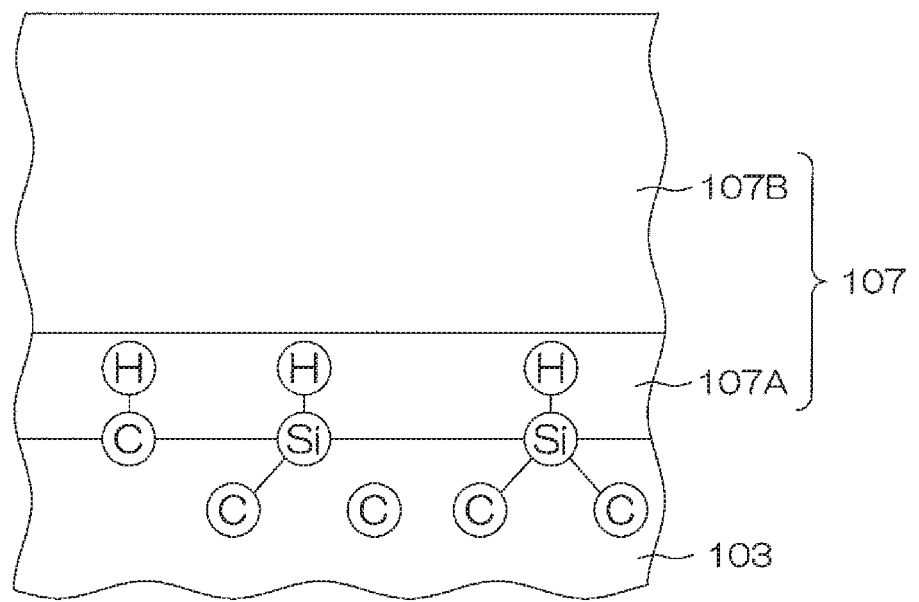
FIG. 17 is a sectional view illustratively showing the structure of an interface between an SiC substrate and an $SiO_2$ film.

FIG. 17 is a sectional view illustratively showing the structure of the interface between the SiC substrate and the SiO$_2$ film.

Dangling bonds of C (carbon) atoms and Si (silicon) atoms present on the interface between the semiconductor layer 103 and the SiO$_2$ film 107A are small in number or generally nonexistent, and H (hydrogen) atoms are bonded to the C atoms and the Si atoms present on the interface between the semiconductor layer 103 and the SiO$_2$ film 107A. In other words, the interface between the semiconductor layer 103 and the SiO$_2$ film 107A is hydrogen-terminated.

As shown in FIG. 15, a gate electrode 108 is formed on the gate insulating film 107 (the AlON film 107B). The gate electrode 108 is opposed to the semiconductor layer 103 between the well regions 104, the channel region C between the peripheral edge of each well region 104 and a peripheral edge of the source region 105 inside the same and part of the first region 105A of the source region 105 through the gate insulating film 107. The gate electrode 108 is provided in the form of a lattice in plan view as a whole, as shown in FIG. 14. Thus, the semiconductor device 101 has a planar gate MIS structure. The gate electrode 108 is made of polysilicon doped with an N-type impurity or a P-type impurity, or a metallic material containing Al (aluminum).

In FIG. 14, the gate electrode 108 is shown through an interlayer dielectric film 109 and a source metal 111 described later.

The interlayer dielectric film 109 is formed on the semiconductor layer 103, as shown in FIG. 15. The upper surface of the semiconductor layer 103 is covered with the interlayer dielectric film 109, along with the gate electrode 108. The interlayer dielectric film 109 is made of silicon oxide, for example.

In the interlayer dielectric film 109, a contact hole 110 is formed on a position opposed to each contact region 106. Each contact hole 110 passes through the gate insulating film 107, and the whole area of the contact region 106 and a portion of the source region 105 around the contact region 106 face the inner portion of each contact hole 110.

The source metal 111 is formed on the interlayer dielectric film 109. The source metal 111 enters each contact hole 110 formed in the interlayer dielectric film 109, and is connected to the source region 105 and the contact region 106. The source metal 111 is made of a metallic material containing aluminum (Al) as a main component, for example.

The interlayer dielectric film 109 and the source metal 111 are selectively removed at the centers of portions along one side edge of the semiconductor device 101, whereby an opening exposing part of the gate electrode 108 as a gate pad 112 for connection with an external portion is formed, as shown in FIG. 14.

On the back surface of the semiconductor substrate 102, an ohmic metal 113 made of nickel (Ni) or the like and a drain metal 114 made of a metallic material containing aluminum as a main component are formed on the whole surface thereof in this order from the side of the semiconductor substrate 102, as shown in FIG. 15.

Thus, the semiconductor device 101 includes an N-channel MISFET (Negative-channel Metal Insulator Semiconductor Field Effect Transistor).

The potential (gate voltage) of the gate electrode 108 is controlled in a state where the source metal 111 is grounded and proper positive voltage is applied to the drain metal 114, whereby a channel is formed in the channel region C of the well region 104 in the vicinity of the interface between the same and the gate insulating film 107, and current flows between the source metal 111 and the drain metal 114.

The N-type impurity concentration in the first region 105A of the source region 105 adjacent to the channel region C is lowered in the semiconductor device 101, whereby no large step is formed between the upper surface of the first region 105A and the upper surface of the channel region C (the well region 104), as shown in FIG. 16.

Therefore, electrons (e−) flowing between the source metal 111 and the drain metal 114 move from the source region 105 to the channel region C along the upper surface of the first region 105A, and move in the channel region C along the upper surface thereof. In other words, the path of the electrons in the channel region C becomes a linear path along the upper surface of the channel region C. Therefore, channel resistance of the semiconductor device 101 is lower than the channel resistance of the semiconductor device of FIG. 30 in which the movement path of the electrons in the channel region becomes a bent path.

Figure 18A:
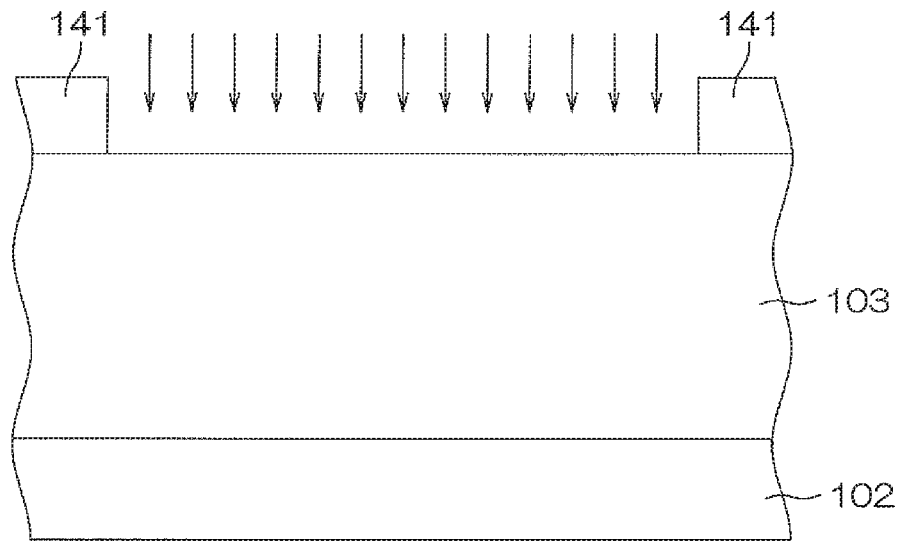
FIG. 18A is a schematic sectional view showing a manufacturing step for the semiconductor device.
Figure 18B:
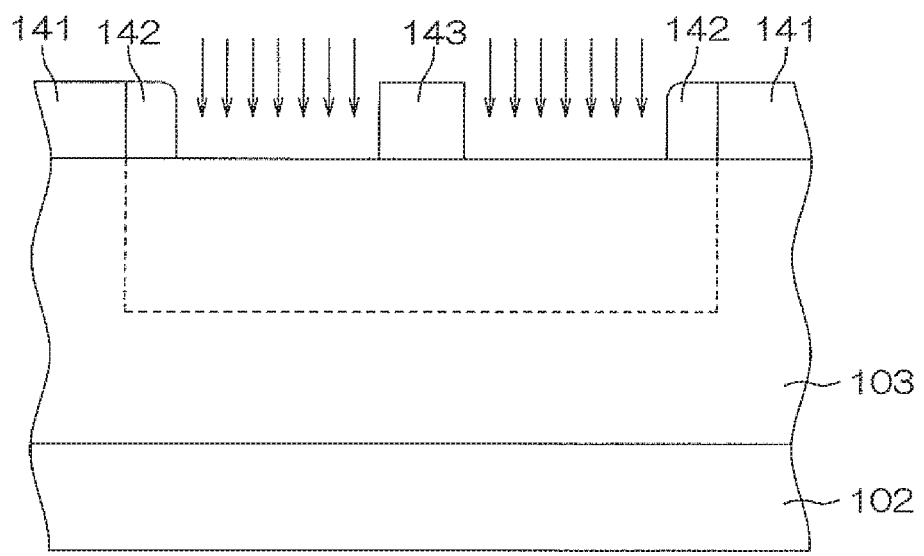
FIG. 18B is a schematic sectional view showing a step subsequent to FIG. 18A.

FIGS. 18A to 18K are schematic sectional views successively showing manufacturing steps for the semiconductor device. Referring to FIGS. 18A to 18K, only portions consisting of conductors are hatched, while hatching on the remaining portions is omitted. FIG. 19 is a manufacturing step diagram for the gate insulating film.

In the manufacturing steps for the semiconductor device 101, a deposition layer of polysilicon is first formed on the semiconductor layer 103 by CVD (Chemical Vapor Deposition). Then, the deposition layer (not shown) of polysilicon is selectively removed from a portion of the semiconductor layer 103 to become the well region 104 by photolithography and etching. Thus, a mask 141 made of polysilicon is formed on the semiconductor layer 103, as shown in FIG. 18A. Thereafter a portion of the semiconductor layer 103 exposed from the mask 141 is doped with a P-type impurity (aluminum, for example) by ion implantation.

Then, an oxide film (not shown) made of silicon oxide is formed to collectively cover the semiconductor layer 103 and the mask 141. Thereafter a deposition layer (not shown) of polysilicon is formed on the oxide film. Then, the deposition layer of polysilicon is etched back through the oxide film serving as an etching stopper and only prescribed portions of the deposition layer in contact with the side surfaces of the mask 141 are left, whereby a mask 142 integrated with the mask 141 is formed as shown in FIG. 18B. Then, the oxide film exposed from the mask 142 is removed. Then, a resist pattern 143 is formed on a portion of the semiconductor layer 103 to become the contact region 106 by photolithography. Thereafter portions of the semiconductor layer 103 exposed from the masks 141 and 142 and the resist pattern 143 are doped with an N-type impurity (phosphorus (P), for example) by ion implantation.

After the resist pattern 143 is removed, an oxide film (not shown) made of silicon oxide is formed again, to collectively cover the semiconductor layer 103 and the masks 141 and 142. Thereafter a deposition layer (not shown) of polysilicon is formed on the oxide film. Then, the deposition layer of polysilicon is etched back through the oxide film serving as an etching stopper and only prescribed portions of the deposition layer in contact with the side surfaces of the mask 142 are left, whereby a mask 144 integrated with the masks 141 and 142 is formed as shown in FIG. 18C. Then, the oxide film exposed from the mask 144 is removed. Then, a resist pattern 145 is formed on the portion of the semiconductor layer 103 to become the contact region 106 by photolithography. Thereafter portions of the semiconductor layer 103 exposed from the masks 141, 142 and 144 and the resist pattern 145 are additionally doped with the N-type impurity by ion implantation. After the doping of the N-type impurity, the masks 141, 142 and 144 and the resist pattern 145 are removed.

In the steps shown in FIGS. 18B and 18C, the formation of the resist patterns 143 and 145 may be omitted, and the portion of the semiconductor layer 103 to become the contact region 106 may be doped with the N-type impurity. Thus, photomasks necessary for the formation of the resist patterns 143 and 145 can be omitted, and the manufacturing steps for the semiconductor device 101 can be simplified.

Then, a resist pattern 146 is formed on the semiconductor layer 103, as shown in FIG. 18D. The resist pattern 146 exposes only the portion of the semiconductor layer 103 to become the contact region 106. Then, the portion of the semiconductor layer 103 exposed from the resist pattern 146 is doped with a P-type impurity by ion implantation.

Figure 18E:
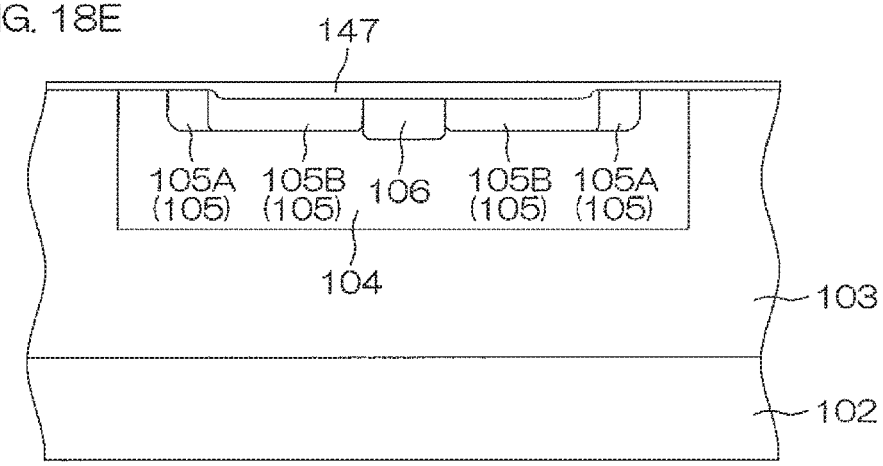
FIG. 18E is a schematic sectional view showing a step subsequent to FIG. 18D.
Figure 19:
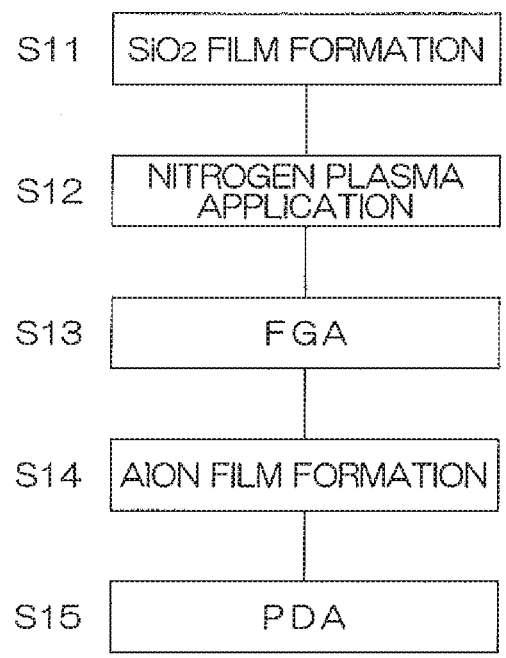
FIG. 19 is a manufacturing step diagram for a gate insulating film.

Thereafter annealing for activating the P-type impurity and the N-type impurity doped into the semiconductor layer 103 is performed, and the well region 104, the source region 105 (the first region 105A and the second region 105B) and the contact region 106 are formed on the surface layer portion of the semiconductor layer 103, as shown in FIG. 18E. At the annealing, the upper surface of the semiconductor layer 103 is thermally oxidized, whereby an oxide film 147 is formed. The second region 105B of the source region 105 and the contact region 106 have higher impurity concentrations as compared with the semiconductor layer 103, the well region 104 and the first region 105A of the source region 105, whereby the oxide film 147 relatively thickly grows on the second region 105B and the contact region 106.

Figure 18F:
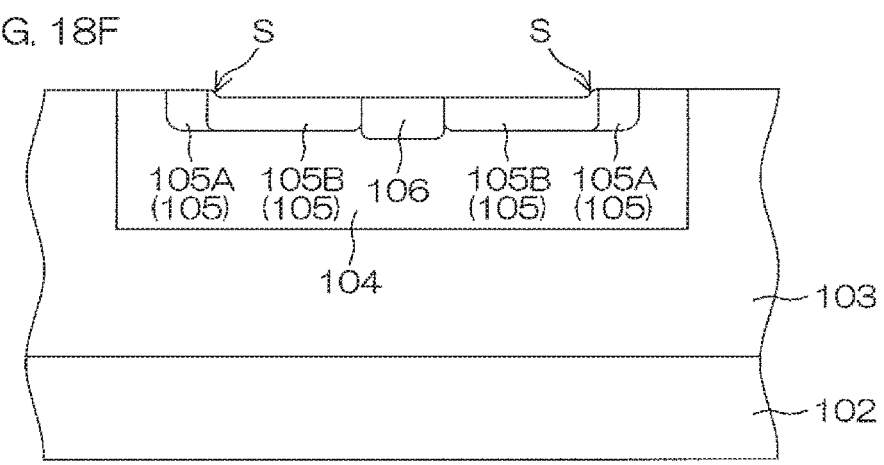
FIG. 18F is a schematic sectional view showing a step subsequent to FIG. 18E.

After the oxide film 147 is removed, therefore, the upper surfaces of the second region 105B and the contact region 106 enter states lower by one stage than the upper surfaces of the semiconductor layer 103, the well region 104 and the first region 105A of the source region 105, and the step S is formed between the first region 105A and the second region 105B, as shown in FIG. 18F.

After the removal of the oxide film 147, the states of the upper surfaces of the semiconductor layer 103, the well region 104, the source region 105 and the contact region 106 may be improved by forming a sacrificial oxide film on the upper surfaces of the semiconductor layer 103, the well region 104, the source region 105 and the contact region 106 by thermal oxidation and removing the sacrificial oxide film. In this case, a larger step S is formed between the first region 105A and the second region 105B after the removal of the sacrificial oxide film.

Figure 18G:
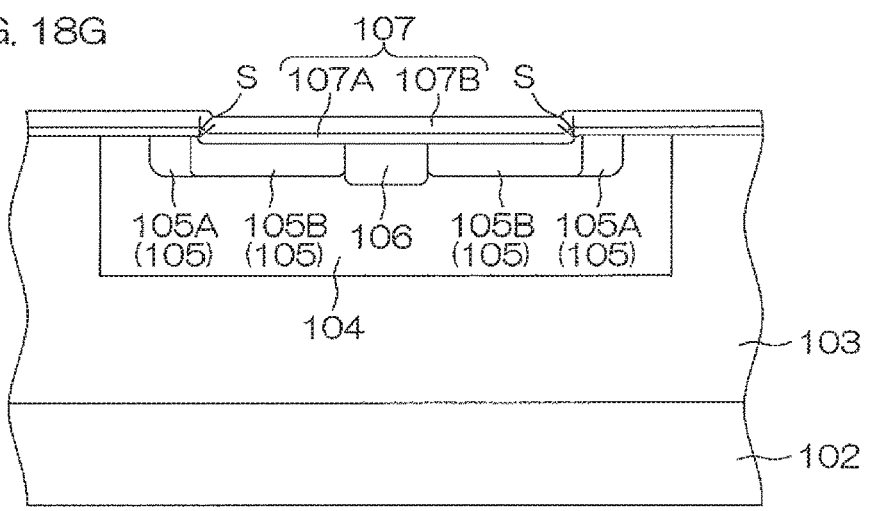
FIG. 18G is a schematic sectional view showing a step subsequent to FIG. 18F.

Thereafter the gate insulating film 107 is formed on the upper surfaces of the semiconductor layer 103, the well region 104, the source region 105 and the contact region 106, as shown in FIG. 18G.

In order to form the gate insulating film 107, an $SiO_2$ film formation step (S11), a nitrogen plasma application step (S12), an FGA (Forming Gas Annealing) step (S13), an AlON film formation step (S14) and a PDA (Post Deposition Annealing) step (S15) are carried out in this order, as shown in FIG. 19.

In the $SiO_2$ film formation step (S11), an $SiO_2$ film 107A made of $SiO_2$ containing N is formed on the semiconductor layer 103, the well region 104, the source region 105 and the contact region 106 by thermal oxidation employing gas containing $N_2O$ (nitrogen oxide).

In the nitrogen plasma application step (S12), nitrogen plasma is applied to the $SiO_2$ film 107A. The nitrogen plasma is continuously applied over 30 minutes in a state where the semiconductor substrate 102 is heated to 500° C., for example. Atmospheric pressure and RF output at this time are 7.5 Torr and 50 W respectively, for example. The nitrogen plasma is applied to the $SiO_2$ film 107A, whereby Si—O—C bonds and C—C clusters are cut and dangling bonds of C atoms and Si atoms are formed on the interface between the semiconductor layer 103 and the $SiO_2$ film 107A.

In the FGA step (S13), the semiconductor substrate 102 (the semiconductor layer 103) and the $SiO_2$ film 107A are annealed in forming gas containing 3% of $H_2$ (hydrogen gas) and 97% of $N_2$ (nitrogen gas). For example, annealing at a temperature of 1000° C. is performed for 30 minutes, and annealing at a temperature of 450° C. is thereafter performed for 30 minutes. Thus, H atoms are excellently introduced into the $SiO_2$ film 107A, and the number of the dangling bonds of the C atoms and the Si atoms present on the interface between the semiconductor layer 103 and the $SiO_2$ film 107A decreases.

In the AlON film formation step (S14), an AlON film 107B is formed on the $SiO_2$ film 107A by reactive sputtering employing mixed gas of $N_2$ and $O_2$ (oxygen gas) and an Al target.

In the PDA step (S15), the AlON film 107B is annealed in $N_2$. The annealing is performed at a temperature of 900° C. for 30 minutes, for example. Thus, crystallinity of the AlON film 107B rises, and quality of the AlON film 107B improves.

Thus, the gate insulating film 107 is formed as shown in FIG. 18G.

Figure 18H:
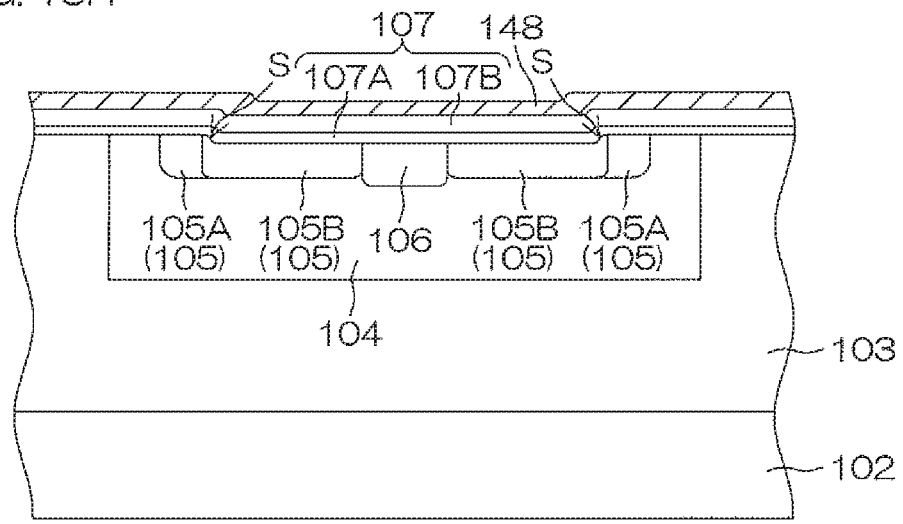
FIG. 18H is a schematic sectional view showing a step subsequent to FIG. 18G.

Then, a deposition layer 148 of polysilicon is formed on the gate insulating film 107 (the AlON film 107B) by CVD, as shown in FIG. 18H.

Figure 18I:
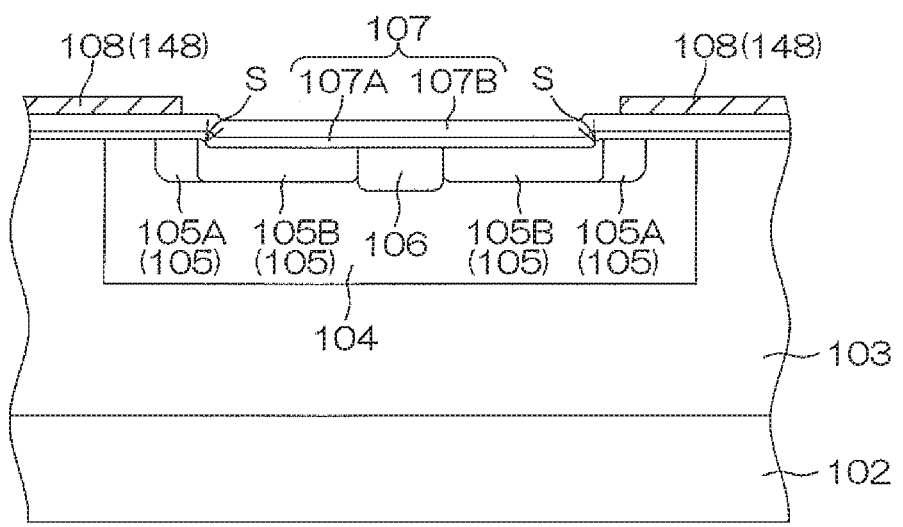
FIG. 18I is a schematic sectional view showing a step subsequent to FIG. 18H.

Then, the deposition layer 148 is selectively removed by photolithography and etching, and the gate electrode 108 made of polysilicon is formed on the gate insulating film 107, as shown in FIG. 18I. Alternatively, a gate electrode 108 made of a metallic material may be formed by forming a deposition layer of the metallic material containing Al (aluminum) on the gate insulating film 107 and selectively removing the deposition layer.

Figure 18J:
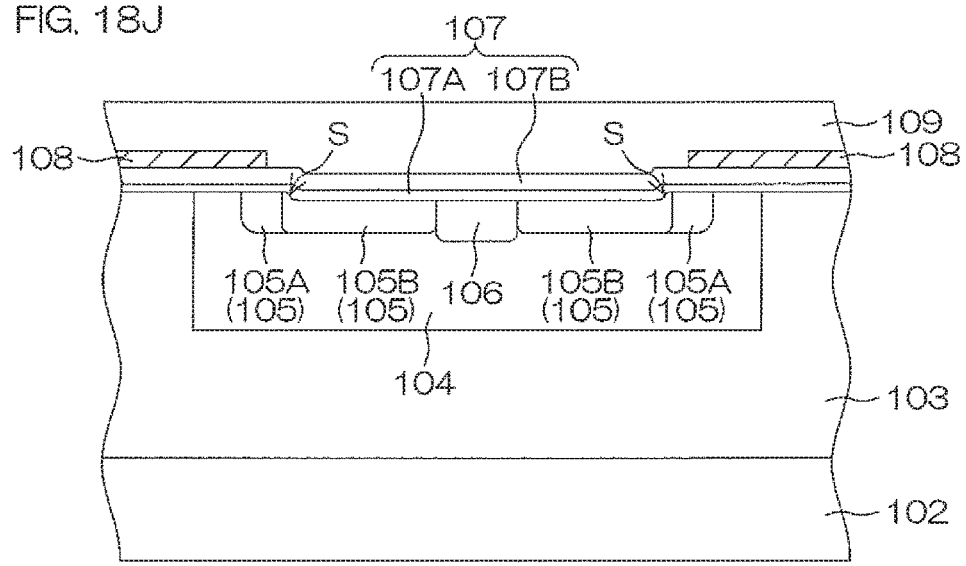
FIG. 18J is a schematic sectional view showing a step subsequent to FIG. 18I.

Then, the interlayer dielectric film 109 is formed on the gate insulating film 107 and the gate electrode 108 by CVD, as shown in FIG. 18J.

Figure 18K:
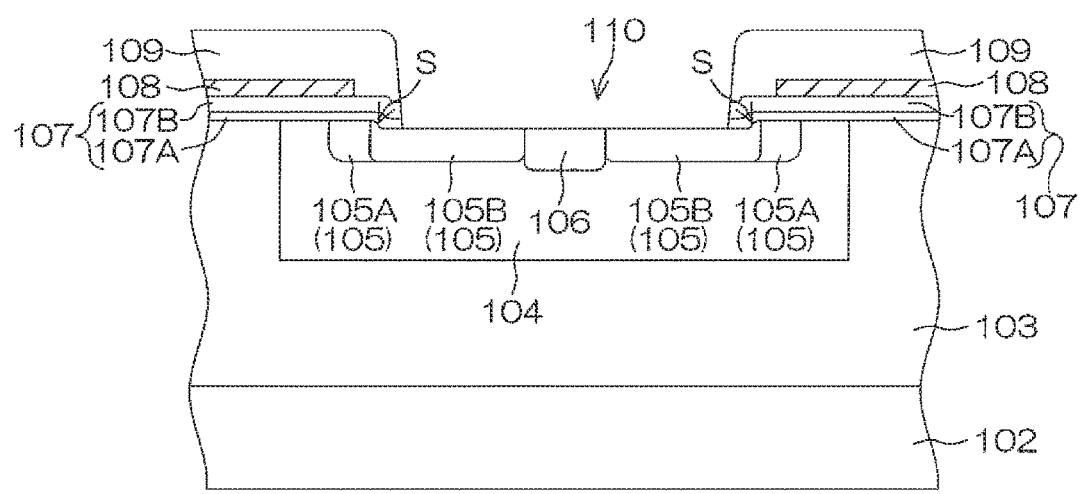
FIG. 18K is a schematic sectional view showing a step subsequent to FIG. 18J.

Then, the contact hole 110 passing through the interlayer dielectric film 109 and the gate insulating film 107 is formed by photolithography and etching, as shown in FIG. 18K.

Thereafter the source metal 111 is formed on the interlayer dielectric film 109 by sputtering. Then, the gate pad 112 is formed by photolithography and etching. Further, the ohmic metal 113 and the drain metal 114 are formed on the back surface of the semiconductor substrate 102 by sputtering. Thus, the semiconductor device 101 shown in FIG. 15 is obtained.

As hereinabove described, the rate (rate of oxidation) of the growth of the oxide film 147 on the upper surface of the first region 105A can be suppressed low by lowering the impurity concentration in the first region 105A of the source region 105 adjacent to the channel region C. Therefore, formation of a large step between the upper surface of the first region 105A and the upper surface of the channel region C (the well region 104) can be prevented after the removal of the oxide film 147. Consequently, the path (movement path) of electrons moving from the source region 105 to the channel region C can be approximated to a straight line, whereby reduction of channel resistance can be attained.

The impurity concentration in the second region 105B of the source region 105 other than the first region 105A is higher than the impurity concentration in the first region 105A, whereby the step S where the upper surface of the second region 105B is lower by one stage than the upper surface of the first region 105A is formed between the upper surface of the first region 105A and the upper surface of the second region 105B. Even if the step S is formed between the upper surface of the first region 105A and the upper surface of the second region 105B, the step S does not influence the flow of the electrons in the channel region C. Therefore, the channel resistance can be reduced without reducing the carrier concentration in the source region 105 by relatively lowering the impurity concentration in the first region 105A and relatively raising the impurity concentration in the second region 105B.

In relation to the manufacturing of the gate insulating film 107, dangling bonds of C atoms and Si atoms are present on the interface between the semiconductor substrate 102 and the $SiO_2$ film 107A in the state where the $SiO_2$ film 107A is simply formed on the semiconductor substrate 102 (the semiconductor layer 103). After the formation of the $SiO_2$ film 107A, therefore, the semiconductor substrate 102 and the $SiO_2$ film 107A are annealed in the forming gas containing $H_2$ (the FGA step S13 in FIG. 19). Thus, H atoms are bonded to the dangling bonds of the C atoms and the Si atoms, and the interface between the semiconductor substrate 102 and the $SiO_2$ film 107A is hydrogen-terminated. Consequently, the number of defects (interface state density) on the interface between the semiconductor substrate 102 and the $SiO_2$ film 107A decreases, and the state of the interface is improved.

After the annealing of the semiconductor substrate 102 and the $SiO_2$ film 107A, the AlON film 107B is formed on the $SiO_2$ film 107A (the AlON film formation step S14 in FIG. 19). The AlON film 107B is present on the $SiO_2$ film 107A, whereby dehydrogenation from the semiconductor substrate 102 and the $SiO_2$ film 107A is prevented. Therefore, the state of the interface between the semiconductor substrate 102 and the $SiO_2$ film 107A improved by the hydrogen termination is maintained.

Thus, the state of the interface between the semiconductor substrate 102 and the $SiO_2$ film 107A can be improved, and the improved state can be maintained.

In the semiconductor device 101 whose gate insulating film 107 is manufactured by the manufacturing method shown in FIG. 19, therefore, the interface between the semiconductor substrate 102 and the $SiO_2$ film 107A is hydrogen-terminated. Therefore, the semiconductor device 101 has lower interface state density and can exhibit higher channel mobility, as compared with a structure having a large number of dangling bonds on an interface between an SiC substrate and an $SiO_2$ film.

In the gate insulating film 107 consisting of the $SiO_2$ film 107A and the AlON film 107B, leakage current can be reduced while ensuring equivalent or higher electric characteristics as compared with a gate insulating film consisting of only an $SiO_2$ film, by enlarging the thickness of the AlON film 107B. In the semiconductor device 101, therefore, reliability of the gate insulating film 107 is high as compared with the structure employing the gate insulating film consisting of only the $SiO_2$ film.

The gate electrode 108 formed on the AlON film 107B is suitably made of a metallic material containing Al. Thus, improvement in operating speed of the MISFET and reduction of power consumption can be attained as compared with such a structure that the gate electrode 108 is made of polycrystalline silicon.

In the manufacturing steps for the gate insulating film 107, the AlON film 107B is annealed after the formation of the AlON film 107B (the PDA step S15 in FIG. 19). Thus, crystallinity of the AlON film 107B can be raised, and quality of the AlON film 107B can be improved.

Further, the nitrogen plasma is applied to the $SiO_2$ film 107A before the annealing of the semiconductor substrate 102 and the $SiO_2$ film 107A (the nitrogen plasma application step S12 in FIG. 19). Thus, Si—O—C bonds and C—C clusters can be cut and dangling bonds of carbon atoms and silicon atoms can be formed on the interface between the semiconductor substrate 102 and the $SiO_2$ film 107A. The annealing of the semiconductor substrate 102 and the $SiO_2$ film 107A is performed after the application of the nitrogen plasma, whereby H atoms can be easily bonded to the dangling bonds of the C atoms and the Si atoms present on the interface between the semiconductor substrate 102 and the $SiO_2$ film 107A. Consequently, the interface between the semiconductor substrate 102 and the $SiO_2$ film 107A can be excellently hydrogen-terminated.

Further, the $SiO_2$ film 107A is formed by the thermal oxidation employing the gas containing the nitrogen oxide ($N_2O$). Thus, N atoms can be introduced into the $SiO_2$ film 107A, and the dielectric constant of the $SiO_2$ film 107A can be raised. Consequently, the leakage current can be further reduced.

Figure 20:
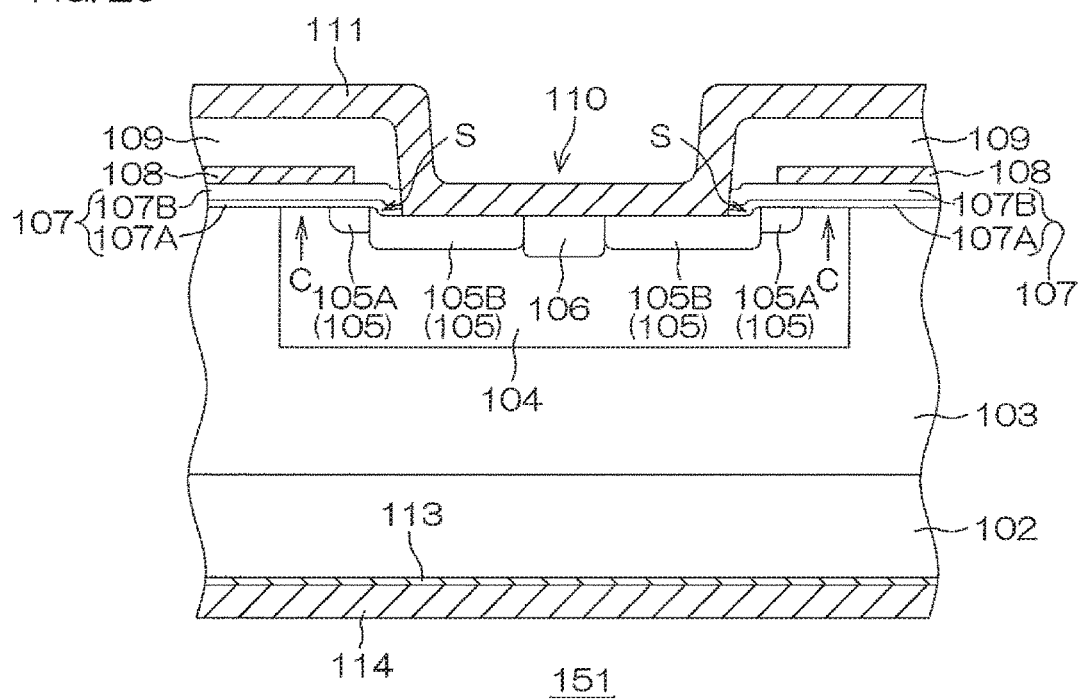
FIG. 20 is a schematic diagram of a semiconductor device according to a modification.

FIG. 20 is a schematic sectional view of a semiconductor device according to a modification. Referring to FIG. 20, portions corresponding to the respective portions shown in FIG. 15 are denoted by the same reference numerals as the reference numerals assigned to the respective portions. In the following, only a point different from the structure shown in FIG. 15 is described as to the structure shown in FIG. 20, and description of the respective portions denoted by the same reference numerals is omitted. Referring to FIG. 20, only portions consisting of conductors are hatched, while hatching on the remaining portions is omitted.

While the depth of the first region 105A of the source region 105 and the depth of the second region 105B are generally identical to each other in the semiconductor device 101 shown in FIG. 15, the depth of a first region 105A of a source region 105 is smaller than the depth of a second region 105B in a semiconductor device 151 shown in FIG. 20. Also when the depth of the first region 105A is smaller than the depth of the second region 105B as in the semiconductor device 151, effects similar to those of the semiconductor device 101 shown in FIG. 15 can be attained.

Figure 21:
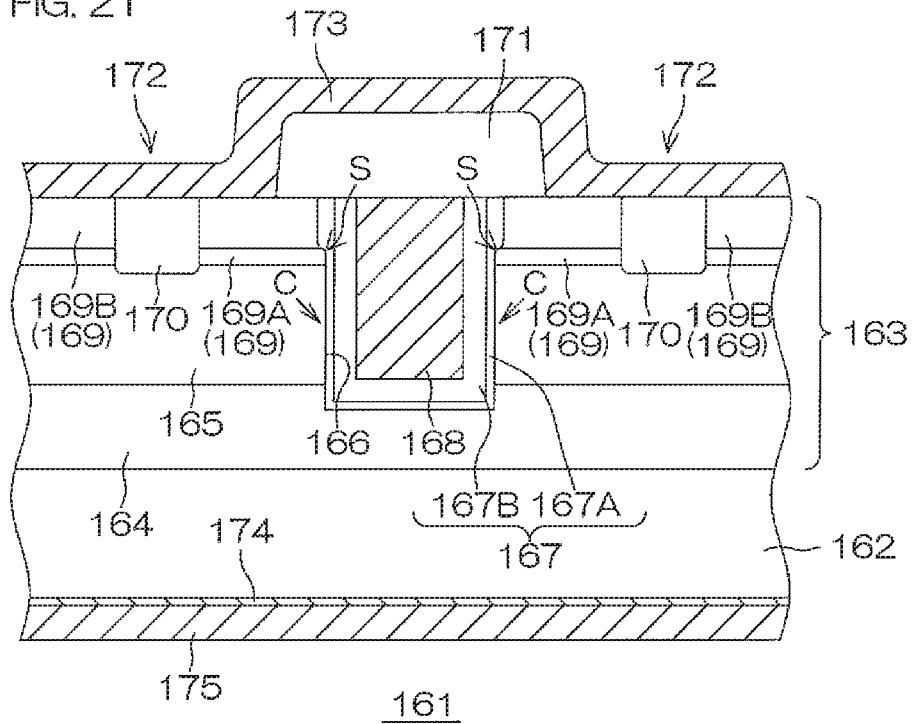
FIG. 21 is a schematic diagram of a semiconductor device according to another modification.

FIG. 21 is a schematic sectional view of a semiconductor device according to another modification. Referring to FIG. 21, only portions consisting of conductors are hatched, while hatching on the remaining portions is omitted.

While the semiconductor device 101 shown in FIG. 15 and the semiconductor device 151 shown in FIG. 20 have planar gate MIS structures, a semiconductor device 161 shown in FIG. 21 has a trench gate MIS structure.

The semiconductor device 161 includes a semiconductor substrate 162. The semiconductor substrate 162 is made of SiC (N-type SiC) doped with an N-type impurity. A semiconductor layer 163 is formed on the semiconductor substrate 162 by epitaxy. In other words, the semiconductor layer 163 is an epitaxial layer made of N-type SiC.

A base layer portion of the semiconductor layer 163 maintains the state after the epitaxy, and forms an N⁻-type drain region 164. A surface layer portion of the semiconductor layer 163 is doped with a P-type impurity, to be converted to a P-type well region 165.

In the semiconductor layer 163, a gate trench 166 is formed to be dug down from the surface thereof. The gate trench 166 is provided in the form of a lattice in plan view, similarly to the gate electrode 108 shown in FIG. 14, for example. The gate trench 166 passes through the well region 165, and the deepest portion thereof reaches the drain region 164.

A gate insulating film 167 is formed on the inner surface of the gate trench 166. The gate insulating film 167 has an AlON/SiO$_2$ multilayer structure including a relatively thin SiO$_2$ film 167A made of SiO$_2$ (silicon oxide) containing N (nitrogen) and an AlON film 167B made of AlON (aluminum oxynitride). The SiO$_2$ film 167A is in contact with the inner surface of the gate trench 166, and the AlON film 167B is formed on the SiO$_2$ film 167A.

The inner side of the gate insulating film 167 is filled up with polysilicon doped with an N-type impurity or a P-type impurity, whereby a gate electrode 168 made of the doped polysilicon is embedded in the gate trench 166. Alternatively, the gate electrode 168 may be made of a metallic material containing Al (aluminum).

An N-type source region 169 is formed on a surface layer portion of the well region 165. The depth of the source region 169 (the total depth of a first region 169A and a second region 169B described later) is 0.5 to 2 μm, for example.

In the source region 169, the N-type impurity concentration in the first region 169A of a prescribed depth (0.2 μm, for example) on the bottom portion thereof is lower by one to three digits than the N-type impurity concentration in the remaining second region (region on the first region 169A) 169B. In other words, the source region 169 has the N⁺-type second region 169B whose N-type impurity concentration is relatively high and the N⁻-type first region 169A, formed under the second region 169B, whose N-type impurity concentration is relatively low. The N-type impurity concentration in the first region 169A is $5 \times 10^{17}$ to $5 \times 10^{19}$ cm⁻³, for example, and the N-type impurity concentration in the second region 169B is $5 \times 10^{19}$ to $5 \times 10^{20}$ cm⁻³, for example.

A step S where the side surface of the second region 169B more separates from the gate electrode 168 than the side surface of the first region 169A is formed between the side surface of the first region 169A and the side surface of the second region 169B, due to the difference between the N-type impurity concentrations in the first region 169A and the second region 169B. The magnitude of the step S is 0.1 μm, for example. No large step is formed between the side surface of the first region 169A and the side surface of the well region 165 (channel region C), but the side surfaces are generally flush with each other. The gate insulating film 167 has a relatively large thickness on the side surface of the second region 169B, due to the difference between the N-type impurity concentrations in the first region 169A and the second region 169B.

On the surface layer portion of the well region 165, a P⁺-type contact region 170 is formed to pass through the source region 169 in the thickness direction on a position at an interval from the gate trench 166 in each region surrounded by the gate trench 166.

An interlayer dielectric film 171 is stacked on the semiconductor layer 163. The interlayer dielectric film 171 is made of silicon oxide, for example.

In the interlayer dielectric film 171, a contact hole 172 is penetratingly formed on a position opposed to each contact region 170. The whole area of the contact region 170 and a portion of the source region 169 around the contact region 170 face the inner portion of each contact hole 172.

A source metal 173 is formed on the interlayer dielectric film 171. The source metal 173 enters each contact hole 172, and is connected to the source region 169 and the contact region 170. The source metal 173 is made of a metallic material containing Al as a main component, for example.

On the back surface of the semiconductor substrate 162, an ohmic metal 174 made of nickel (Ni) or the like and a drain metal 175 made of a metallic material containing aluminum as a main component are formed on the whole surface thereof in this order from the side of the semiconductor substrate 162.

The potential (gate voltage) of the gate electrode 168 is controlled in a state where the source metal 173 is grounded and proper positive voltage is applied to the drain metal 175, whereby a channel is formed in the channel region C of the well region 165 in the vicinity of the interface between the same and the gate insulating film 167, and current flows between the source metal 173 and the drain metal 175.

Figure 22:
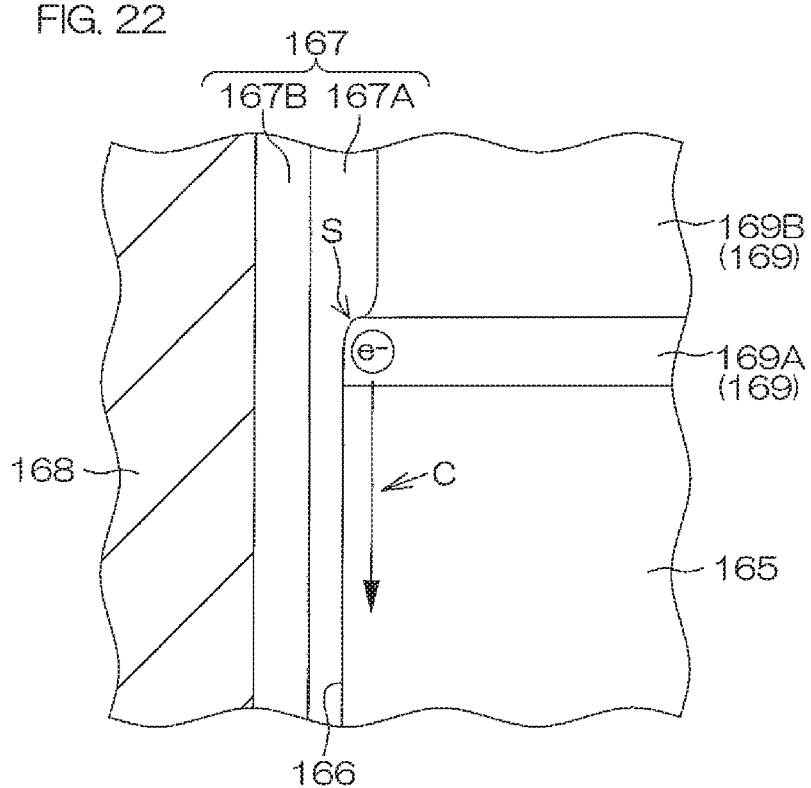
FIG. 22 is a schematic enlarged sectional view in the vicinity of a source region and a channel region shown in FIG. 21.

FIG. 22 is a schematic enlarged sectional view in the vicinity of the first region of the source region and the channel region shown in FIG. 21.

The N-type impurity concentration in the first region 169A of the source region 169 adjacent to the channel region C is lowered in the semiconductor device 161, whereby no large step is formed between the side surface of the first region 169A and the side surface of the channel region C (the well region 165).

Therefore, electrons (e⁻) flowing between the source metal 173 and the drain metal 175 move from the source region 169 to the channel region C along the side surface of the first region 169A (the inner surface of the gate trench 166), and move in the channel region C along the side surface thereof. In other words, the path of the electrons in the channel C becomes a linear path along the side surface of the channel region C. Also according to the structure of the semiconductor device 161, therefore, functions/effects similar to those of the semiconductor devices 101 and 151 can be exhibited, and channel resistance of the semiconductor device 161 is lower than the channel resistance of the conventional semiconductor device in which the movement path of the electrons in the channel region becomes a bent path.

While such structures that the semiconductor layers 103 and 163 are stacked on the semiconductor substrates 102 and 162 have been adopted, the semiconductor layers 103 and 163 may be omitted, and the well regions 104 and 165 and the source regions 105 and 169 etc. may be formed on the surface layer portions of the semiconductor substrates 102 and 162.

Further, the conductivity type of each portion may be inverted. In other words, while the case where the first conductivity type is the N type and the second conductivity type is the P type has been adopted, the first conductivity type may be the P type, and the second conductivity type may be the N type.

(Characteristic Evaluation)

A sample 101 (AlON/SiO$_2$) having a MISFET of the structure shown in FIG. 15 was prepared by the manufacturing method shown in FIGS. 18 to 19. In the sample 101, the thickness of an SiO$_2$ film 107A is 10 nm, and the thickness of an AlON film 107B is 65 nm.

Further, a sample 102 (SiO$_2$) having a MOSFET of a structure obtained by stacking a gate electrode on a semiconductor substrate 102 through a gate insulating film consisting of a single layer of SiO$_2$ was prepared. In the sample 102, the thickness of the gate insulating film is 40 nm.

1. Drain Current

Figure 23:
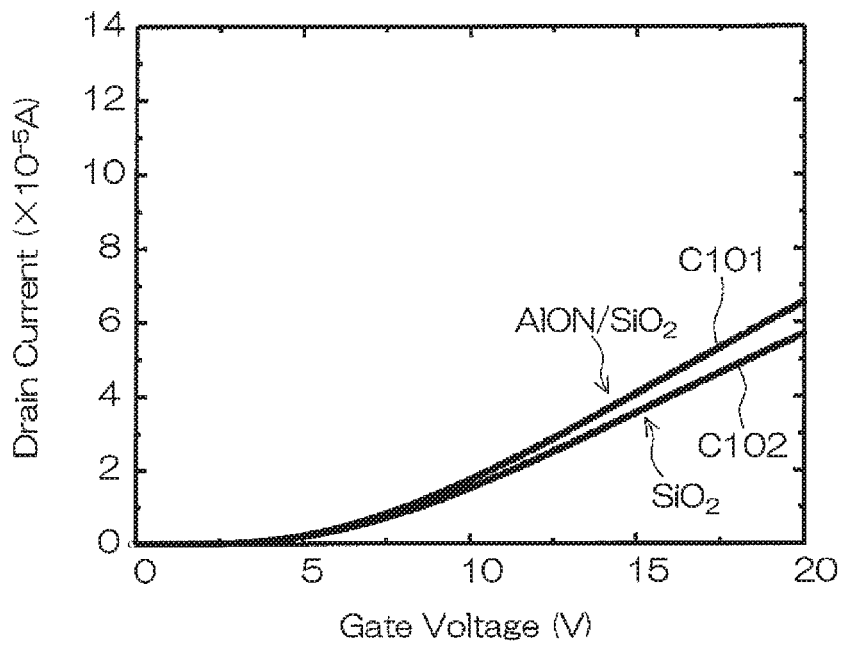
FIG. 23 is a graph showing the relations between gate voltage (Gate Voltage) and drain current (Drain Current).

FIG. 23 is a graph showing the relations between gate voltage (Gate Voltage) and drain current (Drain Current) in the samples 101 and 102.

As to the respective ones of the samples 101 and 102, the magnitudes of the drain current at times of varying the gate voltage were examined.

FIG. 23 assigns C101 to a curve showing the relation between the gate voltage and the drain current in the sample 101, and assigns C102 to a curve showing the relation between the gate voltage and the drain current in the sample 102.

2. Field Effect Mobility

Figure 24:
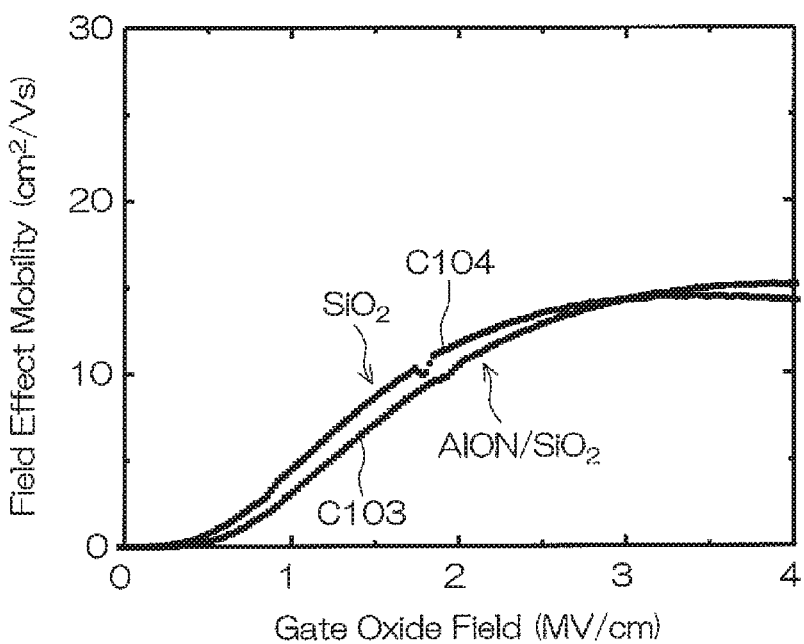
FIG. 24 is a graph showing the relations between the strength of electric fields (Gate Oxide Field) formed in gate insulating films in samples 101 and 102 and field effect mobility (Field Effect Mobility).

FIG. 24 is a graph showing the relations between the strength of electric fields (Gate Oxide Field) formed in gate insulating films and field effect mobility (Field Effect Mobility).

As to the respective ones of the samples 101 and 102, the magnitudes of the field effect mobility at times of varying the electric fields formed in the gate insulating films were examined.

FIG. 24 assigns C103 to a curve showing the relation between the strength of the electric field formed in a gate insulating film 107 and the field effect mobility in the sample 101, and assigns C104 to a curve showing the relation between the strength of the electric field formed in the gate insulating film and the field effect mobility in the sample 102.

From the curves C101 to C104 shown in FIGS. 23 and 24, it is understood that transistor operating characteristics of the samples 101 and 102 are generally identical to each other. Also in the MISFET employing the gate insulating film 107 consisting of the SiO$_2$ film 107A and the AlON film 107B, the field effect mobility is generally identical to that of the MOSFET employing the gate insulating film consisting of the single layer of SiO$_2$, and hence no increase of interface state density is conceivably caused by stacking the AlON film 107B on the SiO$_2$ film 107A.

In the evaluation (see FIG. 13) of the interface state density previously executed by the inventors of this application, therefore, the interface state density of the SiC-MIS structure employing the AlON/SiO$_2$ multilayer gate insulating film more increased than the interface state density of the SiC-MOS structure employing the SiO$_2$ single-layer gate insulating film, is conceivable as a result of reflecting defects (defects on the AlON/SiO$_2$ interface, for example) not influencing the transistor operating characteristics. More specifically, this evaluation is evaluation performed by calculating each interface state density of the SiC-MIS structure employing the AlON/SiO$_2$ multilayer gate insulating film and the SiC-MOS structure employing the SiO$_2$ single-layer gate insulating film by a High-Low method and comparing the same.

3. Temperature Characteristics

Figure 25:
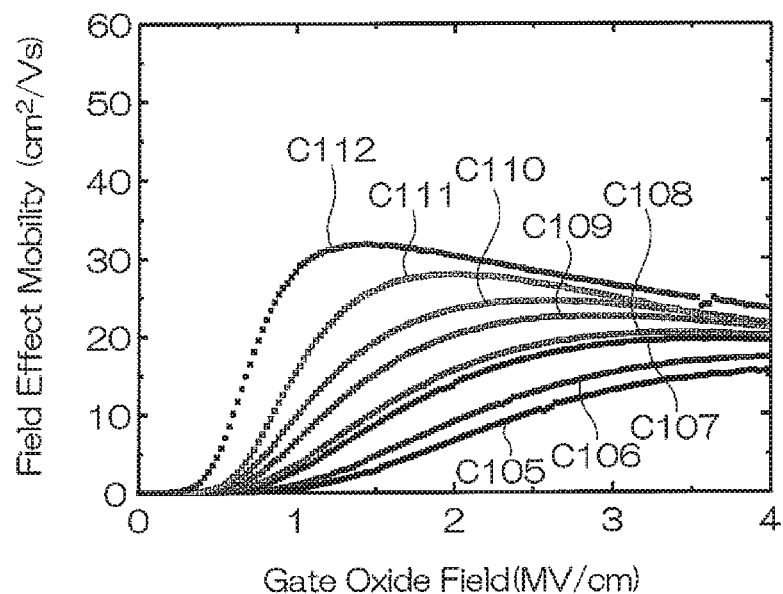
FIG. 25 is a graph showing temperature dependency of the field effect mobility of the sample 101.
Figure 26:
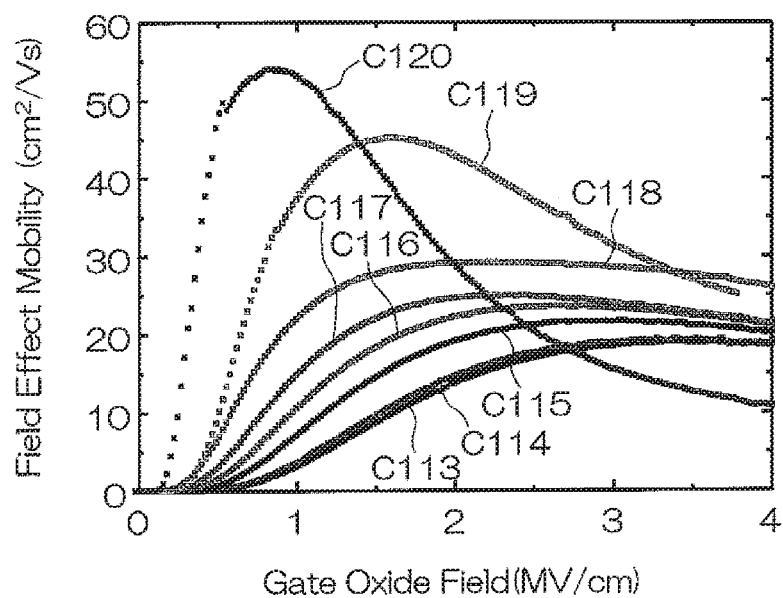
FIG. 26 is a graph showing temperature dependency of the field effect mobility of the sample 102.
Figure 27:
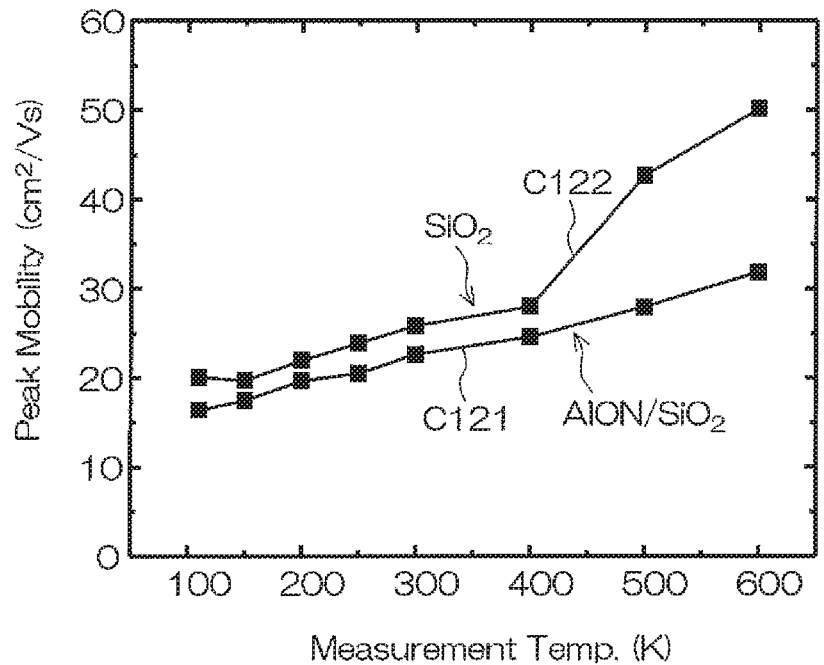
FIG. 27 is a graph showing the relation between each temperature and a maximum value of the field effect mobility at each temperature at the time of examining the temperature dependency shown in FIGS. 25 and 26.

FIG. 25 is a graph showing temperature dependency of the field effect mobility of the sample 101. FIG. 26 is a graph showing temperature dependency of the field effect mobility of the sample 102. FIG. 27 is a graph showing the relation between each temperature and a maximum value of the field effect mobility at each temperature at the time of examining the temperature dependency shown in FIGS. 25 and 26. In the graphs shown in FIGS. 25 and 26, the axes of abscissas show the strength of the electric fields formed in the gate insulating films, and the axes of ordinates show the field effect mobility.

As to the respective ones of the samples 101 and 102, temperatures of the semiconductor substrates (SiC substrates) were set to 110 K, 150 K, 200 K, 250 K, 300 K, 400 K, 500 K and 600 K, and the relations between the strength of the electric fields formed in the gate insulating films and the field effect mobility at each temperature were examined. FIG. 25 shows the relations at the times when the temperatures of the SiC substrate were 110 K, 150 K, 200 k, 250 K, 300 K, 400 K, 500 K and 600 K with curves C105, C106, C107, C108, C109, C110, C111 and C112 respectively. FIG. 26 shows the relations at the times when the temperatures of the SiC substrate were 110 K, 150 K, 200 k, 250 K, 300 K, 400 K, 500 K and 600 K with curves C113, C114, C115, C116, C117, C118, C119 and C120 respectively. FIG. 27 shows the relation between the strength of the electric field formed in the gate insulating film 107 and the field effect mobility at each temperature in the sample 101 with a curve C121, and shows the relation between the strength of the electric field formed in the gate insulating film and the field effect mobility at each temperature in the sample 102 with a curve C122.

Comparing the curves C121 and C122 shown in FIG. 27 with each other, it is understood that the temperature dependency of the field effect mobility of the sample 101 is smaller than the temperature dependency of the field effect mobility of the sample 102, although the maximum value of the field effect mobility of the sample 101 at each temperature is slightly lower than the maximum value of the field effect mobility of the sample 102 at each temperature.

Comparing the curve C112 shown in FIG. 25 and the curve C120 shown in FIG. 26 with each other, it is understood that the field effect mobility of the sample 101 is greater than the field effect mobility of the sample 102 under the condition that high electric fields (electric fields of not less than 2 MV/cm) are formed in the gate insulating films at high temperature. Therefore, the sample 101, i.e., the semiconductor device 101 having the MISFET of the structure shown in FIG. 15 is suitable as a power device operating under the condition that an electric field of 3 to 4 MV/cm is formed in the gate insulating film 107.

Further, a sample 103 having a MISFET of the structure shown in FIG. 15 was prepared by a method omitting the nitrogen plasma application step (S12) and the FGA step (S13) from the manufacturing steps shown in FIG. 19. In the sample 103, the thickness of an SiO$_2$ film 107A is 10 nm, and the thickness of an AlON film 107B is 65 nm.

4. Drain Current

Figure 28:
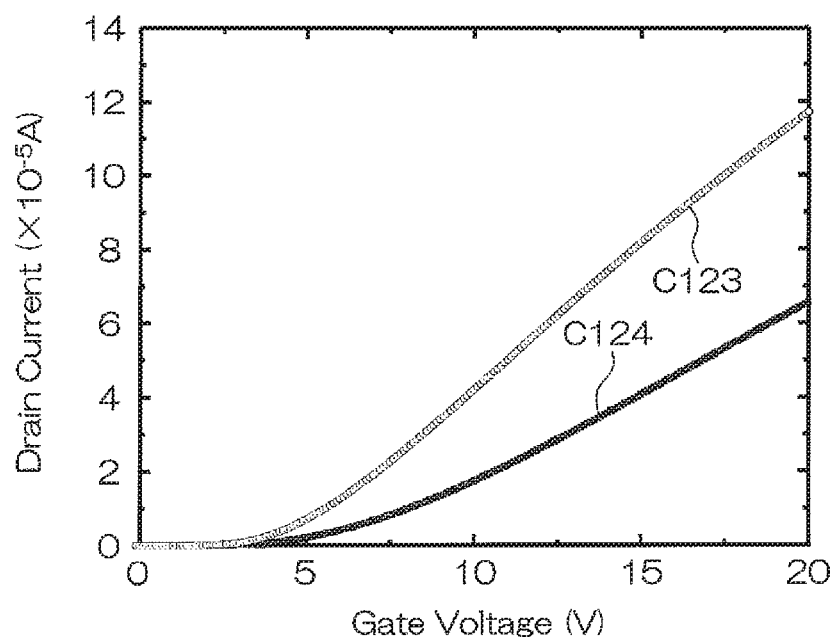
FIG. 28 is a graph showing the relations between gate voltage (Gate Voltage) and drain current (Drain Current) in samples 101 and 103.

FIG. 28 is a graph showing the relations between gate voltage (Gate Voltage) and drain current (Drain Current) in the samples 101 and 103.

As to the respective ones of the samples 101 and 103, the magnitudes of the drain current at times of varying the gate voltage were examined.

FIG. 28 shows the relation between the gate voltage and the drain current in the sample 101 with a curve C123, and shows the relation between the gate voltage and the drain current in the sample 103 with a curve C124.

Comparing the curves C123 and C124 shown in FIG. 28 with each other, it is understood that the drain current obtained in the sample 101 is greater than the drain current obtained in the sample 103. Therefore, the nitrogen plasma application step (S12) and the FGA step (S13) are conceivably effective for increase of the drain current.

5. Field Effect Mobility

Figure 29:
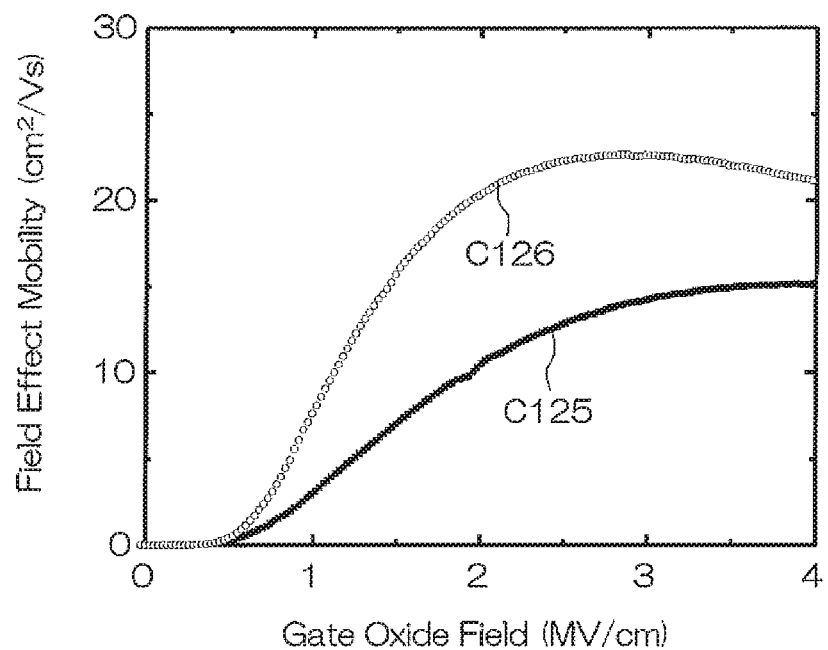
FIG. 29 is a graph showing the relations between the strength of electric fields (Gate Oxide Field) formed in gate insulating films and field effect mobility (Field Effect Mobility).

FIG. 29 is a graph showing the relations between the strength of electric fields (Gate Oxide Field) formed in gate insulating films and field effect mobility (Field Effect Mobility).

As to the respective ones of the samples 101 and 103, the magnitudes of the field effect mobility at times of varying the electric fields formed in gate insulating films 107 were examined.

FIG. 29 shows the relation between the strength of the electric field formed in the gate insulating film 107 and the field effect mobility in the sample 101 with a curve C126, and shows the relation between the strength of the electric field formed in the gate insulating film 107 and the field effect mobility in the sample 103 with a curve C125.

Comparing the curves C125 and C126 shown in FIG. 29 with each other, it is understood that the field effect mobility of the sample 101 is greater than the field effect mobility of the sample 103. Therefore, the nitrogen plasma application step (S12) and the FGA step (S13) are conceivably effective as methods of improving the state of the interface between the semiconductor substrate 102 and the SiO$_2$ film 107A.

<Third Embodiment>

As hereinabove described, high-density interface states (interface defects) are formed on the interface (SiO$_2$/SiC interface) between the SiC substrate and the gate insulating film in the MOSFET (SiC-MOSFET) employing SiC. Therefore, the SiC-MOSFET has low channel mobility.

The density of the interface states (interface state density) on the SiO$_2$/SiC interface can be lowered by thinning the gate insulating film made of SiO$_2$. When the gate insulating film is thinned, however, leakage current increases as a result.

Therefore, a third embodiment provides a semiconductor device capable of attaining reduction of both of interface state density on an interface between a silicon carbide layer and a gate insulating film and leakage current.

Figure 32:
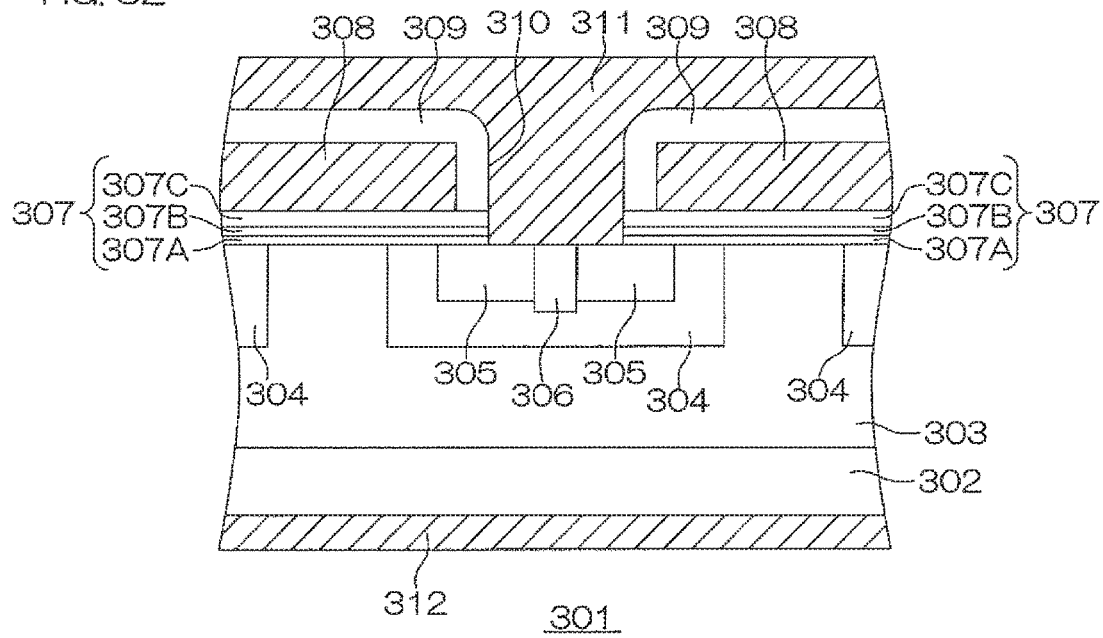
FIG. 32 is a schematic sectional view of a semiconductor device according to a third embodiment of the present invention.

FIG. 32 is a schematic sectional view of a semiconductor device according to the third embodiment of the present invention.

A semiconductor device 301 includes an SiC substrate 302 made of SiC (N-type SiC) doped with an N-type impurity. An SiC layer 303 made of N-type SiC is formed on the SiC substrate 302 by epitaxy.

A plurality of P-type well regions 304 are formed on a surface layer portion of the SiC layer 303. The plurality of well regions 304 are quadrangular (generally square) in plan view, and arrayed in the form of a matrix.

On a surface layer portion of each well region 304, a source region 305 is formed at an interval from a peripheral edge of the well region 304. The source region 305 is doped with an N-type impurity in a higher concentration than in the SiC layer 303, to exhibit an N$^+$ conductivity type.

A contact region 306 is formed at the center of each source region 305. The contact region 306 is formed to pass through the source region 305 in the depth direction, and the deepest portion reaches the well region 304 present under the source region 305. The contact region 306 is doped with a P-type impurity in a higher concentration than in the well region 304, to exhibit a P$^+$ conductivity type.

A gate insulating film 307 is formed on the SiC layer 303. The gate insulating film 307 is opposed to the SiC layer 303 between the well regions 304, a region (channel region) between the peripheral edge of each well region 304 and a peripheral edge of the source region 305 inside the same and part of the source region 305. The gate insulating film 307 is provided in the form of a lattice in plan view as a whole.

The gate insulating film 307 has an AlON/SiO$_2$/SiO$_x$N$_y$ multilayer structure including an SiON film 307A made of SiO$_x$N$_y$ (silicon oxynitride), an SiO$_2$ film 307B made of SiO$_2$ (silicon oxide) and formed on the SiON film 307A, and an AlON film 307C made of AlON (aluminum oxynitride) which is a high dielectric constant (High-k) insulating material and formed on the SiO$_2$ film 307B.

The thickness of the SiON film 307A is 1 to 5 nm. The thickness of the SiO$_2$ film 307B is 1 to 5 nm. The total thickness of the SiON film 307A and the SiO$_2$ film 307B is 2 to 10 nm. The thickness of the AlON film 307C is 10 to 200 nm. Each range includes the lower limit and the upper limit thereof.

A gate electrode 308 is formed on the gate insulating film 307. Thus, the semiconductor device 301 has a planar gate MIS structure. The gate electrode 308 is made of a metallic material containing Al (aluminum) as a main component.

An interlayer dielectric film 309 is formed on the SiC layer 303. The upper surface of the SiC layer 303 is covered with the interlayer dielectric film 309, along with the gate insulating film 307 and the gate electrode 308. The interlayer dielectric film 309 is made of SiO$_2$, for example.

In the interlayer dielectric film 309, a contact hole 310 is formed on a position opposed to each contact region 306. The whole area of the contact region 306 and a portion of the source region 305 around the contact region 306 face the inner portion of each contact hole 310.

A source metal 311 is formed on the interlayer dielectric film 309. The source metal 311 enters each contact hole 310 formed in the interlayer dielectric film 309, and is connected to the source region 305 and the contact region 306. The source metal 311 is made of a metallic material containing Al as a main component, for example.

On the back surface of the SiC substrate 302, a drain metal 312 made of a metallic material containing Al as a main component is formed on the whole surface thereof through an ohmic metal (not shown) made of Ni (nickel) or the like.

The potential (gate voltage) of the gate electrode 308 is controlled in a state where the source metal 311 is grounded and proper positive voltage is applied to the drain metal 312, whereby a channel is formed in the channel region of the well region 304 in the vicinity of the interface between the same and the gate insulating film 307, and current flows between the source metal 311 and the drain metal 312.

Figure 33:
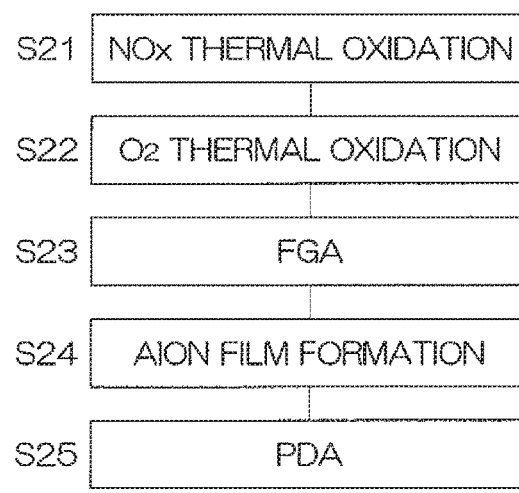
FIG. 33 is a manufacturing step diagram for a gate insulating film.

FIG. 33 is a manufacturing step diagram for the gate insulating film.

In order to manufacture the semiconductor device 301, the SiC layer 303 is formed on the SiC substrate 302 by epitaxy. Then, the well region 304, the source region 305 and the contact region 306 are formed on the SiC layer 303 by a well-known technique including ion implantation or the like. Thereafter an $NO_x$ thermal oxidation step (S21), an $O_2$ thermal oxidation step (S22), an FGA (Forming Gas Annealing) step (S23), an AlON film formation step (S24) and a PDA (Post Deposition Annealing) step (S25) are carried out in this order, in order to form the gate insulating film 307.

In the $NO_x$ thermal oxidation step (S21), an SiON film made of $SiO_xN_y$ is formed on the SiC layer 303 by thermal oxidation employing gas containing $N_2O$ (nitrogen oxide).

In the $O_2$ thermal oxidation step (S22), an $SiO_2$ film made of $SiO_2$ is formed on the SiON film by thermal oxidation employing dry gas of $O_2$.

In the FGA step (S23), the $SiO_2$ film is annealed in forming gas containing 3% of $H_2$ (hydrogen gas) and 97% of $N_2$ (nitrogen gas). For example, annealing at a temperature of 1000° C. is performed for 30 minutes, and annealing at a temperature of 450° C. is thereafter performed for 30 minutes. Thus, H atoms are excellently introduced into the $SiO_2$ film, and the number of dangling bonds of C atoms and Si atoms present on the interface between the SiC layer 303 and the SiON film decreases.

In the AlON film formation step (S24), an AlON film is formed on the $SiO_2$ film by reactive sputtering employing mixed gas of $N_2$ and $O_2$ (oxygen gas) and an Al target.

In the PDA step (S25), the AlON film is annealed in $N_2$. The annealing is performed at a temperature of 900° C. for 10 minutes, for example. Thus, crystallinity of the AlON film rises, and quality of the AlON film improves.

Thereafter the gate electrode 308 is formed on the AlON film. The gate electrode 308 is formed by selectively vapor-depositing the material (Al) for the gate electrode on the surface of the AlON film with a mask, for example. Then, exposed portions (portions not opposed to the gate electrode 308) of the AlON film, the $SiO_2$ film and the SiON film are removed in this order by photolithography and etching, and the AlON film, the $SiO_2$ film and the SiON film are worked into the AlON film 307C, the $SiO_2$ film 307B and the SiON film 307A respectively. When the interlayer dielectric film 309, the contact hole 310, the source metal 311 and the drain metal 312 are thereafter formed by well-known methods, the semiconductor device 301 shown in FIG. 32 is obtained.

As hereinabove described, the gate insulating film 307 has the structure obtained by stacking the SiON film 307A, the $SiO_2$ film 307B and the AlON film 307C from the side of the SiC layer 303.

The SiON film 307A is interposed between the SiC layer 303 and the $SiO_2$ film 307B, whereby reduction of interface state density Dit on the interface between the SiC layer 303 (SiC) and the gate insulating film 307 can be attained as compared with such a structure that a gate insulating film consists of only a silicon oxide film. Further, improvement of channel mobility can be attained due to the reduction of the interface state density Dit.

In addition, reduction of leakage current resulting from increase in the thickness of the gate insulating film 307 can be attained while suppressing increase in the interface state density on the interface between the SiC layer 303 and the gate insulating film 307 by reducing the total thickness of the SiON film 307A and the $SiO_2$ film 307B and increasing the thickness of the AlON film 307C.

Therefore, both of improvement of the channel mobility resulting from the reduction of the interface state density Dit and improvement of reliability of the gate insulating film 307 resulting from the reduction of the leakage current can be attained.

The gate electrode 308 is made of the metallic material containing Al. Thus, improvement in operating speed of the MISFET (field effect transistor of a planar gate MIS structure) constituted of the SiC layer 303, the gate insulating film 307 and the gate electrode 308 etc. and reduction of power consumption can be attained as compared with such a structure that the gate electrode 308 is made of polycrystalline silicon.

(Interface State Density)

A sample 201 having the SiC-MIS structure (the structure including the AlON/$SiO_2$/$SiO_xN_y$ multilayer gate insulating film on SiC) shown in FIG. 32 was prepared. In the sample 201, the thickness of an SiON film 307A is 5 nm, the thickness of an $SiO_2$ film 307B is 5 nm and the thickness of an AlON film 307C is 80 nm.

Further, a sample 202 having an SiC-MIS structure employing an AlON/$SiO_2$ multilayer gate insulating film (gate insulating film of a structure obtained by stacking an $SiO_2$ film made of $SiO_2$ and an AlON film made of AlON on SiC in this order) was prepared. In the sample 202, the thickness of the $SiO_2$ film is 10 nm, and the thickness of the AlON film is 80 nm.

Figure 34:
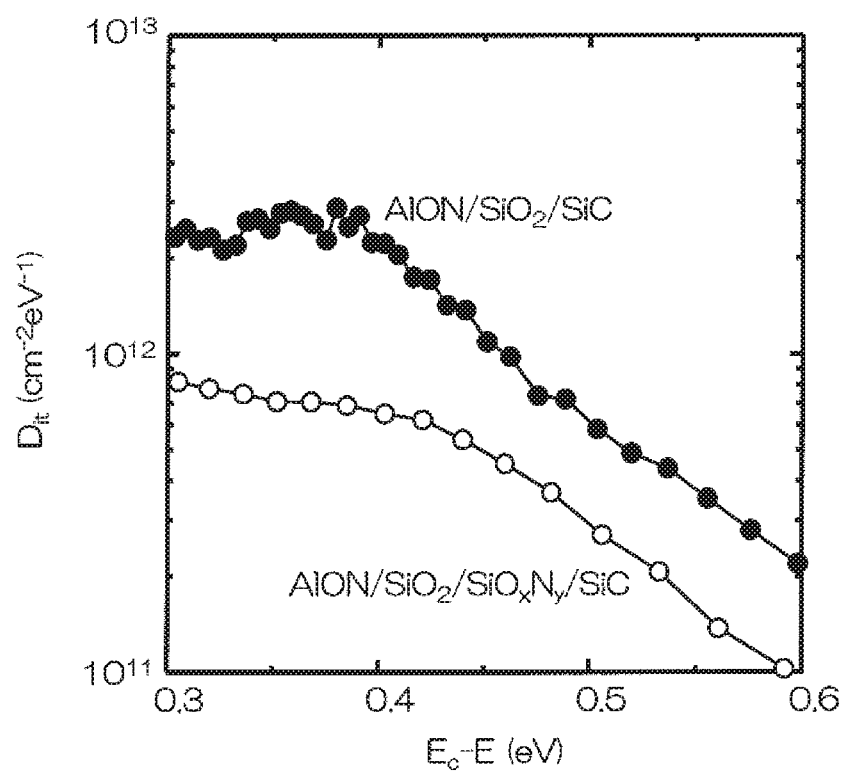
FIG. 34 is a graph showing interface state density of an SiC-MIS structure employing an $AlON/SiO_2/SiO_xN_y$ multi-layer gate insulating film and an SiC-MOS structure employing an $AlON/SiO_2$ multi-layer gate insulating film.

As to the respective ones of the samples 201 and 202, high-frequency CV characteristics (at a measuring frequency of 100 kHz, for example) and low-frequency CV characteristics (quasi-static CV characteristics) were measured, and the differences between high-frequency measured values and low-frequency measured values were calculated as the interface state density Dit by a High-Low method. FIG. 34 shows the results. Referring to FIG. 34, the axis of abscissas shows energy (Ec-E) from valence band edges of the gate insulating films, and the axis of ordinates shows the interface state density Dit.

From the results shown in FIG. 34, it is understood that the interface state density Dit in the sample 201 is lower than the interface state density Dit of the sample 202.

Figure 35:
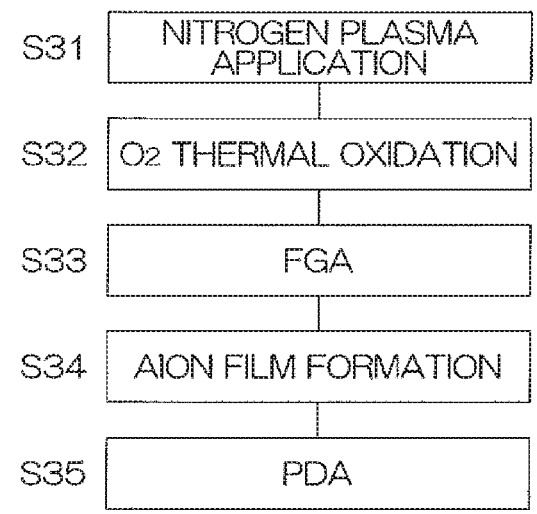
FIG. 35 is another manufacturing step diagram for the gate insulating film.

FIG. 35 is another manufacturing step diagram for the gate insulating film.

The gate insulating film 307 shown in FIG. 32 can be formed by a technique including the manufacturing steps shown in FIG. 35, in place of the technique including the manufacturing steps shown in FIG. 33. In the manufacturing steps shown in FIG. 35, a nitrogen plasma application step (S31), an $O_2$ thermal oxidation step (S32), an FGA step (S33), an AlON film formation step (S34) and a PDA step (S35) are carried out in this order.

In the nitrogen plasma application step (S31), nitrogen plasma is applied to the SiC layer 303. The nitrogen plasma is continuously applied over 30 minutes in a state where the SiC layer 303 is heated to 500° C., for example. Atmospheric pressure and RF output at this time are 9.5 Torr and 50 W respectively, for example. Thus, an SiON film is formed on the SiC layer 303.

In the O$_2$ thermal oxidation step (S32), an SiO$_2$ film made of SiO$_2$ is formed on the SiON film by thermal oxidation employing dry gas of O$_2$.

In the FGA step (S33), the AlON film formation step (S34) and the PDA step (S35), treatments similar to those in the FGA step (S23), the AlON film formation step (S24) and the PDA step (S25) shown in FIG. 33 are performed respectively.

Figure 36:
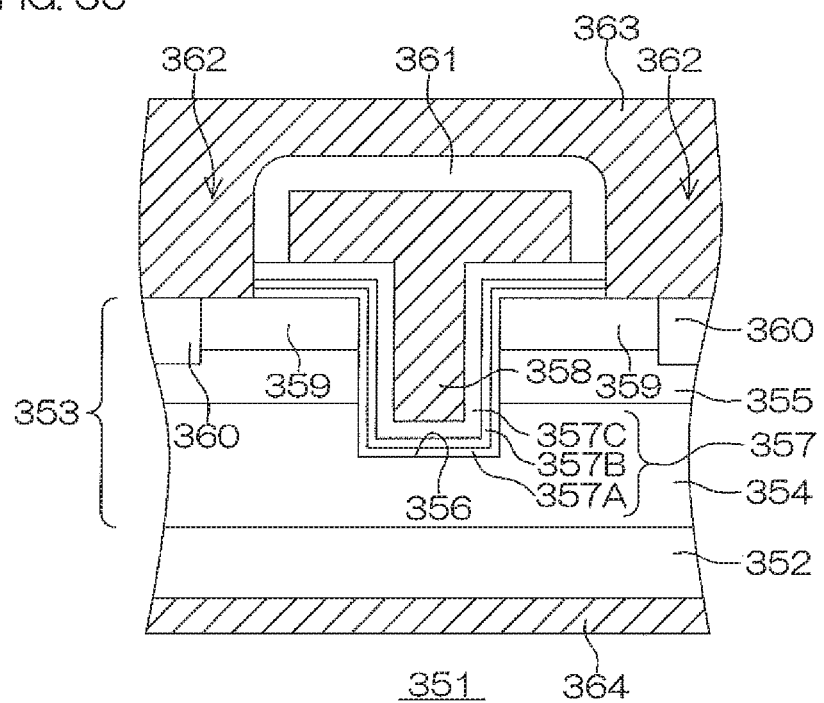
FIG. 36 is a schematic sectional view of a semiconductor device according to a modification.

FIG. 36 is a schematic sectional view of a semiconductor device according to a modification.

While the semiconductor device 301 shown in FIG. 32 has the planar gate MIS structure, a semiconductor device 351 shown in FIG. 36 has a trench gate MIS structure.

The semiconductor device 351 includes an SiC substrate 352 made of N-type SiC. An SiC layer 353 made of N-type SiC is formed on the SiC substrate 352 by epitaxy.

A base layer portion of the SiC layer 353 maintains the state after the epitaxy, and forms an N$^-$-type drain region 354. A surface layer portion of the SiC layer 353 is doped with a P-type impurity, to be converted to a P-type well region 355.

In the SiC layer 353, a gate trench 356 is formed to be dug down from the surface thereof. The gate trench 356 is provided in the form of a lattice in plan view, for example. The gate trench 356 passes through the well region 355, and the deepest portion thereof reaches the drain region 354.

A gate insulating film 357 is formed on the inner surface of the gate trench 356. A peripheral edge portion of the gate insulating film 357 is in contact with the upper surface of the SiC layer 353 on the outside of the gate trench 356. The gate insulating film 357 has an AlON/SiO$_2$/SiO$_x$N$_y$ multilayer structure including an SiON film 357A made of SiO$_x$N$_y$, an SiO$_2$ film 357B made of SiO$_2$ and formed on the SiON film 357A, and an AlON film 357C made of AlON which is a high dielectric constant insulating material and formed on the SiO$_2$ film 357B.

The thickness of the SiON film 357A is 1 to 5 nm. The thickness of the SiO$_2$ film 357B is 1 to 5 nm. The total thickness of the SiON film 357A and the SiO$_2$ film 357B is 2 to 10 nm. The thickness of the AlON film 357C is 10 to 200 nm. Each range includes the lower limit and the upper limit thereof.

A gate electrode 358 made of a metallic material containing Al as a main component is formed on the gate insulating film 357.

An N-type source region 359 is formed on a surface layer portion of the well region 355.

On the surface layer portion of the well region 355, further, a contact region 360 is formed to pass through the source region 359 in the thickness direction on a position at an interval from the gate trench 356 in each region surrounded by the gate trench 356. The contact region 360 is doped with a P-type impurity in a higher concentration than in the well region 355, to exhibit a P$^+$ conductivity type.

An interlayer dielectric film 361 is stacked on the SiC layer 353. The interlayer dielectric film 361 is made of silicon oxide, for example.

In the interlayer dielectric film 361, a contact hole 362 is penetratingly formed on a position opposed to each contact region 360. The whole area of the contact region 360 and a portion of the source region 359 around the contact region 360 face the inner portion of each contact hole 362.

A source metal 363 is formed on the interlayer dielectric film 361. The source metal 363 enters each contact hole 362, and is connected to the source region 359 and the contact region 360. The source metal 363 is made of a metallic material containing Al as a main component, for example.

On the back surface of the SiC substrate 352, a drain metal 364 made of a metallic material containing Al as a main component is formed on the whole surface thereof through an ohmic metal (not shown) made of Ni or the like.

The potential (gate voltage) of the gate electrode 358 is controlled in a state where the source metal 363 is grounded and proper positive voltage is applied to the drain metal 364, whereby a channel is formed in a channel region of the well region 355 in the vicinity of the interface between the same and the gate insulating film 357, and current flows between the source metal 363 and the drain metal 364.

Also in the semiconductor device 351, functions/effects similar to those of the semiconductor device 301 shown in FIG. 32 can be attained.

Figure 37:
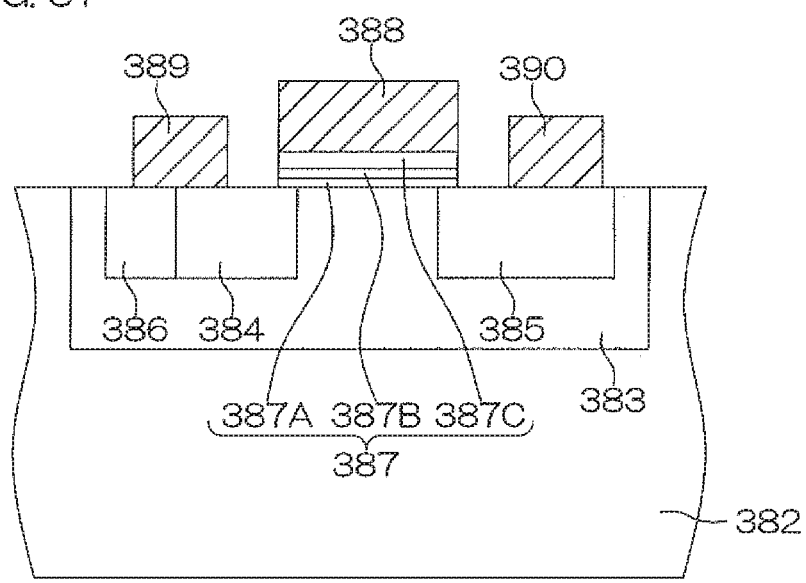
FIG. 37 is a schematic sectional view of a semiconductor device according to another modification.

FIG. 37 is a schematic sectional view of a semiconductor device according to another modification.

While the semiconductor device 301 shown in FIG. 32 and the semiconductor device 351 shown in FIG. 36 include vertical MISFETS, a semiconductor device 381 shown in FIG. 37 includes a lateral MISFET.

The semiconductor device 381 includes an SiC substrate 382 as a silicon carbide layer made of N-type SiC.

A P-type well region 383 is formed on a surface layer portion of the SiC substrate 382.

A source region 384 and a drain region 385 are formed on a surface layer portion of the well region 383. The source region 384 and the drain region 385 are formed at intervals from a peripheral edge portion of the well region 383 respectively, and at an interval from each other. The source region 384 and the drain region 385 are doped with an N-type impurity in higher concentrations than in the SiC substrate 382, to exhibit N$^+$ conductivity types.

A contact region 386 is formed on the surface layer portion of the well region 383. The contact region 386 is formed adjacently to a side of the source region 384 opposite to the drain region 385. The contact region 386 is doped with a P-type impurity in a higher concentration than in the well region 383, to exhibit a P$^+$ conductivity type.

A gate insulating film 387 is formed on a region (channel region) between the source region 384 and the drain region 385. More specifically, the gate insulating film 387 is opposed to the region between the source region 384 and the drain region 385, and extends over a peripheral edge portion of the source region 384 and a peripheral edge portion of the drain region 385. The gate insulating film 387 has an AlON/SiO$_2$/SiO$_x$N$_y$ multilayer structure including an SiON film 387A made of SiO$_x$N$_y$, an SiO$_2$ film 387B made of SiO$_2$ and formed on the SiON film 387A, and an AlON film 387C made of AlON which is a high dielectric constant insulating material and formed on the SiO$_2$ film 387B.

The thickness of the SiON film 387A is 1 to 5 nm. The thickness of the SiO$_2$ film 387B is 1 to 5 nm. The total thickness of the SiON film 387A and the SiO$_2$ film 387B is 2 to 10 nm. The thickness of the AlON film 387C is 10 to 200 nm. Each range includes the lower limit and the upper limit thereof.

A gate electrode 388 having the same shape as the gate insulating film 387 in plan view is formed on the gate insulating film 387. The gate electrode 388 is made of a metallic material containing Al.

A source electrode 389 is formed on the source region 384 and the contact region 386. The source electrode 389 is in contact with the surfaces of the source region 384 and the contact region 386 while extending over the same. The source electrode 389 is made of a metallic material containing Al.

A drain electrode 390 is formed on the drain region 385. The drain electrode 390 is in contact with the surface of the drain region 385. The drain electrode 390 is made of a metallic material containing Al.

Voltage of not less than a threshold is applied to the gate electrode 388 in a state where the source electrode 389 is grounded and positive voltage is applied to the drain electrode 390, whereby a channel is formed in the channel region of the well region 383 in the vicinity of the interface between the same and the gate insulating film, and current flows from the drain electrode 390 toward the source electrode 389.

Also in the semiconductor device 381, functions/effects similar to those of the semiconductor device 301 shown in FIG. 32 can be attained.

While such structures that the SiC layers 303 and 353 are stacked on the SiC substrates 302 and 352 have been adopted, the SiC layers 303 and 353 may be omitted, and the well regions 304 and 355 and the source regions 305 and 359 etc. may be formed on the surface layer portions of the SiC substrates 302 and 352.

Further, the conductivity type of each portion of the semiconductor devices 301, 351 and 381 may be inverted.

The materials for the gate electrodes 308, 358 and 388 are not restricted to the metallic materials containing Al, but may be polysilicon doped with an N-type impurity or a P-type impurity.

While the AlON film 307C, the AlON film 357C and the AlON film 387C have been illustrated as high dielectric constant insulating films, the material for the high dielectric constant insulating films is not restricted to AlON, but may be a high dielectric constant material such as $Al_2O_3$ (aluminum oxide), ZrO (zirconium oxide), HfO (hafnium oxide) or AlN (aluminum nitride).

<Fourth Embodiment>

A fourth embodiment provides a semiconductor device capable of approximating a movement path of carriers in a channel region to a straight line thereby reducing channel resistance.

Figure 38:
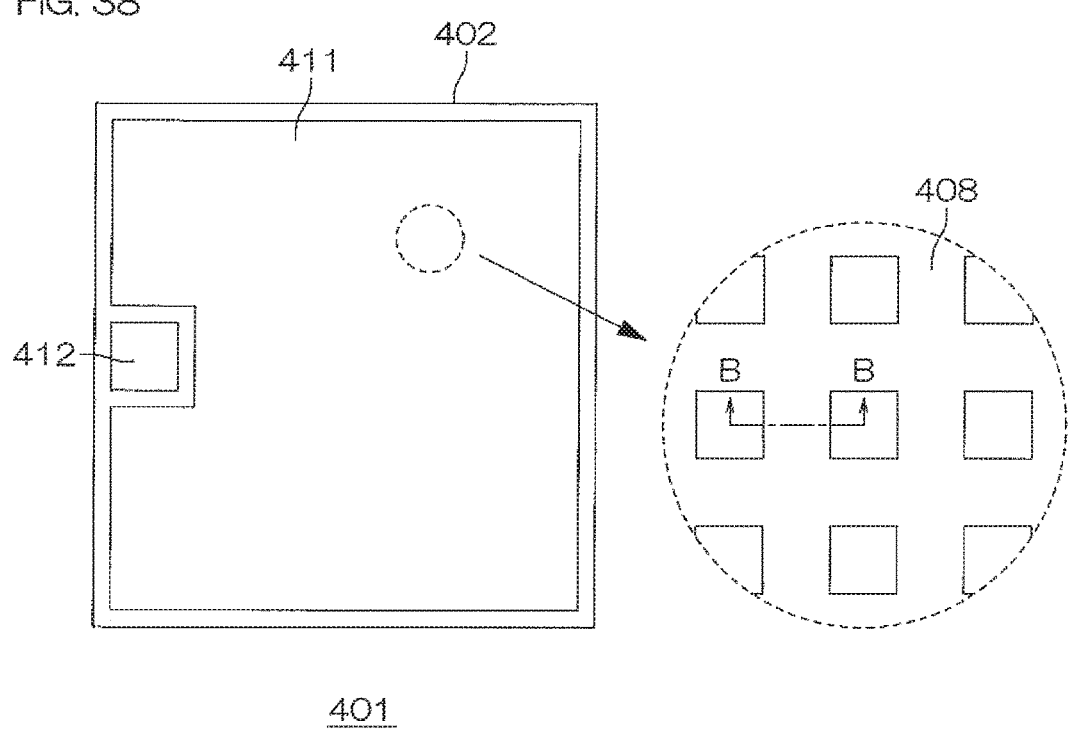
FIG. 38 is a schematic plan view of a semiconductor device according to a fourth embodiment of the present invention.
Figure 39:
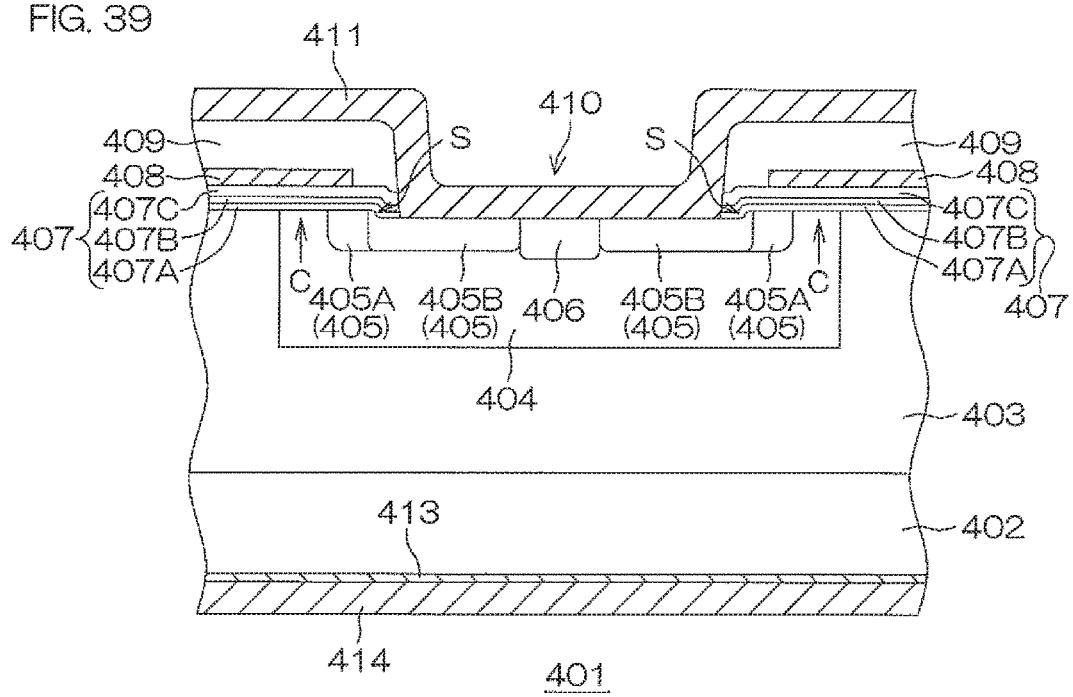
FIG. 39 is a schematic sectional view of the semiconductor device taken along a cutting plane line B-B shown in FIG. 38.

FIG. 38 is a schematic plan view of a semiconductor device according to the fourth embodiment of the present invention. FIG. 39 is a schematic sectional view of the semiconductor device taken along a cutting plane line B-B shown in FIG. 38. Referring to FIG. 39, only portions consisting of conductors are hatched, while hatching on the remaining portions is omitted.

A semiconductor device 401 has a quadrangular (generally square) outer shape in plan view, as shown in FIG. 38.

The semiconductor device 401 includes a semiconductor substrate (SiC substrate) 402, as shown in FIG. 39. The semiconductor substrate 402 is made of SiC (N-type SiC) doped with an N-type impurity. A semiconductor layer (SiC layer) 403 is formed on the semiconductor substrate 402 by epitaxy. In other words, the semiconductor layer 403 is an epitaxial layer made of N-type SiC.

A plurality of P-type well regions 404 are formed on a surface layer portion of the semiconductor layer 403. The plurality of well regions 404 are quadrangular (generally square) in plan view, and arrayed in the form of a matrix. The depth of the well regions 404 is 0.5 to 2 µm, for example. The well regions 404 have such an impurity concentration profile that the P-type impurity concentration in portions whose depth from the upper surfaces thereof is not more than 0.5 µm is $1\times10^{16}$ to $1\times10^{19}$ cm$^{-3}$, for example.

On a surface layer portion of each well region 404, a source region 405 is formed at an interval from a peripheral edge of the well region 404. The source region 405 is doped with an N-type impurity in a higher concentration than in the semiconductor layer 403, to exhibit an N$^+$ conductivity type. The depth of the source region 405 is 0.2 to 1 µm, for example.

In the source region 405, the N-type impurity concentration in a first region 405A of a prescribed width (0.2 µm, for example) from a peripheral edge thereof in plan view is lower by one to three digits than the N-type impurity concentration in a remaining second region (region inside the first region 405A) 405B. In other words, the source region 405 has the N$^+$-type second region 405B whose N-type impurity concentration is relatively high and the N$^-$-type first region 405A, in the form of an annulus surrounding the second region 405B, whose N-type impurity concentration is relatively low. The first region 405A has such an impurity concentration profile that the N-type impurity concentration in a portion whose depth from the upper surface thereof is not more than 0.2 µm is $5\times10^{17}$ to $5\times10^{19}$ cm$^{-3}$, for example. The second region 405B has such an impurity concentration profile that the N-type impurity concentration in a portion whose depth from the upper surface thereof is not more than 0.2 µm is $5\times10^{19}$ to $5\times10^{20}$ cm$^{-3}$, for example.

A step S where the upper surface of the second region 405B is lower by one stage than the upper surface of the first region 405A is formed between the upper surface of the first region 405A and the upper surface of the second region 405B. The magnitude of the step S is 0.2 µm, for example. No large step is formed between the upper surface of the first region 405A and the upper surface of the well region 404 (channel region C), but the upper surfaces are generally flush with each other.

A P$^+$-type contact region 406 doped with a P-type impurity in a higher concentration than in the well region 404 is formed at the center of the second region 405B of each source region 405. Each contact region 406 is formed to pass through the second region 405B in the depth direction, and the deepest portion reaches the well region 404 present under the source region 405.

A gate insulating film 407 is formed on the semiconductor layer 403. The gate insulating film 407 is opposed to the semiconductor layer 403 between the well regions 404, a region (channel region) between the peripheral edge of each well region 404 and a peripheral edge of the source region 405 inside the same and part of the source region 405. The gate insulating film 407 is provided in the form of a lattice in plan view as a whole.

The gate insulating film 407 has an AlON/SiO$_2$/SiO$_x$N$_y$ multilayer structure including an SiON film 407A made of SiO$_x$N$_y$ (silicon oxynitride), an SiO$_2$ film 407B made of SiO$_2$ (silicon oxide) and formed on the SiON film 407A, and an AlON film 407C made of AlON (aluminum oxynitride) which is a high dielectric constant (High-k) insulating material and formed on the SiO$_2$ film 407B.

The thickness of the SiON film 407A is 1 to 5 nm. The thickness of the SiO$_2$ film 407B is 1 to 5 nm. The total thickness of the SiON film 407A and the SiO$_2$ film 407B is 2 to 10 nm. The thickness of the AlON film 407C is 10 to 200 nm. Each range includes the lower limit and the upper limit thereof.

A gate electrode 408 is formed on the gate insulating film 407. The gate electrode 408 is opposed to the semiconductor layer 403 between the well regions 404, the channel region C between the peripheral edge of each well region 404 and the peripheral edge of the source region 405 inside the same and part of the first region 405A of the source region 405 through the gate insulating film 407. The gate electrode 408 is provided in the form of a lattice in plan view as a whole, as shown in FIG. 38. Thus, the semiconductor device 401 has a planar gate MIS structure. The gate electrode 408 is made of polysilicon doped with an N-type impurity or a P-type impurity, or a metallic material containing Al (aluminum) as a main component.

In FIG. 38, the gate electrode 408 is shown through an interlayer dielectric film 409 and a source metal 411 described later.

The interlayer dielectric film 409 is formed on the semiconductor layer 403, as shown in FIG. 39. The upper surface of the semiconductor layer 403 is covered with the interlayer dielectric film 409, along with the gate insulating film 407 and the gate electrode 408. The interlayer dielectric film 409 is made of silicon oxide, for example.

In the interlayer dielectric film 409, a contact hole 410 is formed on a position opposed to each contact region 406. Each contact hole 410 passes through the gate insulating film 407, and the whole area of the contact region 406 and a portion of the source region 405 around the contact region 406 face the inner portion of each contact hole 410.

The source metal 411 is formed on the interlayer dielectric film 409. The source metal 411 enters each contact hole 410 formed in the interlayer dielectric film 409, and is connected to the source region 405 and the contact region 406. The source metal 411 is made of a metallic material containing aluminum (Al) as a main component, for example.

The interlayer dielectric film 409 and the source metal 411 are selectively removed at the centers of portions along one side edge of the semiconductor device 401, whereby an opening exposing part of the gate electrode 408 as a gate pad 412 for connection with an external portion is formed, as shown in FIG. 38.

On the back surface of the semiconductor substrate 402, an ohmic metal 413 made of nickel (Ni) or the like and a drain metal 414 made of a metallic material containing aluminum as a main component are formed on the whole surface thereof in this order from the side of the semiconductor substrate 402.

The potential (gate voltage) of the gate electrode 408 is controlled in a state where the source metal 411 is grounded and proper positive voltage is applied to the drain metal 414, whereby a channel is formed in the channel region C of the well region 404 in the vicinity of the interface between the same and the gate insulating film 407, and current flows between the source metal 411 and the drain metal 414.

Figure 40:
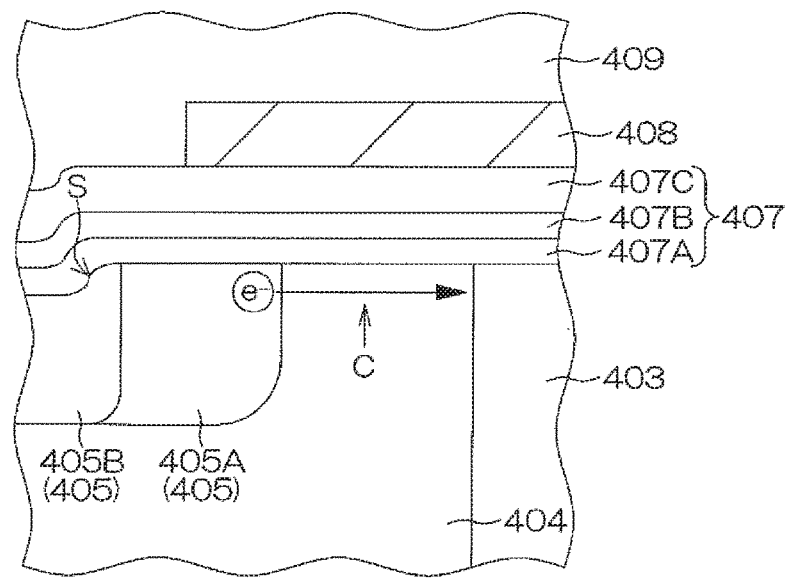
FIG. 40 is a schematic enlarged sectional view in the vicinity of a source region and a channel region shown in FIG. 39.

FIG. 40 is a schematic enlarged sectional view in the vicinity of the first region of the source region and the channel region shown in FIG. 39.

The N-type impurity concentration in the first region 405A of the source region 405 adjacent to the channel region C is lowered in the semiconductor device 401, whereby no large step is formed between the upper surface of the first region 405A and the upper surface of the channel region C (the well region 404).

Therefore, electrons (e⁻) flowing between the source metal 411 and the drain metal 414 move from the source region 405 to the channel region C along the upper surface of the first region 405A, and move in the channel region C along the upper surface thereof. In other words, the path of the electrons in the channel region C becomes a linear path along the upper surface of the channel region C. Therefore, channel resistance of the semiconductor device 401 is lower than the channel resistance of the semiconductor device of FIG. 30 in which the movement path of the electrons in the channel region becomes a bent path.

Figure 41A:
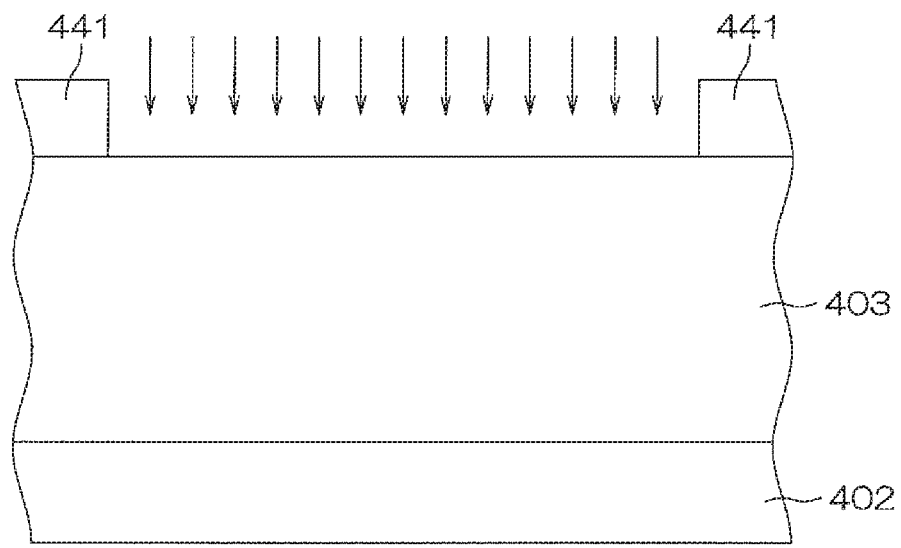
FIG. 41A is a schematic sectional view showing a manufacturing step for the semiconductor device.
Figure 41B:
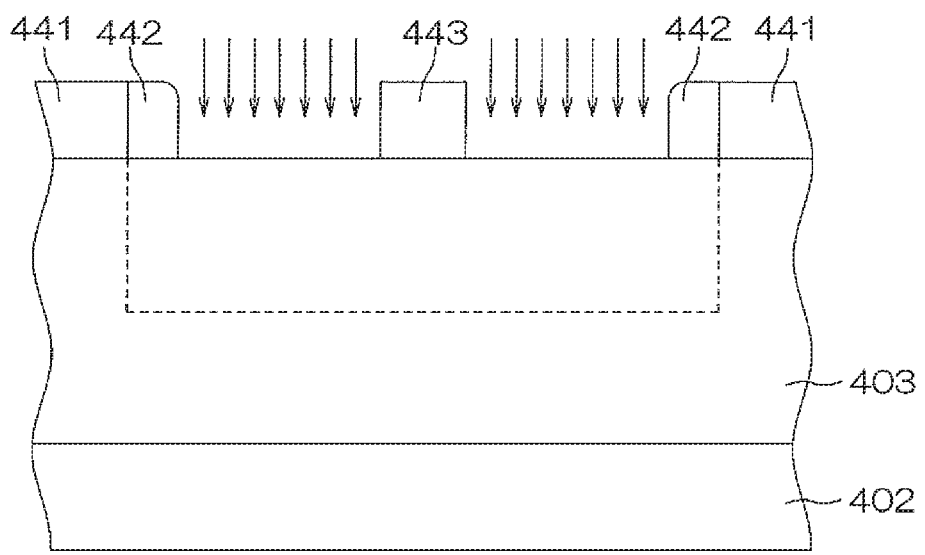
FIG. 41B is a schematic sectional view showing a step subsequent to FIG. 41A.
Figure 41C:
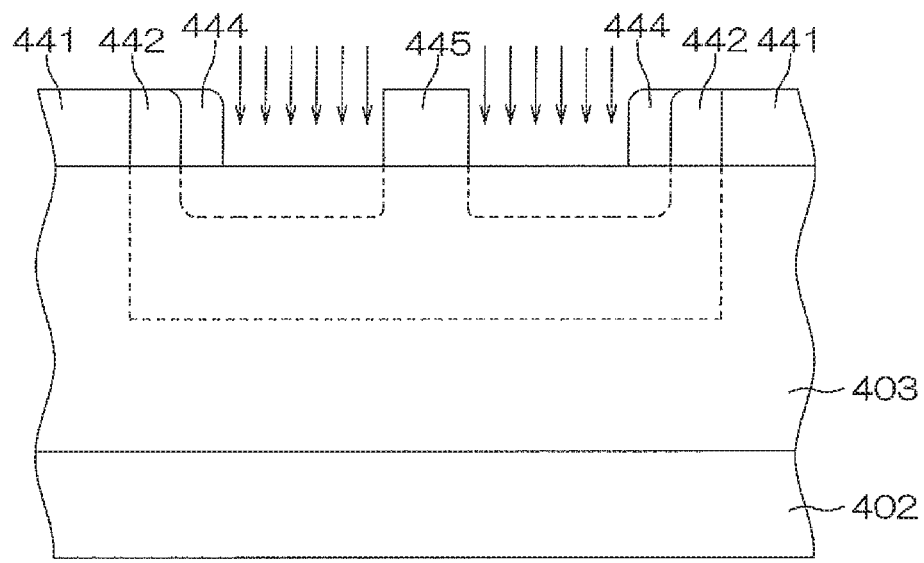
FIG. 41C is a schematic sectional view showing a step subsequent to FIG. 41B.

FIGS. 41A to 41K are schematic sectional views successively showing manufacturing steps for the semiconductor device. Referring to FIGS. 41A to 41K, only portions consisting of conductors are hatched, while hatching on the remaining portions is omitted. FIG. 42 is a manufacturing step diagram for the gate insulating film.

In the manufacturing steps for the semiconductor device 401, a deposition layer of polysilicon is first formed on the semiconductor layer 403 by CVD (Chemical Vapor Deposition). Then, the deposition layer (not shown) of polysilicon is selectively removed from a portion of the semiconductor layer 403 to become the well region 404 by photolithography and etching. Thus, a mask 441 made of polysilicon is formed on the semiconductor layer 403, as shown in FIG. 41A. Thereafter a portion of the semiconductor layer 403 exposed from the mask 441 is doped with a P-type impurity (aluminum, for example) by ion implantation.

Then, an oxide film (not shown) made of silicon oxide is formed to collectively cover the semiconductor layer 403 and the mask 441. Thereafter a deposition layer (not shown) of polysilicon is formed on the oxide film. Then, the deposition layer of polysilicon is etched back through the oxide film serving as an etching stopper and only prescribed portions of the deposition layer in contact with the side surfaces of the mask 441 are left, whereby a mask 442 integrated with the mask 441 is formed, as shown in FIG. 41B. Then, the oxide film exposed from the mask 442 is removed. Then, a resist pattern 443 is formed on a portion of the semiconductor layer 403 to become the contact region 406 by photolithography. Thereafter portions of the semiconductor layer 403 exposed from the masks 441 and 442 and the resist pattern 443 are doped with an N-type impurity (phosphorus (P), for example) by ion implantation.

After the resist pattern 443 is removed, an oxide film (not shown) made of silicon oxide is formed again, to collectively cover the semiconductor layer 403 and the masks 441 and 442. Thereafter a deposition layer (not shown) of polysilicon is formed on the oxide film. Then, the deposition layer of polysilicon is etched back through the oxide film serving as an etching stopper and only prescribed portions of the deposition layer in contact with the side surfaces of the mask 442 are left, whereby a mask 444 integrated with the masks 441 and 442 is formed, as shown in FIG. 41C. Then, the oxide film exposed from the mask 444 is removed. Then, a resist pattern 445 is formed on the portion of the semiconductor layer 403 to become the contact region 406 by photolithography. Thereafter portions of the semiconductor layer 403 exposed from the masks 441, 442 and 444 and the resist pattern 445 are additionally doped with the N-type impurity by ion implantation. After the doping of the N-type impurity, the masks 441, 442 and 444 and the resist pattern 445 are removed.

In the steps shown in FIGS. 41B and 41C, the formation of the resist patterns 443 and 445 may be omitted, and the portion of the semiconductor layer 403 to become the contact region 406 may be doped with the N-type impurity. Thus, photomasks necessary for the formation of the resist patterns 443 and 445 can be omitted, and the manufacturing steps for the semiconductor device 401 can be simplified.

Figure 41D:
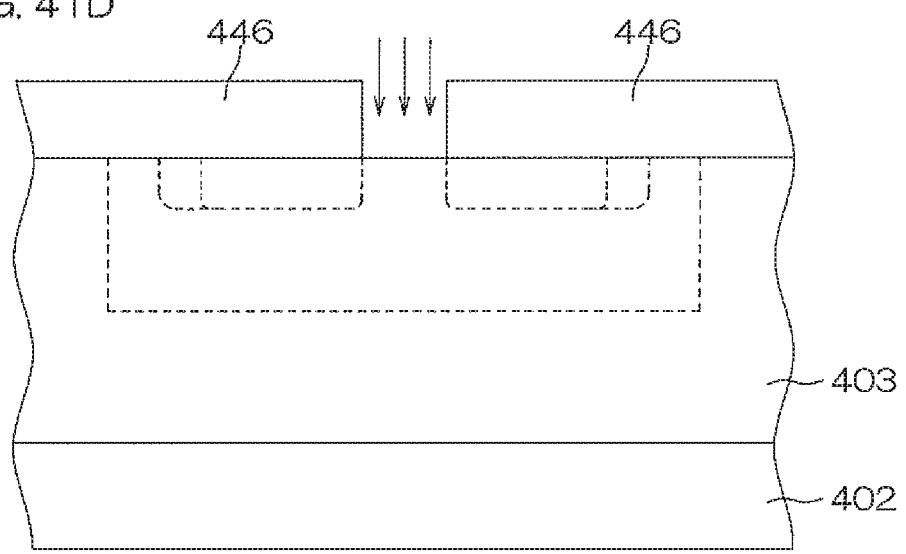
FIG. 41D is a schematic sectional view showing a step subsequent to FIG. 41C.
Figure 42:
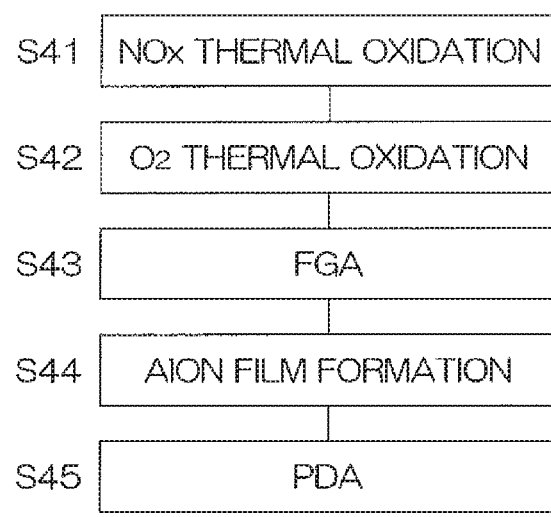
FIG. 42 is a manufacturing step diagram for a gate insulating film.

Then, a resist pattern 446 is formed on the semiconductor layer 403, as shown in FIG. 41D. The resist pattern 446 exposes only the portion of the semiconductor layer 403 to become the contact region 406. Then, the portion of the semiconductor layer 403 exposed from the resist pattern 446 is doped with a P-type impurity by ion implantation.

Figure 41E:
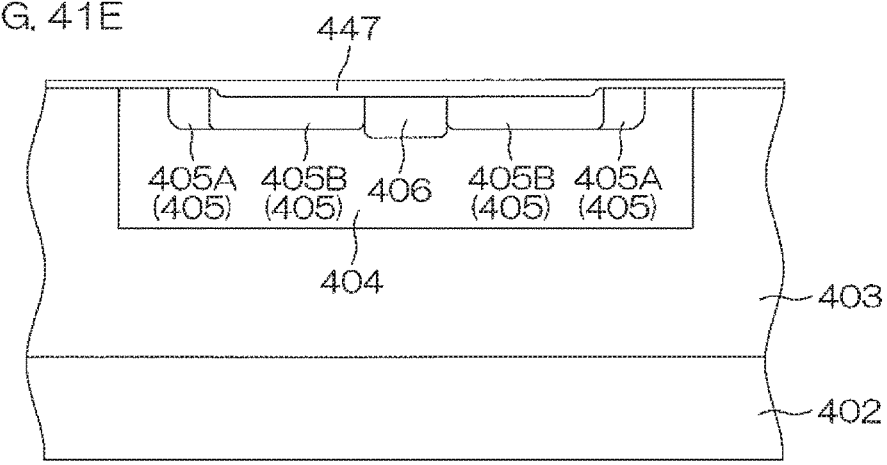
FIG. 41E is a schematic sectional view showing a step subsequent to FIG. 41D.

Thereafter annealing for activating the P-type impurity and the N-type impurity doped into the semiconductor layer 403 is performed, and the well region 404, the source region 405 (the first region 405A and the second region 405B) and the contact region 406 are formed on the surface layer portion of the semiconductor layer 403, as shown in FIG. 41E. Further, the upper surface of the semiconductor layer 403 is thermally oxidized in the annealing, whereby an oxide film 447 is formed. The second region 405B of the source region 405 and the contact region 406 have higher impurity concentrations as compared with the semiconductor layer 403, the well region 404 and the first region 405A of the source region 405, whereby the oxide film 447 relatively thickly grows on the second region 405B and the contact region 406.

Figure 41F:
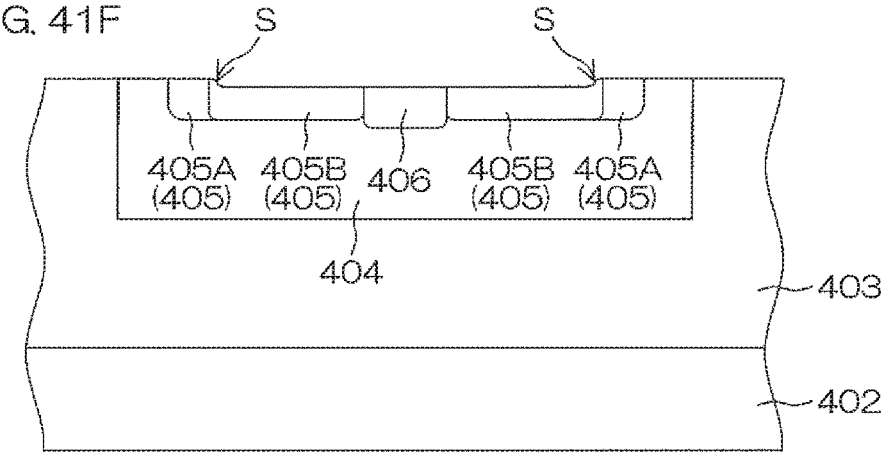
FIG. 41F is a schematic sectional view showing a step subsequent to FIG. 41E.

After the oxide film 447 is removed, therefore, the upper surfaces of the second region 405B and the contact region 406 enter states lower by one stage than the upper surfaces of the semiconductor layer 403, the well region 404 and the first region 405A of the source region 405, and a step S is formed between the first region 405A and the second region 405B, as shown in FIG. 41F.

After the removal of the oxide film 447, the states of the upper surfaces of the semiconductor layer 403, the well region 404, the source region 405 and the contact region 406 may be improved by forming a sacrificial oxide film on the upper surfaces of the semiconductor layer 403, the well region 404, the source region 405 and the contact region 406 by thermal oxidation and removing the sacrificial oxide film. In this case, a larger step S is formed between the first region 405A and the second region 405B after removal of the sacrificial oxide film.

Figure 41G:
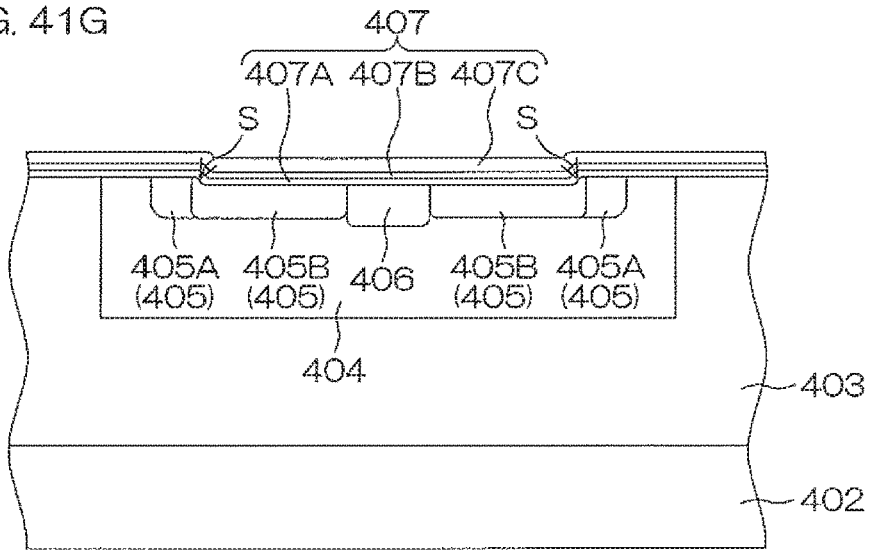
FIG. 41G is a schematic sectional view showing a step subsequent to FIG. 41F.

Thereafter the gate insulating film 407 is formed on the upper surfaces of the semiconductor layer 403, the well region 404, the source region 405 and the contact region 406 by thermal oxidation, as shown in FIG. 41G.

In order to form the gate insulating film 407, an $NO_x$ thermal oxidation step (S41), an $O_2$ thermal oxidation step (S42), an FGA (Forming Gas Annealing) step (S43), an AlON film formation step (S44) and a PDA (Post Deposition Annealing) step (S45) are carried out in this order, as shown in FIG. 42.

In the $NO_x$ thermal oxidation step (S41), the SiON film 407A made of $SiO_xN_y$ is formed on the semiconductor layer 403 by thermal oxidation employing gas containing $N_2O$ (nitrogen oxide).

In the $O_2$ thermal oxidation step (S42), the $SiO_2$ film 407B made of $SiO_2$ is formed on the SiON film 407A by thermal oxidation employing dry gas of $O_2$.

In the FGA step (S43), the $SiO_2$ film 407B is annealed in forming gas containing 3% of $H_2$ (hydrogen gas) and 97% of $N_2$ (nitrogen gas). For example, annealing at a temperature of 1000° C. is performed for 30 minutes, and annealing at a temperature of 450° C. is thereafter performed for 30 minutes. Thus, H atoms are excellently introduced into the $SiO_2$ film 407B, and the number of dangling bonds of C atoms and Si atoms present on the interface between the semiconductor layer 403 and the SiON film 407A decreases.

In the AlON film formation step (S44), the AlON film 407C is formed on the $SiO_2$ film 407B by reactive sputtering employing mixed gas of $N_2$ and $O_2$ (oxygen gas) and an Al target.

In the PDA step (S45), the AlON film 407C is annealed in $N_2$. The annealing is performed at a temperature of 900° C. for 10 minutes, for example. Thus, crystallinity of the AlON film 407C rises, and quality of the AlON film 407C improves.

Thus, the gate insulating film 407 is formed as shown in FIG. 41G.

Figure 41H:
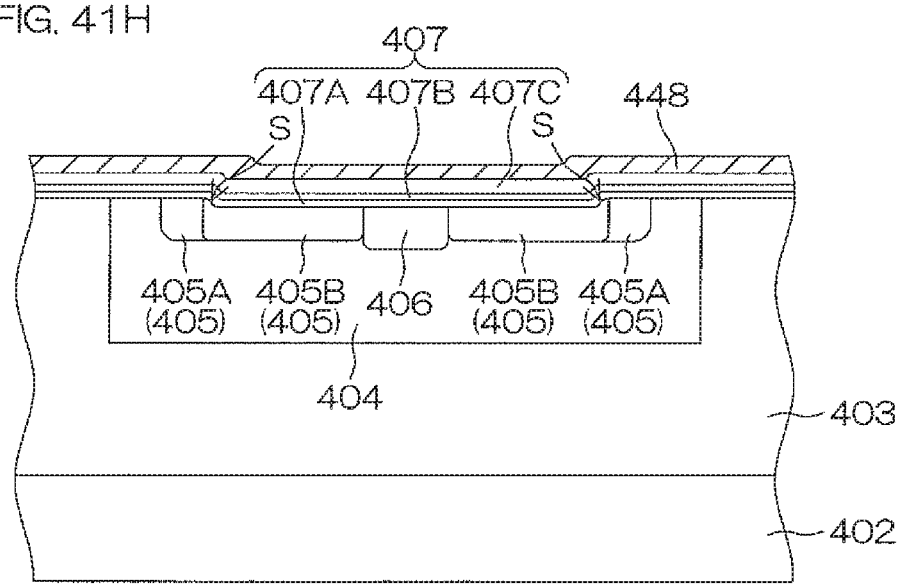
FIG. 41H is a schematic sectional view showing a step subsequent to FIG. 41G.
Figure 41:
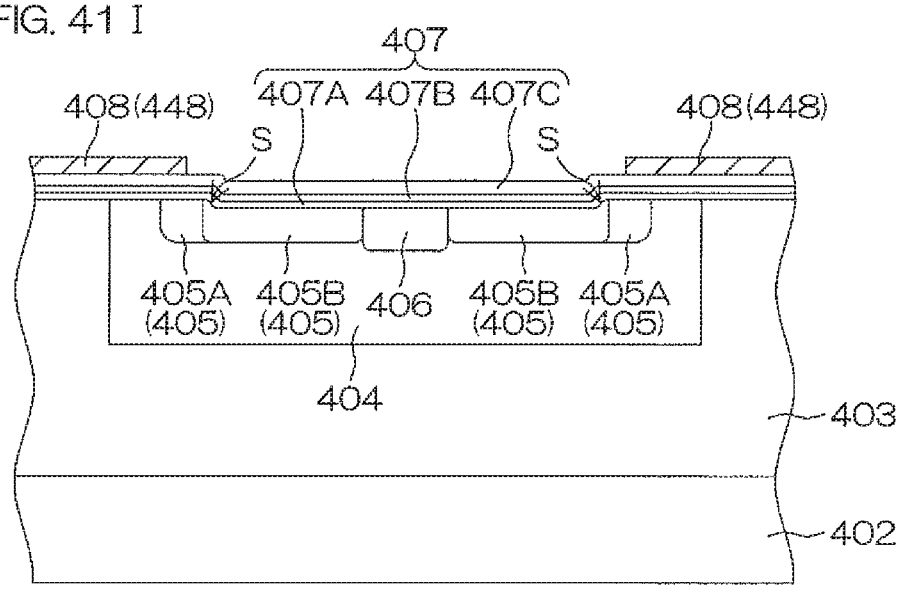
FIG. 41I is a schematic sectional view showing a step subsequent to FIG. 41H.
FIG. 41J is a schematic sectional view showing a step subsequent to FIG. 41I.
FIG. 41K is a schematic sectional view showing a step subsequent to FIG. 41J.

Then, a deposition layer 448 of polysilicon is formed on the gate insulating film 407 by CVD, as shown in FIG. 41H.

Then, the deposition layer 448 is selectively removed by photolithography and etching, and the gate electrode 408 made of polysilicon is formed on the gate insulating film 407, as shown in FIG. 41I. Alternatively, a gate electrode 408 made of a metallic material may be formed by forming a deposition layer of the metallic material containing Al (aluminum) on the gate insulating film 407 and selectively removing the deposition layer.

Figure 41J:
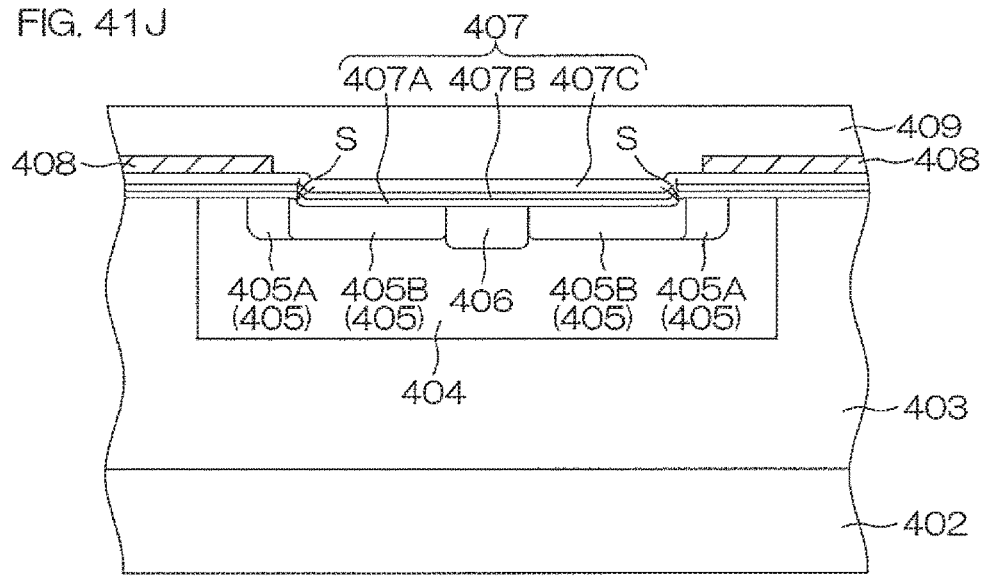

Then, the interlayer dielectric film 409 is formed on the gate insulating film 407 and the gate electrode 408 by CVD, as shown in FIG. 41J.

Figure 41K:
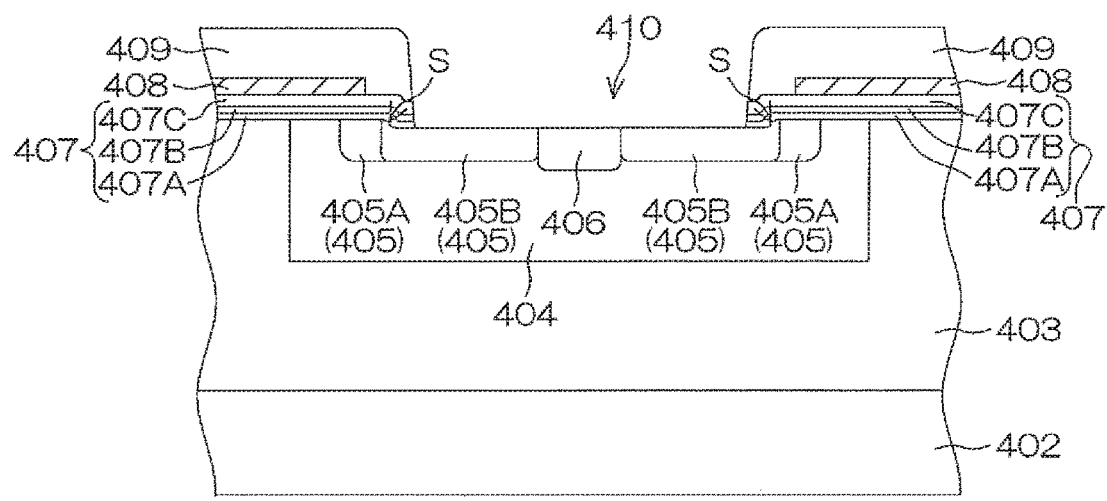

Then, the contact hole 410 passing through the interlayer dielectric film 409 and the gate insulating film 407 is formed by photolithography and etching, as shown in FIG. 41K.

Thereafter the source metal 411 is formed on the interlayer dielectric film 409 by sputtering. Then, the gate pad 412 is formed by photolithography and etching. Further, the ohmic metal 413 and the drain metal 414 are formed on the back surface of the semiconductor substrate 402 by sputtering. Thus, the semiconductor device 401 shown in FIG. 39 is obtained.

As hereinabove described, the rate (rate of oxidation) of growth of the oxide film 447 on the upper surface of the first region 405A can be suppressed low by lowering the impurity concentration in the first region 405A of the source region 405 adjacent to the channel region C. Therefore, formation of a large step between the upper surface of the first region 405A and the upper surface of the channel region C (the well region 404) can be prevented after removal of the oxide film 447. Consequently, the path (movement path) of electrons moving from the source region 405 to the channel region C can be approximated to a straight line, whereby reduction of channel resistance can be attained.

The impurity concentration in the second region 405B of the source region 405 other than the first region 405A is higher than the impurity concentration in the first region 405A, whereby the step S where the upper surface of the second region 405B is lower by one stage than the upper surface of the first region 405A is formed between the upper surface of the first region 405A and the upper surface of the second region 405B. Even if the step S is formed between the upper surface of the first region 405A and the upper surface of the second region 405B, the step S does not influence the flow of the electrons in the channel region C. Therefore, the channel resistance can be reduced without reducing the carrier concentration in the source region 405 by relatively lowering the impurity concentration in the first region 405A and relatively raising the impurity concentration in the second region 405B.

The gate insulating film 407 has the structure obtained by stacking the SiON film 407A, the $SiO_2$ film 407B and the AlON film 407C from the side of the semiconductor layer 403.

The SiON film 407A is interposed between the semiconductor layer 403 and the $SiO_2$ film 407B, whereby reduction of interface state density Dit on the interface between the semiconductor layer 403 (SiC) and the gate insulating film 407 can be attained as compared with such a structure that a gate insulating film consists of only a silicon oxide film. Further, improvement of the channel mobility can be attained due to the reduction of the interface state density Dit.

In addition, reduction of leakage current resulting from increase in the thickness of the gate insulating film 407 can be attained while suppressing increase in the interface state density on the interface between the semiconductor layer 403 and the gate insulating film 407 by reducing the total thickness of the SiON film 407A and the SiO₂ film 407B and increasing the thickness of the AlON film 407C.

Therefore, both of improvement of the channel mobility resulting from the reduction of the interface state density Dit and improvement of reliability of the gate insulating film 407 resulting from the reduction of the leakage current can be attained.

The gate electrode 408 is suitably made of a metallic material containing Al. Thus, improvement in operating speed of a MISFET (field effect transistor of a planar gate MIS structure) constituted of the semiconductor layer 403, the gate insulating film 407 and the gate electrode 408 etc. and reduction of power consumption can be attained as compared with such a structure that the gate electrode 408 is made of polycrystalline silicon.

(Interface State Density)

A sample 301 having the SiC-MIS structure (the structure including the AlON/SiO₂/SiO$_x$N$_y$ multilayer gate insulating film on SiC) shown in FIG. 39 was prepared. In the sample 301, the thickness of an SiON film 407A is 5 nm, the thickness of an SiO₂ film 407B is 5 nm, and the thickness of an AlON film 407C is 80 nm.

A sample 302 having an SiC-MIS structure employing an AlON/SiO₂ multilayer gate insulating film (gate insulating film of a structure obtained by stacking an SiO₂ film made of SiO₂ and an AlON film made of AlON on SiC in this order) was prepared. In the sample 302, the thickness of the SiO₂ film is 10 nm, and the thickness of the AlON film is 80 nm.

Figure 43:
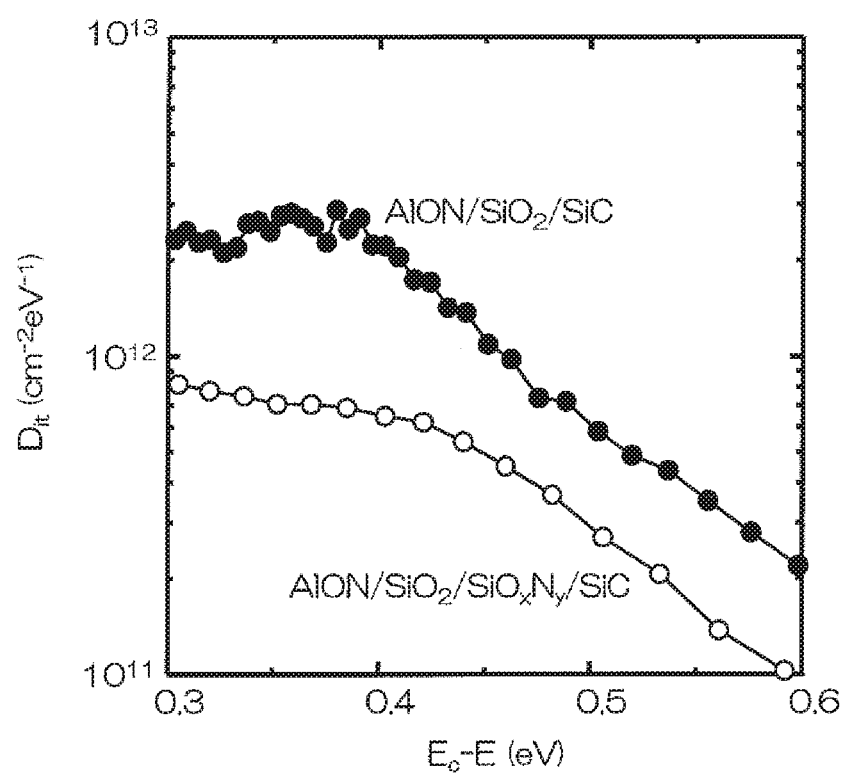
FIG. 43 is a graph showing interface state density of an SiC-MIS structure employing an $AlON/SiO_2/SiO_xN_y$ multi-layer gate insulating film and an SiC-MOS structure employing an $AlON/SiO_2$ multi-layer gate insulating film.

As to the respective ones of the samples 301 and 302, high-frequency CV characteristics (at a measuring frequency of 100 kHz, for example) and low-frequency CV characteristics (quasi-static CV characteristics) were measured, and the differences between high-frequency measured values and low-frequency measured values were calculated as the interface state density Dit by a High-Low method. FIG. 43 shows the results. Referring to FIG. 34, the axis of abscissas shows energy (Ec-E) from valence band edges of the gate insulating films, and the axis of ordinates shows the interface state density Dit.

From the results shown in FIG. 43, it is understood that the interface state density Dit in the sample 301 is lower than the interface state density Dit of the sample 302.

Figure 44:
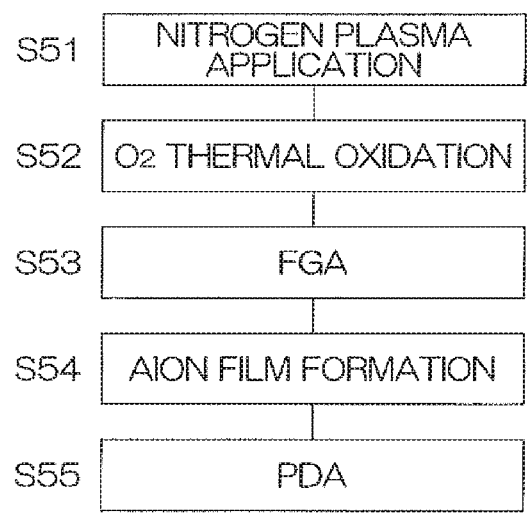
FIG. 44 is another manufacturing step diagram for the gate insulating film.

FIG. 44 is another manufacturing step diagram for the gate insulating film.

The gate insulating film 407 shown in FIG. 39 can be formed by a technique including the manufacturing steps shown in FIG. 44, in place of the technique including the manufacturing steps shown in FIG. 42. In the manufacturing steps shown in FIG. 44, a nitrogen plasma application step (S51), an O₂ thermal oxidation step (S52), an FGA step (S53), an AlON film formation step (S54) and a PDA step (S55) are carried out in this order.

In the nitrogen plasma application step (S51), nitrogen plasma is applied to the semiconductor layer 403. The nitrogen plasma is continuously applied over 30 minutes in a state where the semiconductor layer 403 is heated to 500° C., for example. Atmospheric pressure and RF output at this time are 9.5 Torr and 50 W respectively, for example. Thus, the SiON film 407A is formed on the semiconductor layer 403.

In the O₂ thermal oxidation step (S52), the SiO₂ film 407B made of SiO₂ is formed on the SiON film 407A by thermal oxidation employing dry gas of O₂.

In the FGA step (S53), the AlON film formation step (S54) and the PDA step (S55), treatments similar to those in the FGA step (S43), the AlON film formation step (S44) and the PDA step (S45) shown in FIG. 42 are performed respectively.

Figure 45:
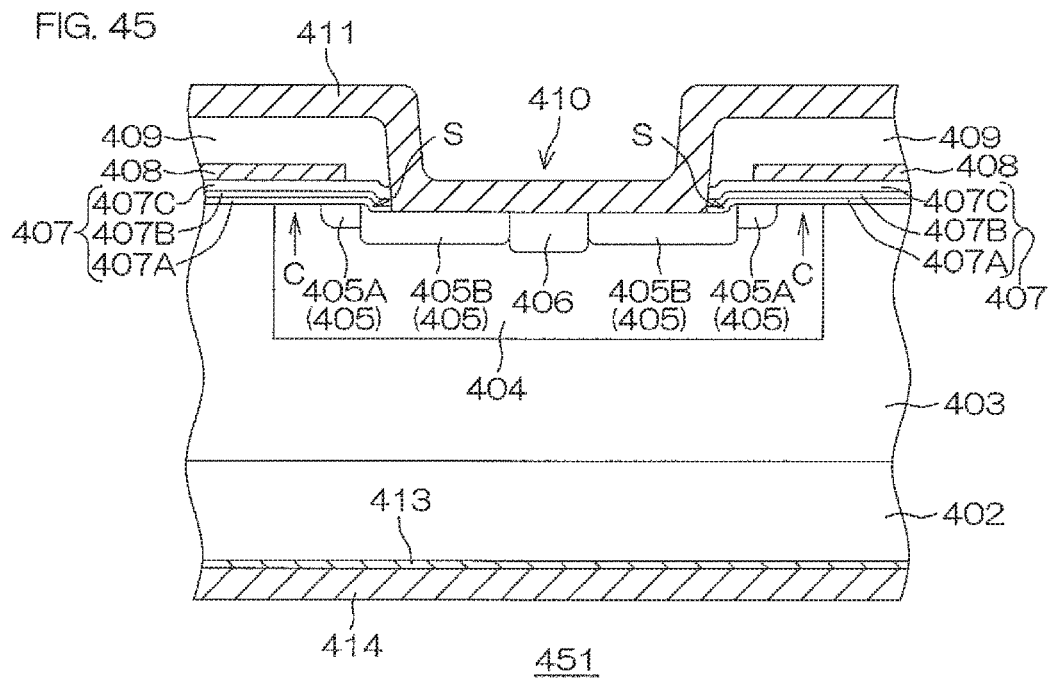
FIG. 45 is a schematic sectional view of a semiconductor device according to a modification.

FIG. 45 is a schematic sectional view of a semiconductor device according to a modification. Referring to FIG. 45, portions corresponding to the respective portions shown in FIG. 39 are denoted by the same reference numerals as the reference numerals assigned to the respective portions. In the following, only a point different from the structure shown in FIG. 39 is described as to the structure shown in FIG. 45, and description of the respective portions denoted by the same reference numerals is omitted. Referring to FIG. 45, only portions consisting of conductors are hatched, while hatching on the remaining portions is omitted.

While the depth of the first region 405A of the source region 405 and the depth of the second region 405B are generally identical to each other in the semiconductor device 401 shown in FIG. 39, the depth of a first region 405A of a source region 405 is smaller than the depth of a second region 405B in a semiconductor device 451 shown in FIG. 45. Also when the depth of the first region 405A is smaller than the depth of the second region 405B as in the semiconductor device 451, effects similar to those of the semiconductor device 401 shown in FIG. 39 can be attained.

Figure 46:
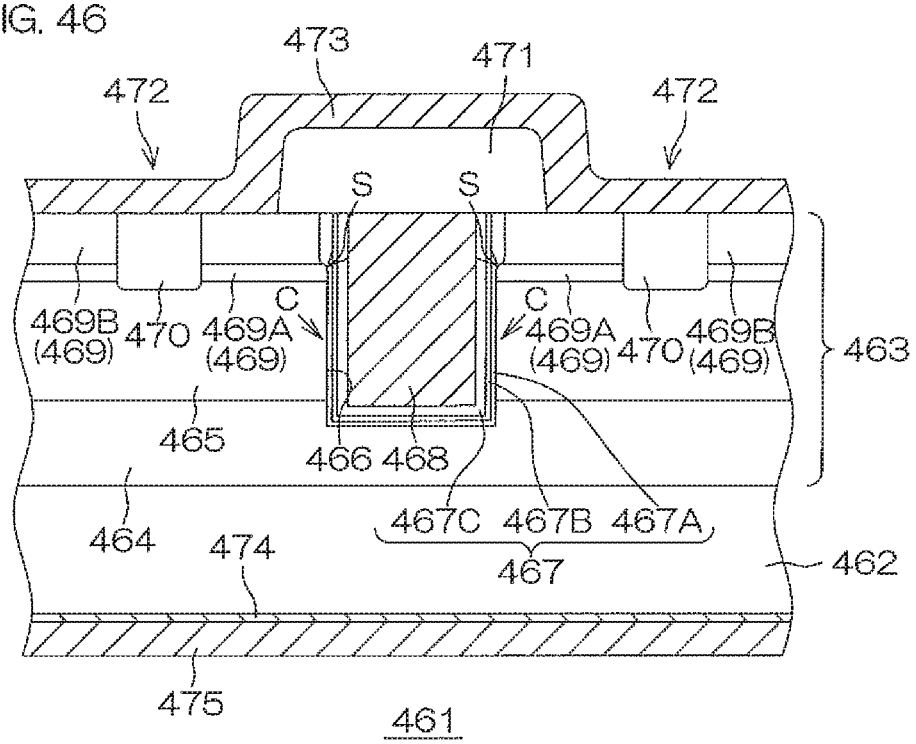
FIG. 46 is a schematic sectional view of a semiconductor device according to another modification.

FIG. 46 is a schematic sectional view of a semiconductor device according to another modification. Referring to FIG. 46, only portions consisting of conductors are hatched, while hatching on the remaining portions is omitted.

While the semiconductor device 401 shown in FIG. 39 and the semiconductor device 451 shown in FIG. 45 have planar gate MIS structures, a semiconductor device 461 shown in FIG. 46 has a trench gate MIS structure.

The semiconductor device 461 includes a semiconductor substrate 462. The semiconductor substrate 462 is made of SiC (N-type SiC) doped with an N-type impurity. A semiconductor layer 463 is formed on the semiconductor substrate 462 by epitaxy. In other words, the semiconductor layer 463 is an epitaxial layer made of N-type SiC.

A base layer portion of the semiconductor layer 463 maintains the state after the epitaxy, and forms an N⁻-type drain region 464. A surface layer portion of the semiconductor layer 463 is doped with a P-type impurity, to be converted to a P-type well region 465.

In the semiconductor layer 463, a gate trench 466 is formed to be dug down from the surface thereof. The gate trench 466 is provided in the form of a lattice in plan view, similarly to the gate electrode 408 shown in FIG. 38, for example. The gate trench 466 passes through the well region 465, and the deepest portion thereof reaches the drain region 464.

A gate insulating film 467 is formed on the inner surface of the gate trench 466. The gate insulating film 467 has an AlON/SiO₂/SiO$_x$N$_y$ multilayer structure including an SiON film 467A made of SiO$_x$N$_y$, an SiO₂ film 467B made of SiO₂ and formed on the SiON film 467A, and an AlON film 467C made of AlON which is a high dielectric constant insulating material and formed on the SiO₂ film 467B.

The thickness of the SiON film 467A is 1 to 5 nm. The thickness of the SiO₂ film 467B is 1 to 5 nm. The total thickness of the SiON film 467A and the SiO₂ film 467B is 2 to 10 nm. The thickness of the AlON film 467C is 10 to 200 nm. Each range includes the lower limit and the upper limit thereof.

The inner side of the gate insulating film 467 is filled up with polysilicon doped with an N-type impurity or a P-type impurity, whereby a gate electrode 468 made of the doped polysilicon is embedded in the gate trench 466. Alternatively, the gate electrode 468 may be made of a metallic material containing Al (aluminum).

An N-type source region 469 is formed on a surface layer portion of the well region 465. The depth (the total depth of a first region 469A and a second region 469B described later) of the source region 469 is 0.5 to 2 μm, for example.

In the source region 469, the N-type impurity concentration in the first region 469A of a prescribed depth (0.2 μm, for example) on the bottom portion thereof is lower by one to three digits than the N-type impurity concentration in the remaining second region (region on the first region 469A) 469B. In other words, the source region 469 has the N$^+$-type second region 469B whose N-type impurity concentration is relatively high and the N$^-$-type first region 469A, formed under the second region 469B, whose N-type impurity concentration is relatively low. The N-type impurity concentration in the first region 469A is $5 \times 10^{17}$ to $5 \times 10^{19}$ cm$^{-3}$, for example, and the N-type impurity concentration in the second region 469B is $5 \times 10^{19}$ to $5 \times 10^{20}$ cm$^{-3}$, for example.

A step S where the side surface of the second region 469B more separates from the gate electrode 468 than the side surface of the first region 469A is formed between the side surface of the first region 469A and the side surface of the second region 469B, due to the difference between the N-type impurity concentrations in the first region 469A and the second region 469B. The magnitude of the step S is 0.1 μm, for example. No large step is formed between the side surface of the first region 469A and the side surface of the well region 465 (channel region C), but the side surfaces are generally flush with each other. The gate insulating film 467 has a relatively large thickness on the side surface of the second region 469B, due to the difference between the N-type impurity concentrations in the first region 469A and the second region 469B.

On the surface layer portion of the well region 465, a P$^+$-type contact region 470 is formed to pass through the source region 469 in the thickness direction on a position at an interval from the gate trench 466 in each region surrounded by the gate trench 466.

An interlayer dielectric film 471 is stacked on the semiconductor layer 463. The interlayer dielectric film 471 is made of silicon oxide, for example.

In the interlayer dielectric film 471, a contact hole 472 is penetratingly formed on a position opposed to each contact region 470. The whole area of the contact region 470 and a portion of the source region 469 around the contact region 470 face the inner portion of each contact hole 472.

A source metal 473 is formed on the interlayer dielectric film 471. The source metal 473 enters each contact hole 472, and is connected to the source region 469 and the contact region 470. The source metal 473 is made of a metallic material containing Al as a main component, for example.

On the back surface of the semiconductor substrate 462, an ohmic metal 474 made of nickel (Ni) or the like and a drain metal 475 made of a metallic material containing aluminum as a main component are formed on the whole surface thereof in this order from the side of the semiconductor substrate 462.

The potential (gate voltage) of the gate electrode 468 is controlled in a state where the source metal 473 is grounded and proper positive voltage is applied to the drain metal 475, whereby a channel is formed in the channel region C of the well region 465 in the vicinity of the interface between the same and the gate insulating film 467, and current flows between the source metal 473 and the drain metal 475.

Figure 47:
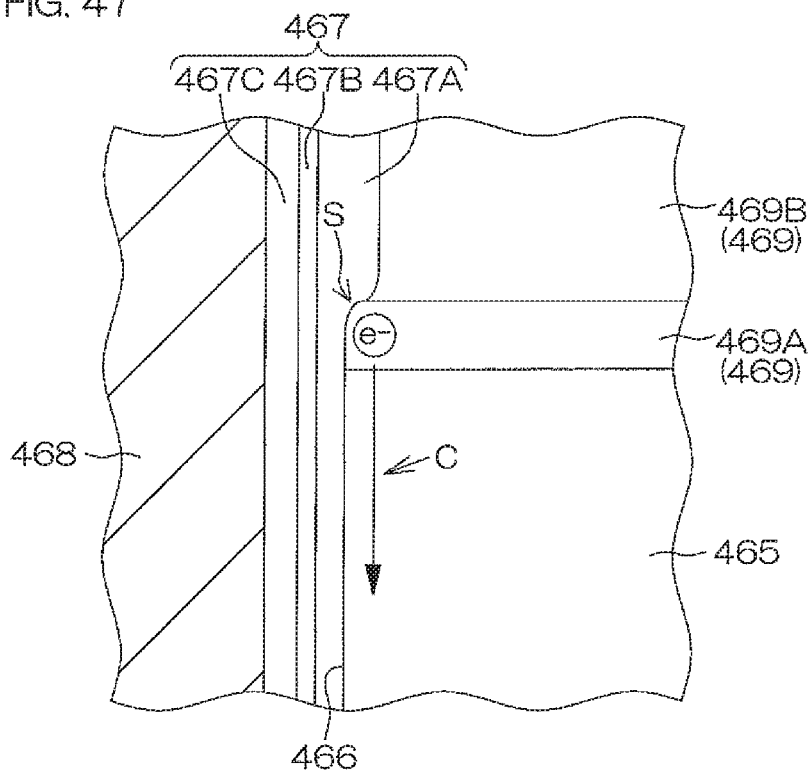
FIG. 47 is a schematic enlarged sectional view in the vicinity of a source region and a channel region shown in FIG. 46.

FIG. 47 is a schematic enlarged sectional view in the vicinity of the first region of the source region and the channel region shown in FIG. 46.

The N-type impurity concentration in the first region 469A of the source region 469 adjacent to the channel region C is lowered in the semiconductor device 461, whereby no large step is formed between the side surface of the first region 469A and the side surface of the channel region C (the well region 465).

Therefore, electrons (e$^-$) flowing between the source metal 473 and the drain metal 475 move from the source region 469 to the channel region C along the side surface of the first region 469A (the inner surface of the gate trench 466), and move in the channel region C along the side surface thereof. In other words, the path of the electrons in the channel region C becomes a linear path along the side surface of the channel region C. Also according to the structure of the semiconductor device 461, therefore, functions/effects similar to those of the semiconductor devices 401 and 451 can be exhibited, and channel resistance of the semiconductor device 461 is lower than the channel resistance of the semiconductor device of FIG. 30 in which the movement path of the electrons in the channel region becomes a bent path.

Also in the semiconductor device 461, both of improvement of channel mobility and improvement of reliability of the gate insulating film 467 can be attained, similarly to the semiconductor device 401 shown in FIG. 39.

Figure 48:
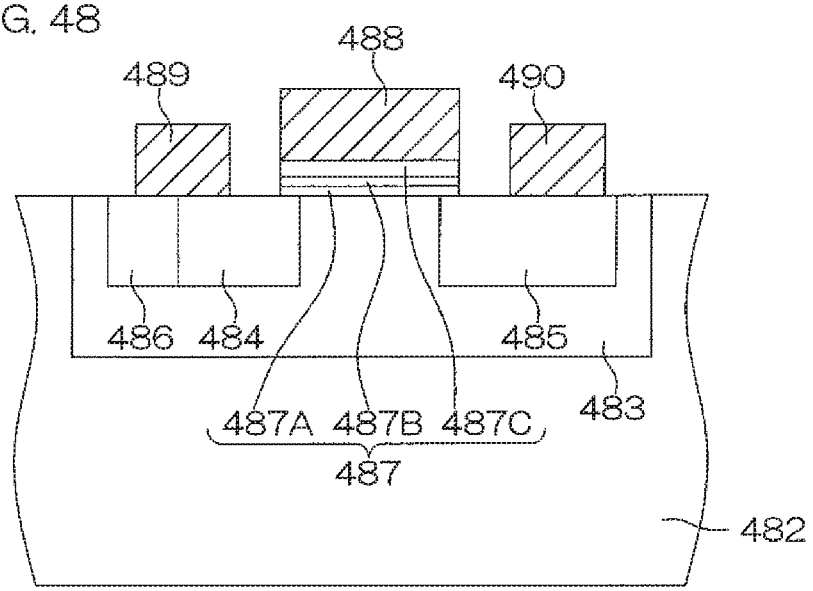
FIG. 48 is a schematic sectional view of a semiconductor device according to still another modification.

FIG. 48 is a schematic sectional view of a semiconductor device according to still another modification.

While the semiconductor device 401 shown in FIG. 39 and the semiconductor device 451 shown in FIG. 45 include vertical MISFETS, a semiconductor device 481 shown in FIG. 48 includes a lateral MISFET.

The semiconductor device 481 includes an SiC substrate 482 as a silicon carbide layer made of N-type SiC.

A P-type well region 483 is formed on a surface layer portion of the SiC substrate 482.

A source region 484 and a drain region 485 are formed on a surface layer portion of the well region 483. The source region 484 and the drain region 485 are formed at intervals from a peripheral edge portion of the well region 483 respectively, and at an interval from each other. The source region 484 and the drain region 485 are doped with an N-type impurity in higher concentrations than in the SiC substrate 482, to exhibit N$^+$ conductivity types.

A contact region 486 is formed on the surface layer portion of the well region 483. The contact region 486 is formed adjacently to a side of the source region 484 opposite to the drain region 485. The contact region 486 is doped with a P-type impurity in a higher concentration than in the well region 483, to exhibit a P$^+$ conductivity type.

A gate insulating film 487 is formed on a region (channel region) between the source region 484 and the drain region 485. More specifically, the gate insulating film 487 is opposed to the region between the source region 484 and the drain region 485, and extends over a peripheral edge portion of the source region 484 and a peripheral edge portion of the drain region 485. The gate insulating film 487 has an AlON/SiO$_2$/SiO$_x$N$_y$ multilayer structure including an SiON film 487A made of SiO$_x$N$_y$, an SiO$_2$ film 487B made of SiO$_2$ and formed on the SiON film 487A, and an AlON film 487C made of AlON which is a high dielectric constant insulating material and formed on the SiO$_2$ film 487B.

The thickness of the SiON film 487A is 1 to 5 nm. The thickness of the SiO$_2$ film 487B is 1 to 5 nm. The total thickness of the SiON film 487A and the SiO$_2$ film 487B is 2 to 10 nm. The thickness of the AlON film 487C is 10 to 200 nm. Each range includes the lower limit and the upper limit thereof.

A gate electrode 488 having the same shape as the gate insulating film 487 in plan view is formed on the gate insulating film 487. The gate electrode 488 is made of a metallic material containing Al.

A source electrode 489 is formed on the source region 484 and the contact region 486. The source region 489 is in contact with the surfaces of the source region 484 and the contact region 486 while extending over the same. The source electrode 489 is made of a metallic material containing Al.

A drain electrode 490 is formed on the drain region 485. The drain electrode 490 is in contact with the surface of the drain region 485. The drain electrode 490 is made of a metallic material containing Al.

Voltage of not less than a threshold is applied to the gate electrode 488 in a state where the source electrode 489 is grounded and positive voltage is applied to the drain electrode 490, whereby a channel is formed in the channel region of the well region 483 in the vicinity of the interface between the same and the gate insulating film 487, and current flows from the drain electrode 490 toward the source electrode 489.

Also in the semiconductor device 481, functions/effects similar to those of the semiconductor device 401 shown in FIG. 39 can be attained.

While the structures in which the semiconductor layers 403 and 463 are stacked on the semiconductor substrates (SiC substrates) 402 and 462 have been adopted, the semiconductor layers 403 and 463 may be omitted, and the well regions 404 and 465 and the source regions 405 and 469 etc. may be formed on the surface layer portions of the SiC substrates 402 and 462.

Further, the conductivity type of each portion of the semiconductor devices 401, 451, 461 and 481 may be inverted. In other words, while the case where the first conductivity type is the N type and the second conductivity type is the P type has been adopted, the first conductivity type may be the P type, and the second conductivity type may be the N type.

The materials for the gate electrodes 408, 468 and 488 are not restricted to the metallic materials containing Al, but may be polysilicon doped with an N-type impurity or a P-type impurity.

While the AlON film 407C, the AlON film 467C and the AlON film 487C have been illustrated as high dielectric constant insulating films, the material for the high dielectric constant insulating films is not restricted to AlON, but may be a high dielectric constant material such as Al$_2$O$_3$ (aluminum oxide), ZrO (zirconium oxide), HfO (hafnium oxide) or AlN (aluminum nitride).

<Fifth Embodiment>

A fifth embodiment provides a semiconductor device capable of approximating a movement path of carriers in a channel region to a straight line thereby reducing channel resistance.

Figure 49:
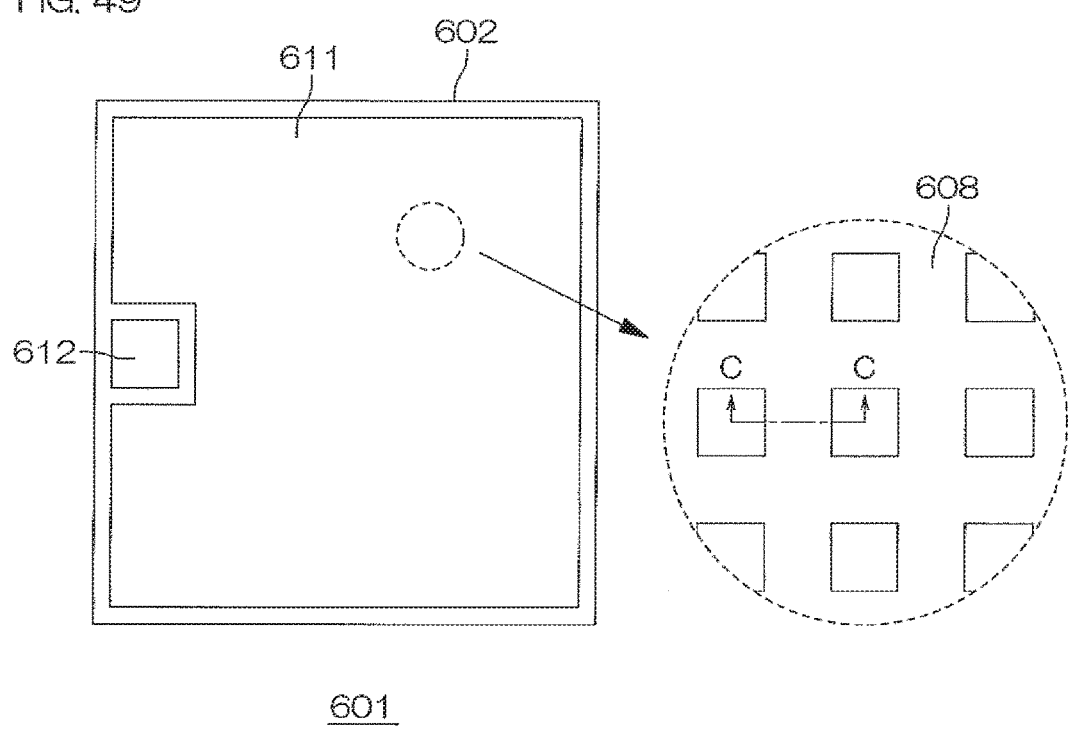
FIG. 49 is a schematic plan view of a semiconductor device according to a fifth embodiment of the present invention.
Figure 50:
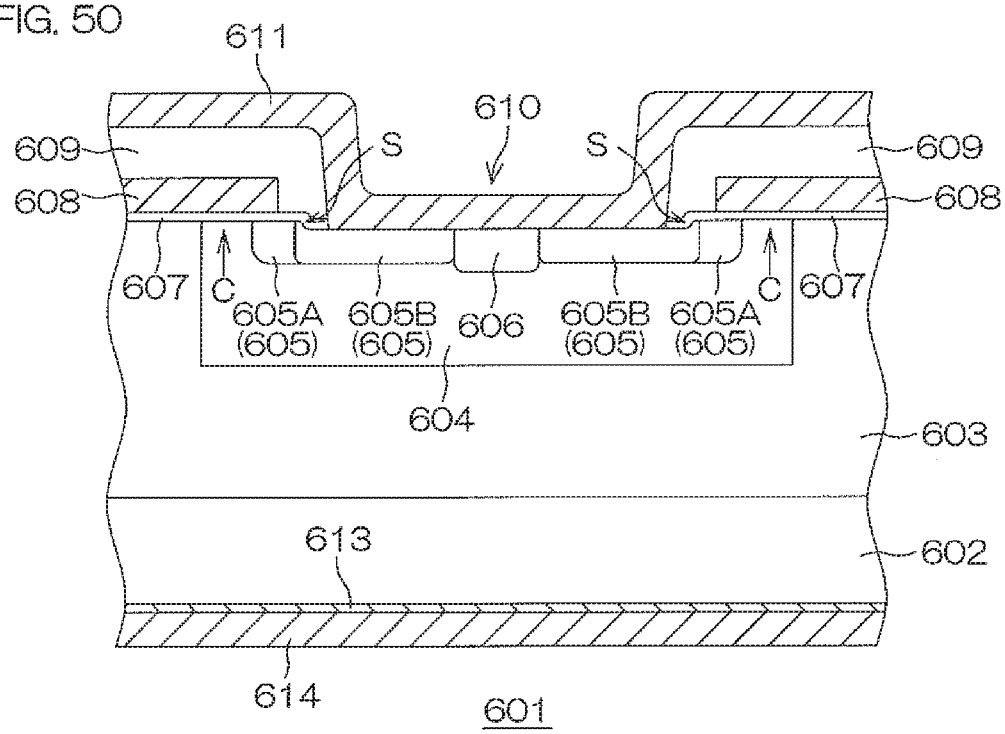
FIG. 50 is a schematic sectional view of the semiconductor device taken along a cutting plane line C-C shown in FIG. 49.

FIG. 49 is a schematic plan view of a semiconductor device according to the fifth embodiment of the present invention. FIG. 50 is a schematic sectional view of the semiconductor device taken along a cutting plane line C-C shown in FIG. 49. Referring to FIG. 50, only portions consisting of conductors are hatched, while hatching on the remaining portions is omitted.

A semiconductor device 601 has a quadrangular (generally square) outer shape in plan view, as shown in FIG. 49.

The semiconductor device 601 includes a semiconductor substrate 602, as shown in FIG. 50. The semiconductor substrate 602 is made of SiC (N-type SiC) doped with an N-type impurity. A semiconductor layer 603 is formed on the semiconductor substrate 602 by epitaxy. In other words, the semiconductor layer 603 is an epitaxial layer made of N-type SiC.

A plurality of P-type well regions 604 are formed on a surface layer portion of the semiconductor layer 603. The plurality of well regions 604 are quadrangular (generally square) in plan view, and arrayed in the form of a matrix. The depth of the well regions 604 is 0.5 to 2 µm, for example. The well regions 604 have such an impurity concentration profile that the P-type impurity concentration in portions whose depth from the upper surfaces thereof is not more than 0.5 µm is $1 \times 10^{16}$ to $1 \times 10^{19}$ cm$^{-3}$, for example.

On a surface layer portion of each well region 604, an N-type source region 605 is formed at an interval from a peripheral edge of the well region 604. The depth of the source region 605 is 0.2 to 1 µm, for example.

In the source region 605, the N-type impurity concentration in a first region 605A of a prescribed width (0.2 µm, for example) from a peripheral edge thereof in plan view is lower by one to three digits than the N-type impurity concentration in a remaining second region (region inside the first region 605A) 605B. In other words, the source region 605 has the N$^+$-type second region 605B whose N-type impurity concentration is relatively high and the N$^-$-type first region 605A, in the form of an annulus surrounding the second region 605B, whose N-type impurity concentration is relatively low. The first region 605A has such an impurity concentration profile that the N-type impurity concentration in a portion whose depth from the upper surface thereof is not more than 0.2 µm is $5 \times 10^{17}$ to $5 \times 10^{19}$ cm$^{-3}$, for example. The second region 605B has such an impurity concentration profile that the N-type impurity concentration in a portion whose depth from the upper surface thereof is not more than 0.2 µm is $5 \times 10^{19}$ to $5 \times 10^{20}$ cm$^{-3}$, for example.

A step S where the upper surface of the second region 605B is lower by one stage than the upper surface of the first region 605A is formed between the upper surface of the first region 605A and the upper surface of the second region 605B. The magnitude of the step S is 0.2 µm, for example. No large step is formed between the upper surface of the first region 605A and the upper surface of the well region 604 (channel region C), but the upper surfaces are generally flush with each other.

A P$^+$-type contact region 606 doped with a P-type impurity in a higher concentration than in the well region 604 is formed at the center of the second region 605B of each source region 605. Each contact region 606 is formed to pass through the second region 605B in the depth direction, and the deepest portion reaches the well region 604 present under the source region 605.

A gate insulating film 607 is formed on the semiconductor layer 603. The gate insulating film 607 is made of silicon oxide (SiO$_2$), for example.

A gate electrode 608 is formed on the gate insulating film 607. The gate electrode 608 is opposed to the semiconductor layer 603 between the well regions 604, the channel region C between the peripheral edge of each well region 604 and a peripheral edge of the source region 605 inside the same and part of the first region 605A of the source region 605 through the gate insulating film 607. The gate electrode 608 is provided in the form of a lattice in plan view as a whole, as shown in FIG. 49. Thus, the semiconductor device 601 has a planar gate MIS structure. The gate electrode 608 is made of polysilicon doped with an N-type impurity or a P-type impurity.

In FIG. 49, the gate electrode 608 is shown through an interlayer dielectric film 609 and a source metal 611 described later.

The interlayer dielectric film 609 is formed on the semiconductor layer 603, as shown in FIG. 50. The upper surface of the semiconductor layer 603 is covered with the interlayer dielectric film 609, along with the gate electrode 608. The interlayer dielectric film 609 is made of silicon oxide, for example.

In the interlayer dielectric film 609, a contact hole 610 is formed on a position opposed to each contact region 606. Each contact hole 610 passes through the gate insulating film 607, and the whole area of the contact region 606 and a portion of the source region 605 around the contact region 606 face the inner portion of each contact hole 610.

The source metal 611 is formed on the interlayer dielectric film 609. The source metal 611 enters each contact hole 610 formed in the interlayer dielectric film 609, and is connected to the source region 605 and the contact region 606. The source metal 611 is made of a metallic material containing aluminum (Al) as a main component, for example.

The interlayer dielectric film 609 and the source metal 611 are selectively removed at the centers of portions along one side edge of the semiconductor device 601, whereby an opening exposing part of the gate electrode 608 as a gate pad 612 for connection with an external portion is formed, as shown in FIG. 49.

On the back surface of the semiconductor substrate 602, an ohmic metal 613 made of nickel (Ni) or the like and a drain metal 614 made of a metallic material containing aluminum as a main component are formed on the whole surface thereof in this order from the side of the semiconductor substrate 602, as shown in FIG. 50.

The potential (gate voltage) of the gate electrode 608 is controlled in a state where the source metal 611 is grounded and proper positive voltage is applied to the drain metal 614, whereby a channel is formed in the channel region C of the well region 604 in the vicinity of the interface between the same and the gate insulating film 607, and current flows between the source metal 611 and the drain metal 614.

Figure 51:
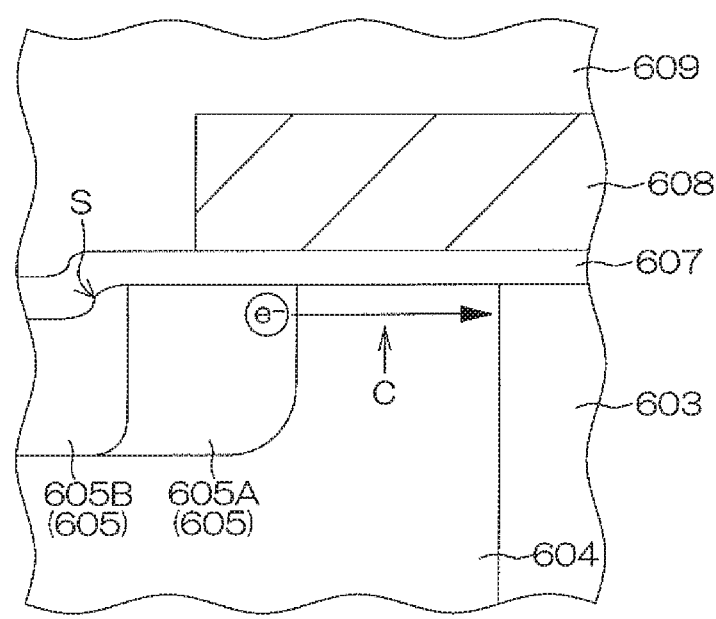
FIG. 51 is a schematic enlarged sectional view in the vicinity of a source region and a channel region shown in FIG. 50.

FIG. 51 is a schematic enlarged sectional view in the vicinity of the first region of the source region and the channel region shown in FIG. 50.

The N-type impurity concentration in the first region 605A of the source region 605 adjacent to the channel region C is lowered in the semiconductor device 601, whereby no large step is formed between the upper surface of the first region 605A and the upper surface of the channel region C (the well region 604).

Therefore, electrons (e⁻) flowing between the source metal 611 and the drain metal 614 move from the source region 605 to the channel region C along the upper surface of the first region 605A, and move in the channel region C along the upper surface thereof. In other words, the path of the electrons in the channel region C becomes a linear path along the upper surface of the channel region C. Therefore, channel resistance of the semiconductor device 601 is lower than the channel resistance of the semiconductor device of FIG. 30 in which the movement path of the electrons in the channel region becomes a bent path.

FIGS. 52A to 52K are schematic sectional views successively showing manufacturing steps for the semiconductor device. Referring to FIGS. 52A to 52K, only portions consisting of conductors are hatched, while hatching on the remaining portions is omitted.

Figure 52A:
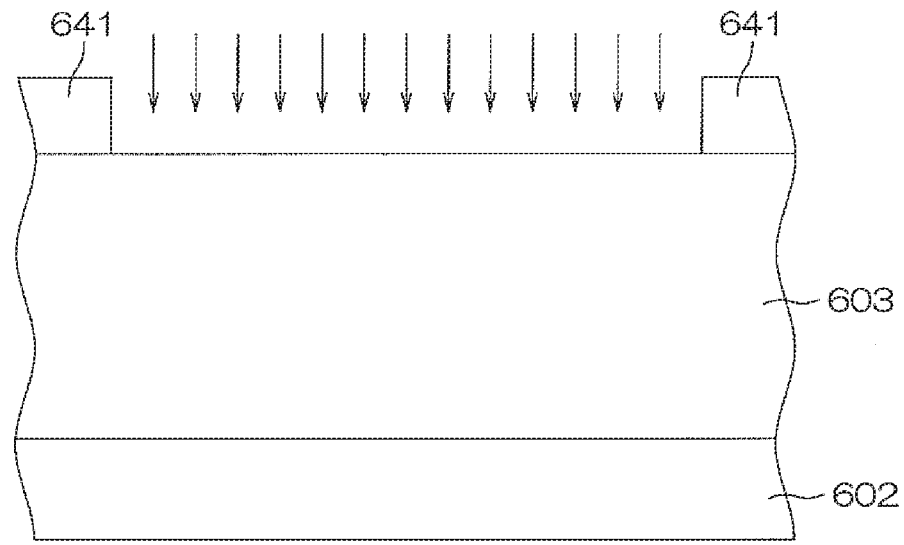
FIG. 52A is a schematic sectional view showing a manufacturing step for the semiconductor device.

In the manufacturing steps for the semiconductor device 601, a deposition layer of polysilicon is first formed on the semiconductor layer 603 by CVD (Chemical Vapor Deposition). Then, the deposition layer (not shown) of polysilicon is selectively removed from a portion of the semiconductor layer 603 to become the well region 604 by photolithography and etching. Thus, a mask 641 made of polysilicon is formed on the semiconductor layer 603, as shown in FIG. 52A. Thereafter a portion of the semiconductor layer 603 exposed from the mask 641 is doped with a P-type impurity (aluminum, for example) by ion implantation.

Figure 52B:
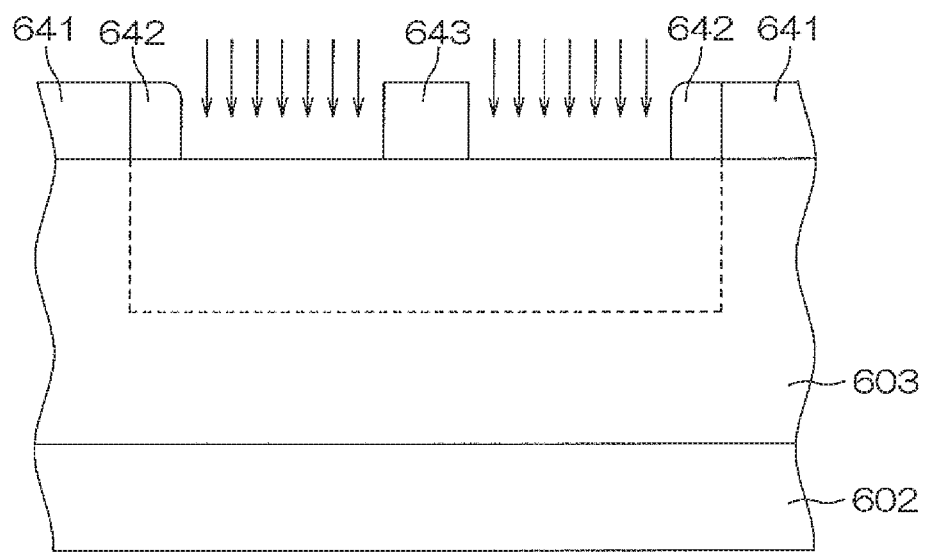
FIG. 52B is a schematic sectional view showing a step subsequent to FIG. 52A.

Then, an oxide film (not shown) made of silicon oxide is formed to collectively cover the semiconductor layer 603 and the mask 641. Thereafter a deposition layer (not shown) of polysilicon is formed on the oxide film. Then, the deposition layer of polysilicon is etched back through the oxide film serving as an etching stopper and only prescribed portions of the deposition layer in contact with the side surfaces of the mask 641 are left, whereby a mask 642 integrated with the mask 641 is formed, as shown in FIG. 52B. Then, the oxide film exposed from the mask 642 is removed. Then, a resist pattern 643 is formed on a portion of the semiconductor layer 603 to become the contact region 606 by photolithography. Thereafter portions of the semiconductor layer 603 exposed from the masks 641 and 642 and the resist pattern 643 are doped with an N-type impurity (phosphorus (P), for example) by ion implantation.

Figure 52C:
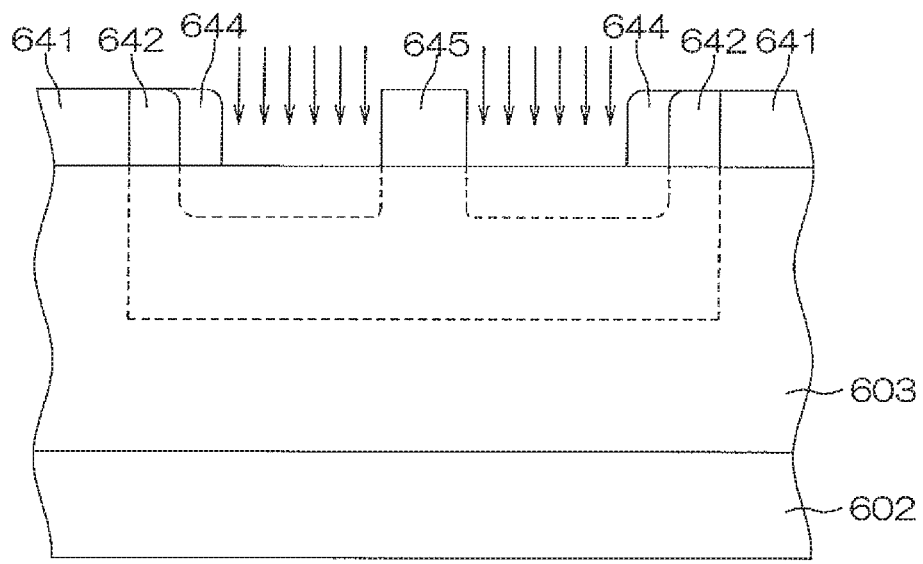
FIG. 52C is a schematic sectional view showing a step subsequent to FIG. 52B.

After the resist pattern 643 is removed, an oxide film (not shown) made of silicon oxide is formed again, to collectively cover the semiconductor layer 603 and the masks 641 and 642. Thereafter a deposition layer (not shown) of polysilicon is formed on the oxide film. Then, the deposition layer of polysilicon is etched back through the oxide film serving as an etching stopper and only prescribed portions of the deposition layer in contact with the side surfaces of the mask 642 are left, whereby a mask 644 integrated with the masks 641 and 642 is formed, as shown in FIG. 52C. Then, the oxide film exposed from the mask 644 is removed. Then, a resist pattern 645 is formed on the portion of the semiconductor layer 603 to become the contact region 606 by photolithography. Thereafter portions of the semiconductor layer 603 exposed from the masks 641, 642 and 644 and the resist pattern 645 are additionally doped with the N-type impurity by ion implantation. After the doping of the N-type impurity, the masks 641, 642 and 644 and the resist pattern 645 are removed.

In the steps shown in FIGS. 52B and 52C, the formation of the resist patterns 643 and 645 may be omitted, and the portion of the semiconductor layer 603 to become the contact region 606 may be doped with the N-type impurity. Thus, photomasks necessary for the formation of the resist patterns 643 and 645 can be omitted, and the manufacturing steps for the semiconductor device 601 can be simplified.

Figure 52D:
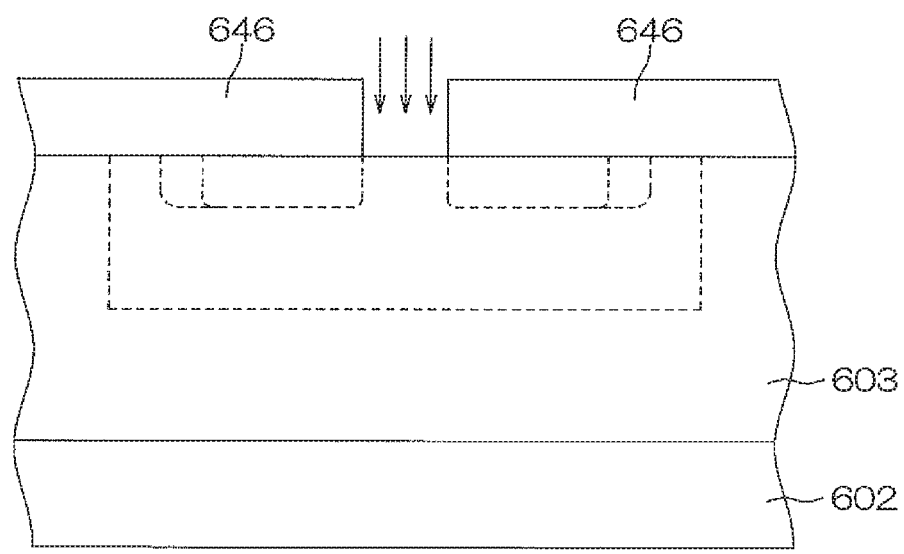
FIG. 52D is a schematic sectional view showing a step subsequent to FIG. 52C.

Then, a resist pattern 646 is formed on the semiconductor layer 603, as shown in FIG. 52D. The resist pattern 646 exposes only the portion of the semiconductor layer 603 to become the contact region 606. Then, the portion of the semiconductor layer 603 exposed from the resist pattern 646 is doped with a P-type impurity by ion implantation.

Thereafter annealing for activating the P-type impurity and the N-type impurity doped into the semiconductor layer 603 is performed, and the well region 604, the source region 605 (the first region 605A and the second region 605B) and the contact region 606 are formed on the surface layer portion of the semiconductor layer 603, as shown in FIG. 52E. At the annealing, the upper surface of the semiconductor layer 603 is thermally oxidized, whereby an oxide film 647 is formed. The second region 605B of the source region 605 and the contact region 606 have higher impurity concentrations as compared with the semiconductor layer 603, the well region 604 and the first region 605A of the source region 605, whereby the oxide film 647 relatively thickly grows on the second region 605B and the contact region 606.

After the oxide film 647 is removed, therefore, the upper surfaces of the second region 605B and the contact region 606 enter states lower by one stage than the upper surfaces of the semiconductor layer 603, the well region 604 and the first region 605A of the source region 605, and the step S is formed between the first region 605A and the second region 605B, as shown in FIG. 52F.

After the removal of the oxide film 647, the states of the upper surfaces of the semiconductor layer 603, the well region 604, the source region 605 and the contact region 606 may be improved by forming a sacrificial oxide film on the upper surfaces of the semiconductor layer 603, the well region 604, the source region 605 and the contact region 606 by thermal oxidation and removing the sacrificial oxide film. In this case, a larger step S is formed between the first region 605A and the second region 605B after the removal of the sacrificial oxide film.

Thereafter the gate insulating film 607 is formed on the upper surfaces of the semiconductor layer 603, the well region 604, the source region 605 and the contact region 606 by thermal oxidation, as shown in FIG. 52G.

Figure 52H:
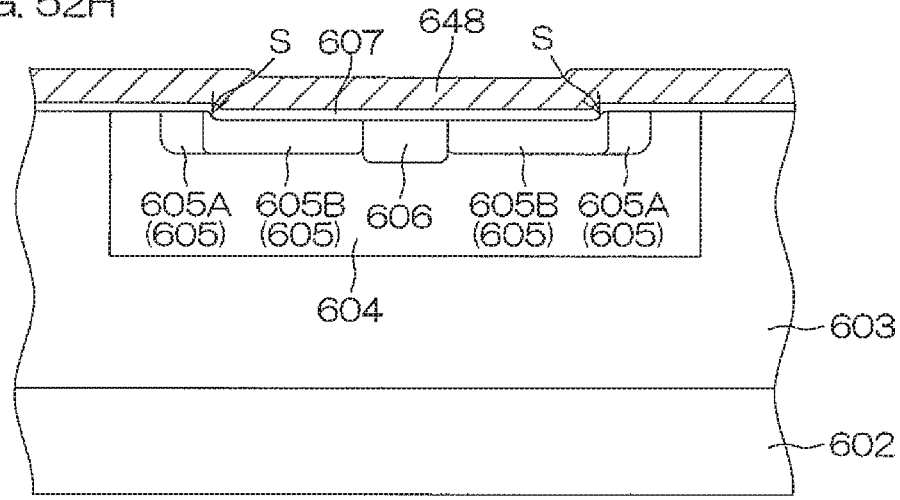
FIG. 52H is a schematic sectional view showing a step subsequent to FIG. 52G.

Then, a deposition layer 648 of polysilicon is formed on the gate insulating film 607 by CVD, as shown in FIG. 52H.

Figure 52I:
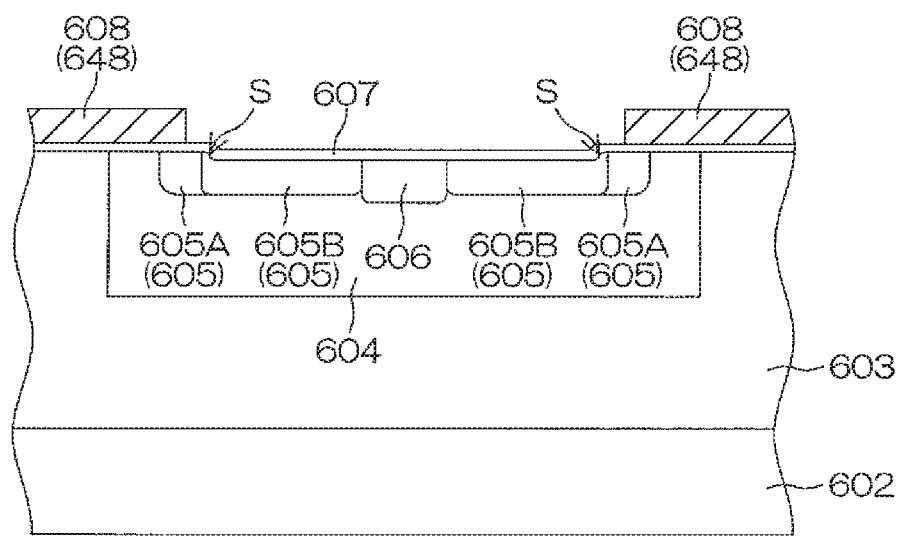
FIG. 52I is a schematic sectional view showing a step subsequent to FIG. 52H.

Then, the deposition layer 648 is selectively removed by photolithography and etching, and the gate electrode 608 made of polysilicon is formed on the gate insulating film 607, as shown in FIG. 52I.

Figure 52J:
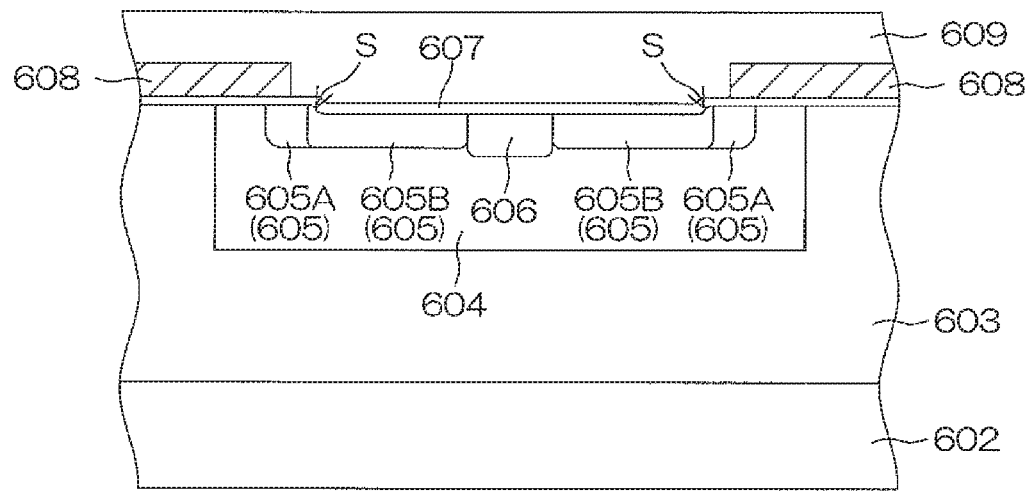
FIG. 52J is a schematic sectional view showing a step subsequent to FIG. 52I.

Then, the interlayer dielectric film 609 is formed on the gate insulating film 607 and the gate electrode 608 by CVD, as shown in FIG. 52J.

Figure 52K:
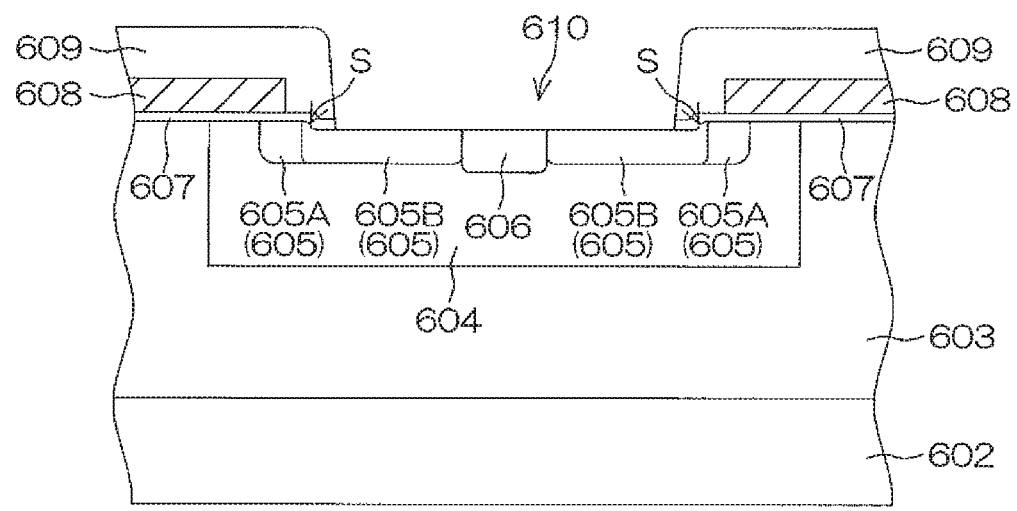
FIG. 52K is a schematic sectional view showing a step subsequent to FIG. 52J.

Then, the contact hole 610 passing through the interlayer dielectric film 609 and the gate insulating film 607 is formed by photolithography and etching, as shown in FIG. 52K.

Thereafter the source metal 611 is formed on the interlayer dielectric film 609 by sputtering. Then, the gate pad 612 is formed by photolithography and etching. Further, the ohmic metal 613 and the drain metal 614 are formed on the back surface of the semiconductor substrate 602 by sputtering. Thus, the semiconductor device 601 shown in FIG. 50 is obtained.

As hereinabove described, the rate (rate of oxidation) of growth of the oxide film 647 on the upper surface of the first region 605A can be suppressed low by lowering the impurity concentration in the first region 605A of the source region 605 adjacent to the channel region C. Therefore, formation of a large step between the upper surface of the first region 605A and the upper surface of the channel region C (the well region 604) can be prevented after the removal of the oxide film 647. Consequently, the path (movement path) of the electrons moving from the source region 605 in the channel region C can be approximated to a straight line, whereby reduction of channel resistance can be attained.

The impurity concentration in the second region 605B of the source region 605 other than the first region 605A is higher than the impurity concentration in the first region 605A, whereby the step S where the upper surface of the second region 605B is lower by one stage than the upper surface of the first region 605A is formed between the upper surface of the first region 605A and the upper surface of the second region 605B. Even if the step S is formed between the upper surface of the first region 605A and the upper surface of the second region 605B, the step S does not influence the flow of the electrons in the channel region C. Therefore, the channel resistance can be reduced without reducing the carrier concentration in the source region 605 by relatively lowering the impurity concentration in the first region 605A and relatively raising the impurity concentration in the second region 605B.

Figure 53:
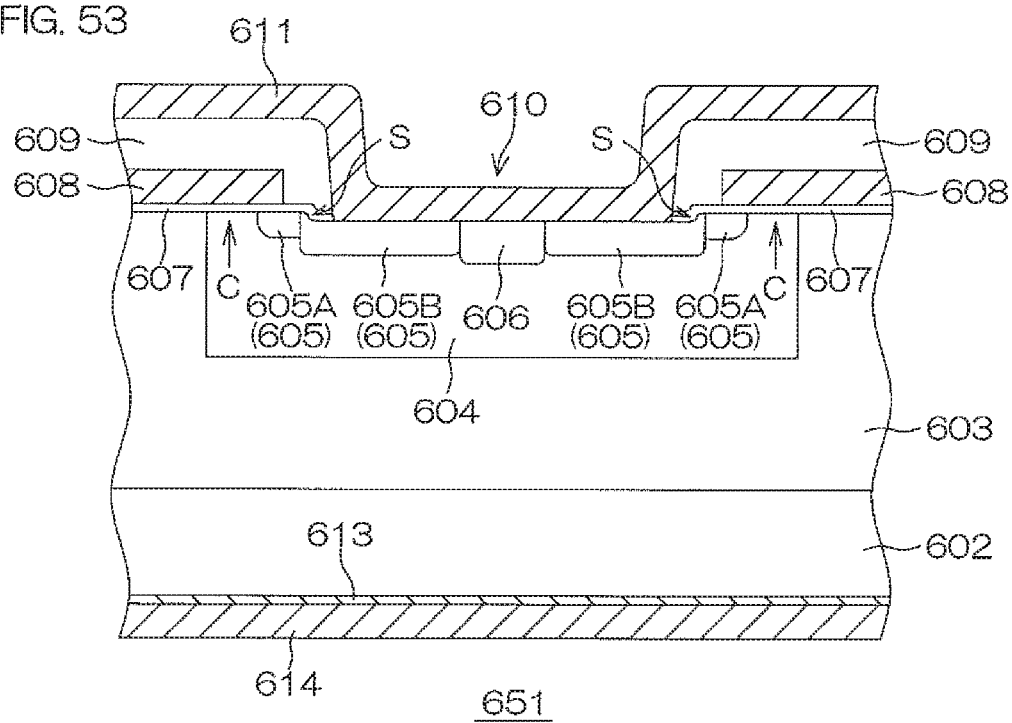
FIG. 53 is a schematic sectional view of a semiconductor device according to a modification.

FIG. 53 is a schematic sectional view of a semiconductor device according to a modification. Referring to FIG. 53, portions corresponding to the respective portions shown in FIG. 50 are denoted by the same reference numerals as the reference numerals assigned to the respective portions. In the following, only a point different from the structure shown in FIG. 50 is described as to the structure shown in FIG. 53, and description of the respective portions denoted by the same reference numerals is omitted. Referring to FIG. 53, only portions consisting of conductors are hatched, while hatching on the remaining portions is omitted.

While the depth of the first region 605A of the source region 605 and the depth of the second region 605B are generally identical to each other in the semiconductor device 601 shown in FIG. 50, the depth of a first region 605A of a source region 605 is smaller than the depth of a second region 605B in a semiconductor device 651 shown in FIG. 53. Also when the depth of the first region 605A is smaller than the depth of the second region 605B as in the semiconductor device 651, effects similar to those of the semiconductor device 601 shown in FIG. 50 can be attained.

Figure 54:
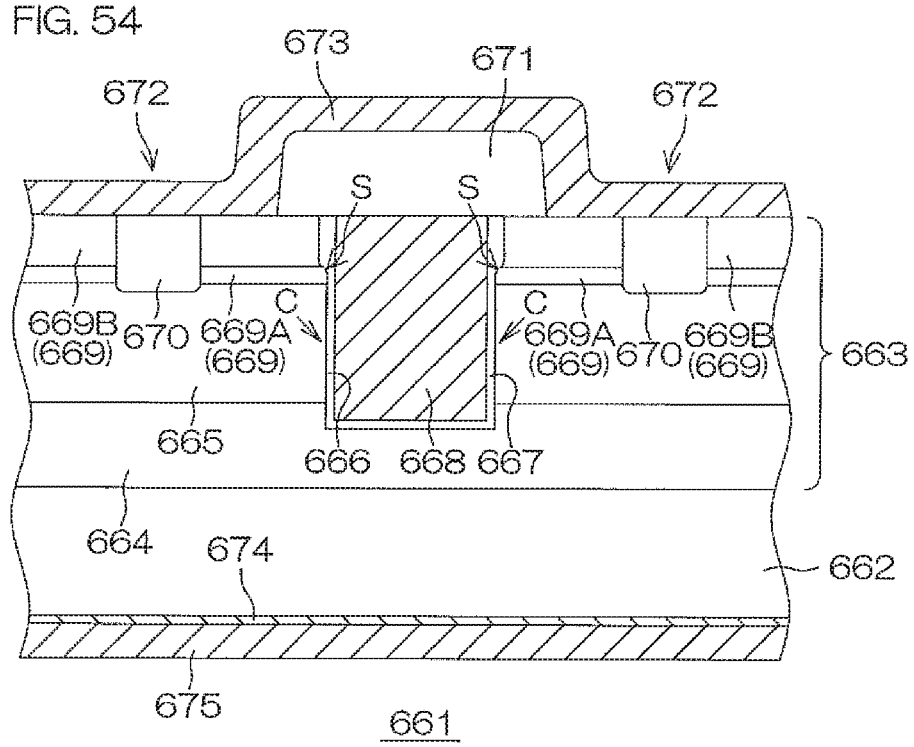
FIG. 54 is a schematic sectional view of a semiconductor device according to another modification.

FIG. 54 is a schematic sectional view of a semiconductor device according to another modification. Referring to FIG. 54, only portions consisting of conductors are hatched, while hatching on the remaining portions is omitted.

While the semiconductor device 601 shown in FIG. 50 and the semiconductor device 651 shown in FIG. 53 have planar gate MIS structures, a semiconductor device 661 shown in FIG. 54 has a trench gate MIS structure.

The semiconductor device 661 includes a semiconductor substrate 662. The semiconductor substrate 662 is made of SiC (N-type SiC) doped with an N-type impurity. A semiconductor layer 663 is formed on the semiconductor substrate 662 by epitaxy. In other words, the semiconductor layer 663 is an epitaxial layer made of N-type SiC.

A base layer portion of the semiconductor layer 663 maintains the state after the epitaxy, and forms an N$^-$-type drain region 664. A surface layer portion of the semiconductor layer 663 is doped with a P-type impurity, to be converted to a P-type well region 665.

In the semiconductor layer 663, a gate trench 666 is formed to be dug down from the surface thereof. The gate trench 666 is provided in the form of a lattice in plan view, similarly to the gate electrode 608 shown in FIG. 49, for example. The gate trench 666 passes through the well region 665, and the deepest portion thereof reaches the drain region 664.

A gate insulating film 667 is formed on the inner surface of the gate trench 666. The gate insulating film 667 is made of silicon oxide, for example.

The inner side of the gate insulating film 667 is filled up with polysilicon doped with an N-type impurity or a P-type impurity, whereby a gate electrode 668 made of the doped polysilicon is embedded in the gate trench 666.

An N-type source region 669 is formed on a surface layer portion of the well region 665. The depth of the source region 669 (the total depth of a first region 669A and a second region 669B described later) is 0.5 to 2 µm, for example.

In the source region 669, the N-type impurity concentration in the first region 669A of a prescribed depth (0.2 µm, for example) on the bottom portion thereof is lower by one to three digits than the N-type impurity concentration in the remaining second region (region on the first region 669A) 669B. In other words, the source region 669 has the $N^+$-type second region 669B whose N-type impurity concentration is relatively high and the $N^-$-type first region 669A, formed under the second region 669B, whose N-type impurity concentration is relatively low. The N-type impurity concentration in the first region 669A is $5 \times 10^{17}$ to $5 \times 10^{19}$ cm$^{-3}$, for example, and the N-type impurity concentration in the second region 669B is $5 \times 10^{19}$ to $5 \times 10^{20}$ cm$^{-3}$, for example.

A step S where the side surface of the second region 669B more separates from the gate electrode 668 than the side surface of the first region 669A is formed between the side surface of the first region 669A and the side surface of the second region 669B, due to the difference between the N-type impurity concentrations in the first region 669A and the second region 669B. The magnitude of the step S is 0.1 µm, for example. No large step is formed between the side surface of the first region 669A and the side surface of the well region 665 (channel region C), but the side surfaces are generally flush with each other. The gate insulating film 667 has a relatively large thickness on the side surface of the second region 669B, due to the difference between the N-type impurity concentrations in the first region 669A and the second region 669B.

On the surface layer portion of the well region 665, a $P^+$-type contact region 670 is formed to pass through the source region 669 in the thickness direction on a position at an interval from the gate trench 666 in each region surrounded by the gate trench 666.

An interlayer dielectric film 671 is stacked on the semiconductor layer 663. The interlayer dielectric film 671 is made of silicon oxide, for example.

In the interlayer dielectric film 671, a contact hole 672 is penetratingly formed on a position opposed to each contact region 670. The whole area of the contact region 670 and a portion of the source region 669 around the contact region 670 face the inner portion of each contact hole 672.

A source metal 673 is formed on the interlayer dielectric film 671. The source metal 673 enters each contact hole 672, and is connected to the source region 669 and the contact region 670. The source metal 673 is made of a metallic material containing Al as a main component, for example.

On the back surface of the semiconductor substrate 662, an ohmic metal 674 made of nickel (Ni) or the like and a drain metal 675 made of a metallic material containing aluminum as a main component are formed on the whole surface thereof in this order from the side of the semiconductor substrate 662.

The potential (gate voltage) of the gate electrode 668 is controlled in a state where the source metal 673 is grounded and proper positive voltage is applied to the drain metal 675, whereby a channel is formed in the channel region C of the well region 665 in the vicinity of the interface between the same and the gate insulating film 667, and current flows between the source metal 673 and the drain metal 675.

Figure 55:
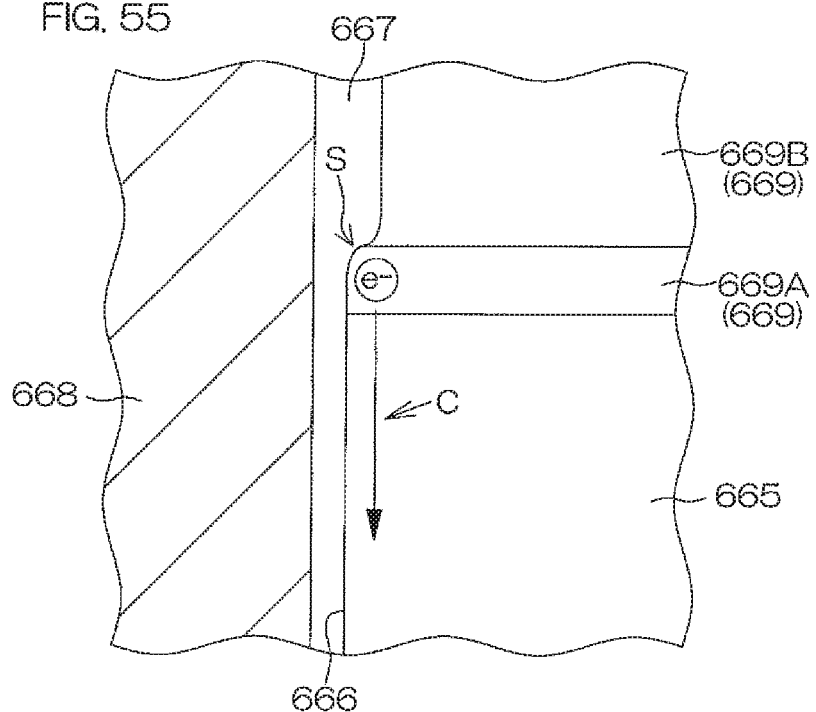
FIG. 55 is a schematic enlarged sectional view in the vicinity of a source region and a channel region shown in FIG. 54.

FIG. 55 is a schematic enlarged sectional view in the vicinity of the first region of the source region and the channel region shown in FIG. 54.

The N-type impurity concentration in the first region 669A of the source region 669 adjacent to the channel region C is lowered in the semiconductor device 661, whereby no large step is formed between the side surface of the first region 669A and the side surface of the channel region C (the well region 665).

Therefore, electrons ($e^-$) flowing between the source metal 673 and the drain metal 675 move from the source region 669 to the channel region C along the side surface of the first region 669A (the inner surface of the gate trench 666), and move in the channel region C along the side surface thereof. In other words, the path of the electrons in the channel region C becomes a linear path along the side surface of the channel region C. Also according to the structure of the semiconductor device 661, therefore, functions/effects similar to those of the semiconductor devices 601 and 651 can be exhibited, and channel resistance of the semiconductor device 661 is lower than the channel resistance of the semiconductor device of FIG. 30 in which the movement path of the electrons in the channel region becomes a bent path.

While such structures that the semiconductor layers 603 and 663 are stacked on the semiconductor substrates 602 and 662 have been adopted in the aforementioned embodiment, the semiconductor layers 603 and 663 may be omitted, and the well regions 604 and 665 and the source regions 605 and 669 etc. may be formed on the surface layer portions of the semiconductor substrates 602 and 662.

Further, the conductivity type of each portion may be inverted. In other words, while the case where the first conductivity type is the N type and the second conductivity type is the P type has been adopted, the first conductivity type may be the P type, and the second conductivity type may be the N type.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2009-206372, Japanese Patent Application No. 2009-206373 and Japanese Patent Application No. 2009-206374 filed with the Japan Patent Office on Sep. 7, 2009, the disclosures of which are incorporated herein by reference.

DESCRIPTION OF THE REFERENCE NUMERALS 1 semiconductor device
2 SiC substrate (silicon carbide substrate)
8 $SiO_2$ film (silicon oxide film)
9 AlON film (aluminum oxynitride film)
10 gate electrode
14 $SiO_2$ film (silicon oxide film)
15 AlON film (aluminum oxynitride film)
16 capacitor electrode
101 semiconductor device
102 semiconductor substrate (semiconductor layer, silicon carbide substrate)
103 semiconductor layer (semiconductor layer)

104 well region
105 source region
105A first region
105B second region
107 gate insulating film
107A SiO$_2$ film (silicon oxide film)
107B AlON film (aluminum oxynitride film)
108 gate electrode
151 semiconductor device
161 semiconductor device
162 semiconductor substrate (semiconductor layer)
163 semiconductor layer (semiconductor layer)
165 well region
166 gate trench
167 gate insulating film
168 gate electrode
169 source region
169A first region
169B second region
301 semiconductor device
303 SiC layer (silicon carbide layer)
307 gate insulating film
307A SiON film (silicon oxynitride film)
307B SiO$_2$ film (silicon oxide film)
307C AlON film (high dielectric constant insulating film)
308 gate electrode
351 semiconductor device
353 SiC layer (silicon carbide layer)
357 gate insulating film
357A SiON film (silicon oxynitride film)
357B SiO$_2$ film (silicon oxide film)
357C AlON film (high dielectric constant insulating film)
358 gate electrode
381 semiconductor device
382 SiC substrate (silicon carbide layer)
387 gate insulating film
387A SiON film (silicon oxynitride film)
387B SiO$_2$ film (silicon oxide film)
387C AlON film (high dielectric constant insulating film)
388 gate electrode
401 semiconductor device
402 semiconductor substrate (semiconductor layer)
403 semiconductor layer (semiconductor layer, silicon carbide layer)
404 well region
405 source region
405A first region
405B second region
407 gate insulating film
408 gate electrode
451 semiconductor device
453 SiC layer (silicon carbide layer)
457 gate insulating film
457A SiON film (silicon oxynitride film)
457B SiO$_2$ film (silicon oxide film)
457C AlON film (high dielectric constant insulating film)
458 gate electrode
461 semiconductor device
462 semiconductor substrate (semiconductor layer)
463 semiconductor layer (semiconductor layer)
465 well region
466 gate trench
467 gate insulating film
468 gate electrode
469 source region
469A first region
469B second region
471 SiON film (silicon oxynitride film)
472 SiO$_2$ film (silicon oxide film)
473 AlON film (high dielectric constant insulating film)
481 semiconductor device
482 SiC substrate (silicon carbide layer)
487 gate insulating film
487A SiON film (silicon oxynitride film)
487B SiO$_2$ film (silicon oxide film)
487C AlON film (high dielectric constant insulating film)
488 gate electrode
601 semiconductor device
602 semiconductor substrate (semiconductor layer)
603 semiconductor layer (semiconductor layer)
604 well region
605 source region
605A first region
605B second region
607 gate insulating film
608 gate electrode
651 semiconductor device
661 semiconductor device
662 semiconductor substrate (semiconductor layer)
663 semiconductor layer (semiconductor layer)
665 well region
666 gate trench
667 gate insulating film
668 gate electrode
669 source region
669A first region
669B second region
C channel region
S step
S1 SiO$_2$ film formation step
S2 nitrogen plasma application step
S3 FGA step
S4 AlON film formation step
S5 PDA step

The invention claimed is:

1. A semiconductor device comprising:
a silicon carbide layer;
a gate trench formed at a surface of the silicon carbide layer;
a gate insulating film formed over the gate trench; and
a gate electrode formed over the gate insulating film,
wherein the silicon carbide layer includes a drain region, a well region formed over the drain region, and a source region formed over the well region,
wherein the gate trench is formed through the well region and to the surface of the silicon carbide layer so that a part of the gate insulating film is exposed from the gate trench at the surface of the silicon carbide layer, and
wherein, in a cross-sectional view, a width of the gate insulating film from one side of the gate trench to an opposite side of the gate trench is greater at portion of the silicon carbide layer in which the source region is formed than at a base of the gate trench.

2. The semiconductor device according to claim 1, wherein
a thickness of the gate insulating film is not less than 1 nm.

3. The semiconductor device according to claim 2, wherein
the silicon carbide layer is of a first conductivity type,
the semiconductor device further comprises:
a second conductivity type well region formed at a surface layer portion of the silicon carbide layer; and a first conductivity type source region formed at a surface layer portion of the well region, wherein the gate electrode is opposed to a channel region of the well region where a channel is formed through the gate insulating film.

4. The semiconductor device according to claim 3, wherein an impurity concentration in a first region of a prescribed width adjacent to the channel region is lower than an impurity concentration in a second region other than the first region in the source region.

5. The semiconductor device according to claim 3, wherein the source region and the channel region are adjacently formed in a direction along an upper surface of the silicon carbide layer, and the gate insulating film is formed on the upper surface of the silicon carbide layer.

6. The semiconductor device according to claim 3, wherein the source region and the channel region are adjacently formed in a direction orthogonal to the upper surface of the silicon carbide layer, and the silicon carbide layer further includes a trench dug down from the upper surface of the source region to pass through the source region to the well region, and the gate insulating film is formed on the inner surface of the trench.

7. The semiconductor device according to claim 3, further comprising:

a source terminal connecting a plurality of the source regions including the source region;

a gate terminal connected to the gate electrode at the surface of the silicon carbide layer; and a drain terminal formed on the rear side of the silicon carbide layer.

8. The semiconductor device according to claim 4, wherein a density of the first portion is different from a density of the second portion.

9. The semiconductor device according to claim 1, wherein a width of the source region in a vertical direction is smaller than a width of the well region in the vertical direction.

10. The semiconductor device according to claim 1, wherein the drain region contacts both a sidewall and a bottom wall of the gate trench.

11. The semiconductor device according to claim 1, further comprising a contact region of a second conductivity type at the surface of the silicon carbide layer.

12. The semiconductor device according to claim 11, wherein the contact region reaches to the well region in a vertical direction.

13. The semiconductor device according to claim 1, wherein a width of the source region in a vertical direction is about 0.2 μm.

* * * * *